United States Patent
Su et al.

(10) Patent No.: US 11,908,860 B2
(45) Date of Patent: Feb. 20, 2024

(54) INTEGRATED CHIP WITH IMPROVED LATCH-UP IMMUNITY

(71) Applicant: Taiwan Semiconductor Manufacturing Company, Ltd., Hsin-Chu (TW)

(72) Inventors: Hsin-Wen Su, Yunlin County (TW); Lien Jung Hung, Taipei (TW); Ping-Wei Wang, Hsin-Chu (TW); Wen-Chun Keng, Hsinchu County (TW); Chih-Chuan Yang, Tainan (TW); Shih-Hao Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 155 days.

(21) Appl. No.: 17/673,030

(22) Filed: Feb. 16, 2022

(65) Prior Publication Data
US 2022/0173098 A1 Jun. 2, 2022

Related U.S. Application Data

(62) Division of application No. 16/808,866, filed on Mar. 4, 2020, now Pat. No. 11,257,817.

(51) Int. Cl.
*H01L 27/092* (2006.01)
*H01L 21/8238* (2006.01)
(Continued)

(52) U.S. Cl.
CPC .... *H01L 27/0921* (2013.01); *H01L 21/82385* (2013.01); *H01L 21/823814* (2013.01);
(Continued)

(58) Field of Classification Search
CPC ............ H01L 27/0921; H01L 27/0924; H01L 21/823814; H01L 21/823821;
(Continued)

(56) References Cited

U.S. PATENT DOCUMENTS 11,430,788 B2 *  8/2022  Lin ..................... H01L 27/0924
11,710,663 B2 *  7/2023  Keng ............. H01L 21/823431
                                                            257/401
(Continued)

OTHER PUBLICATIONS

Notice of Allowance dated Oct. 13, 2021 for U.S. Appl. No. 16/808,866.

*Primary Examiner* — Michael M Trinh
(74) *Attorney, Agent, or Firm* — Eschweiler & Potashnik, LLC

(57) ABSTRACT

Various embodiments of the present disclosure are directed towards an integrated chip (IC) having a device section and a pick-up section. The IC includes a semiconductor substrate. A first fin of the semiconductor substrate is disposed in the device section. A second fin of the semiconductor substrate is disposed in the pick-up section and laterally spaced from the first fin in a first direction. A gate structure is disposed in the device section and laterally spaced from the second fin in the first direction. The gate structure extends laterally over the semiconductor substrate and the first fin in a second direction perpendicular to the first direction. A pick-up region is disposed on the second fin. The pick-up region continuously extends from a first sidewall of the second fin to a second sidewall of the second fin. The first sidewall is laterally spaced from the second sidewall in the first direction.

20 Claims, 33 Drawing Sheets

(51) Int. Cl.
  *H01L 29/423*  (2006.01)
  *H01L 29/08*  (2006.01)
  *H01L 29/10*  (2006.01)

(52) U.S. Cl.
  CPC ............... *H01L 21/823821* (2013.01); *H01L 21/823828* (2013.01); *H01L 21/823892* (2013.01); *H01L 27/0924* (2013.01); *H01L 29/0847* (2013.01); *H01L 29/1083* (2013.01); *H01L 29/4238* (2013.01)

(58) Field of Classification Search
  CPC ....... H01L 21/823828; H01L 21/82385; H01L 21/823871; H01L 29/0847; H01L 29/1083; H01L 29/4238
  See application file for complete search history.

(56) References Cited

U.S. PATENT DOCUMENTS

| | | | |
|---|---|---|---|
| 2013/0175611 A1* | 7/2013 | Shinohara | H01L 21/823857 257/334 |
| 2014/0070320 A1 | 3/2014 | Mukherjee et al. | |
| 2016/0379976 A1* | 12/2016 | Kim | H01L 21/823431 257/401 |
| 2017/0098648 A1* | 4/2017 | Lee | H01L 21/823468 |
| 2018/0174916 A1 | 6/2018 | Ho et al. | |
| 2019/0259765 A1 | 8/2019 | Liaw | |
| 2020/0091011 A1* | 3/2020 | Khaderbad | H01L 21/823871 |
| 2020/0251476 A1* | 8/2020 | Chang | H01L 23/528 |
| 2021/0265346 A1 | 8/2021 | Lin et al. | |

* cited by examiner

INTEGRATED CHIP WITH IMPROVED LATCH-UP IMMUNITY

REFERENCE TO RELATED APPLICATION

This Application is a Divisional of U.S. application Ser. No. 16/808,866, filed on Mar. 4, 2020, the contents of which are hereby incorporated by reference in their entirety.

BACKGROUND

The integrated circuit (IC) manufacturing industry has experienced exponential growth over the last few decades. As ICs have evolved, functional density (e.g., the number of interconnected devices per chip area) has increased while feature sizes have decreased. One advance by the semiconductor industry to scale down semiconductor devices is the development of multigate devices (e.g., fin field-effect transistors (FinFETs), gate-all-around field-effect transistors (GAAFETs), etc.). While multigate devices have several advantages over traditional planar transistors (e.g., reduced power consumption, smaller feature sizes, etc.), the use of multigate devices in an IC is not without challenges.

One challenge with an IC having multigate devices is the susceptibility of the IC to latch-up. Latch-up is an inadvertent creation of a low-impedance path in the IC due to one or more parasitic devices (e.g., a thyristor) being triggered. Latch-up may occur anywhere in the IC where a parasitic structure exists (e.g., a PNPN structure, which forms a thyristor, that is undesirably formed due to the relatively close proximity of two or more devices of the IC). A latch-up event may be triggered by various triggering events, such as solar flares, a voltage spike on an input terminal or an output terminal of the IC, or the like. If a latch-up event is triggered, a large current may flow through the low-impedance path and cause the IC to malfunction and/or destroy the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
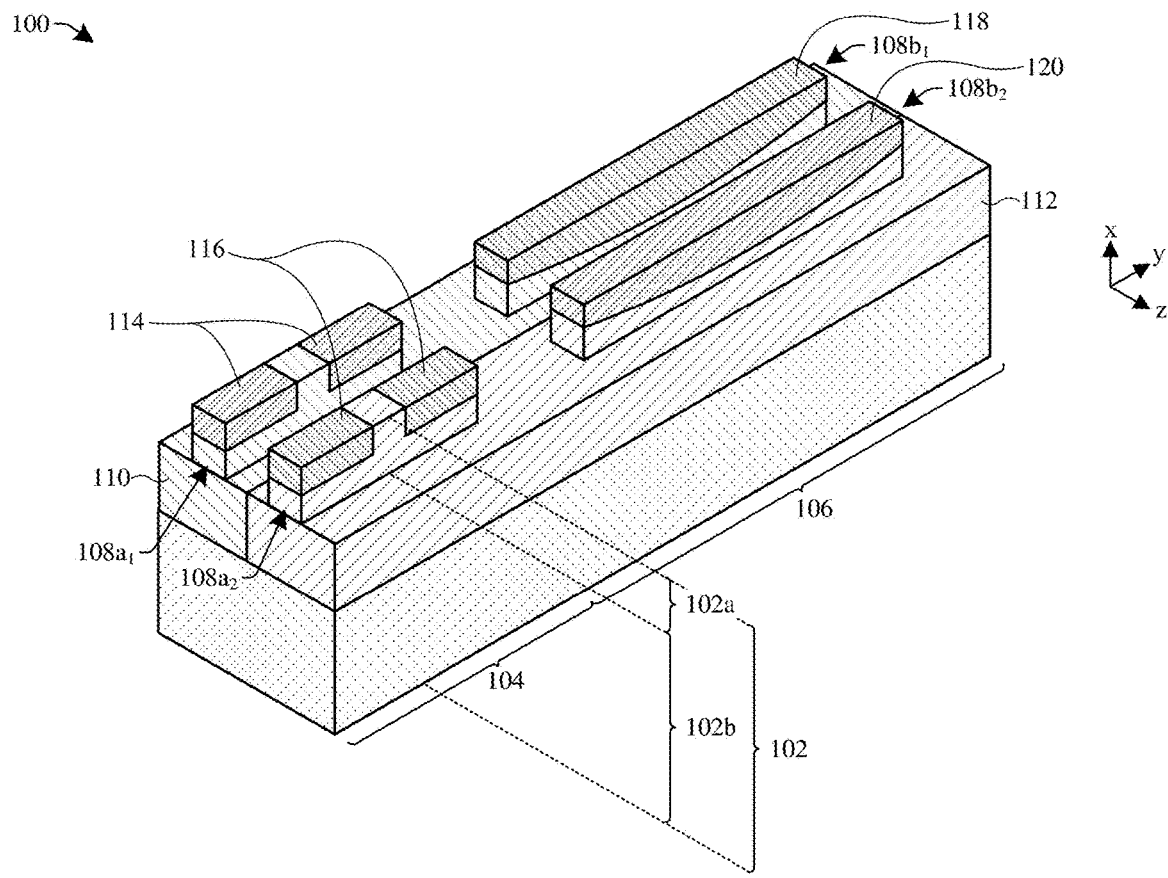
FIG. 1 illustrates an isometric view of some embodiments of an integrated chip (IC) having improved latch-up immunity.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an integrated chip (IC) comprises a n-channel metal-oxide-semiconductor field-effect transistor (MOSFET) and a p-channel MOSFET. Further, the IC comprises a doped region disposed in a semiconductor substrate. Typically, the semiconductor substrate has a first doping type (e.g., p-type), and the doped region has a second doping type opposite the first doping type (e.g., n-type). The p-channel MOSFET is disposed directly over the doped region, and the n-channel MOSFET is disposed directly over the semiconductor substrate and laterally spaced from the doped region. In further embodiments, the n-channel MOSFET may be a n-channel multi-gate MOSFET (e.g., n-channel fin field-effect transistor (FinFET), n-channel gate-all-around field-effect transistor (GAAFET), etc.), and the p-channel MOSFET may be a p-channel multi-gate MOSFET. In yet further embodiments, the n-channel multi-gate MOSFET and the p-channel multi-gate MOSFET may be electrically coupled together to form a complementary metal-oxide-semiconductor (CMOS) device (e.g., a CMOS inverter).

Due to design considerations (e.g., functional density considerations resulting in relatively small spacing between the n-channel multi-gate MOSFET and the p-channel multi-gate MOSFET), the IC may have parasitic structures disposed in the semiconductor substrate. For example, a parasitic NPN bipolar junction transistor (BJT) is created by the junctions of a source/drain region of the n-channel multi-gate MOSFET, the semiconductor substrate, and the doped region. Further, a PNP BJT is created by the junctions of a source/drain region of the p-channel multi-gate MOSFET, the doped region, and the semiconductor substrate. The PNP BJT and the NPN BJT are connected together in such a way as to create a first parasitic device in the semiconductor substrate (e.g., a thyristor comprising a PNPN structure).

During operation of the IC, the doped region and the source/drain region of the p-channel multi-gate MOSFET may be coupled to a first voltage (e.g., Vdd, which may be, for example, 5 volts (V)), and the semiconductor substrate and the source/drain region of the n-channel multi-gate MOSFET may be coupled to a second voltage different than the first voltage (e.g., Vss, which may be, for example, ground). The semiconductor substrate may be electrically coupled to the second voltage via a conductive feature (e.g., a metal contact) that is electrically coupled to a pick-up region. Under normal operating conditions, the first parasitic device is in an "OFF" state (e.g., no (or minimal) current flowing through the thyristor), and the IC may operate as intended.

However, a triggering event may occur (e.g., an inadvertent voltage spike in the IC) that causes the first parasitic device to switch to an "ON" state, thereby resulting in a latch-up event. During the latch-up event, a low-impedance path is formed that causes a large current to flow through the first parasitic device (e.g., between a Vdd terminal and a Vss terminal), thereby causing the IC to malfunction, or in some instances, destroying the IC. For the triggering event to cause the latch-up event, the triggering event must, at least in part, cause a voltage across the first parasitic device to reach (or exceed) a first latch-up trigger voltage. The latch-up trigger voltage is dependent (at least in part) on a resistance of the pick-up region due to the resistance of the pick-up region affecting whether a base-emitter voltage of the NPN BJT is sufficient to forward bias the NPN BJT.

Typically, the pick-up region is disposed on/in a pick-up fin (e.g., a fin of the semiconductor substrate). A pick-up gate structure (e.g., a continuous pick-up gate structure) is disposed over the pick-up fin and between opposite outermost sidewalls of the pick-up fin. During formation of the pick-up region, the pick-up gate structure acts as a masking structure. Therefore, the pick-up region does not extend continuously between the opposite outermost sidewalls of the pick-up fin. Rather, a size (e.g., length) of the pick-up region is limited by the size of the pick-up gate structure. The size of the pick-up gate structure is often a same size as device gate structures of the p-channel/n-channel multi-gate MOSFETs. Thus, the size of the pick-up region is often limited to a same size as the source/drain regions of the p-channel/n-channel multi-gate MOSFETs.

Various embodiments of the present application are directed toward an integrated chip (IC) with improved latch-up immunity. The IC comprises a device region and a pick-up region. A plurality of first fins of the semiconductor substrate are disposed in the device region. A second fin of the semiconductor substrate is disposed in the pick-up region and laterally spaced from the first fins. A pick-up region is disposed on the second fin. The pick-up region continuously extends from a first outermost sidewall of the second fin to a second outermost sidewall of the second fin. The first outermost sidewall is laterally spaced from the second outermost sidewall in a first direction.

The IC may still have parasitic structures disposed in the semiconductor substrate. For example, the IC may comprise a second parasitic device disposed in the semiconductor substrate (e.g., a thyristor comprising a PNPN structure). As such, for a triggering event to cause a latch-up event, the triggering event must, at least in part, cause a voltage across the second parasitic device to reach (or exceed) a second latch-up trigger voltage.

However, because the pick-up region continuously extends from the first outermost sidewall to the second outermost sidewall, a size (e.g., length) of the pick-up region is greater than a size (e.g., length) of a typical pick-up region (e.g., a pick-up region having a same size as source/drain regions). Because the size of the pick-up region is greater than the size of the typical pick-up region, the resistance of the pick-up region is less than a resistance of the typical pick-up region. Thus, the second latch-up trigger voltage may be improved over (e.g., greater than) the first latch-up trigger voltage. Accordingly, the IC may have improved (e.g., increased) latch-up immunity over an IC comprising the typical pick-up region.

FIG. 1 illustrates an isometric view of some embodiments of an integrated chip (IC) 100 having improved latch-up immunity.

As shown in FIG. 1, the IC 100 comprises a semiconductor substrate 102. The semiconductor substrate 102 may comprise any type of semiconductor body (e.g., monocrystalline silicon/CMOS bulk, silicon-germanium (SiGe), silicon on insulator (SOI), etc.). The IC 100 comprises a first section 104 of the IC 100 and a second section 106 of the IC 100. The second section 106 of the IC 100 is disposed on a side of the first section 104 of the IC 100.

The semiconductor substrate 102 comprises a plurality of fins 108. Each of the fins 108 extend in parallel with one another (along the "y" direction). In some embodiments, the fins 108 are referred to as fins of the semiconductor substrate 102, respectively. A first set of fins 108a of the fins 108 are disposed in the first section 104 of the IC 100. A second set of fins 108b of the fins 108 are disposed in the second section 106 of the IC 100.

The fins 108 are laterally spaced from one another (in the "z" direction). Each of the fins 108 comprises a portion of an upper region 102a of the semiconductor substrate 102. The upper region 102a of the semiconductor substrate 102 extends vertically from a lower region 102b of the semiconductor substrate 102 (in the "x" direction). For example, a first fin $108a_1$ comprises a first portion of the upper region 102a of the semiconductor substrate 102 that extends vertically from the lower region 102b of the semiconductor substrate 102, and a second fin $108a_2$ comprises a second portion of the upper region 102a of the semiconductor substrate 102 that extends vertically from the lower region 102b of the semiconductor substrate 102.

A first doped region 110 is disposed in the semiconductor substrate 102. The first doped region 110 has a first doping type (e.g., p-type). The first doped region 110 is disposed in both the first section 104 of the IC 100 and the second section 106 of the IC 100. In some embodiments, the first doped region 110 extends continuously from the first section 104 of the IC 100 into the second section 106 of the IC 100. In further embodiments, the first doped region 110 is disposed in one or more fins of the first set of fins 108a and is disposed in one or more fins of the second set of fins 108b. For example, the first doped region 110 is disposed in the first fin $108a_1$ and a third fin $108b_1$.

A second doped region 112 is disposed in the semiconductor substrate 102. The second doped region 112 has a second doping type opposite the first doping type (e.g., n-type). The second doped region 112 is disposed on a side of the first doped region 110. The second doped region 112 is disposed in both the first section 104 of the IC 100 and the second section 106 of the IC 100. In some embodiments, the second doped region 112 extends continuously from the first section 104 of the IC 100 into the second section 106 of the IC 100. In further embodiments, the second doped region 112 is disposed in one or more fins of the first set of fins 108a and is disposed in one or more fins of the second set of fins 108b. For example, the second doped region 112 is disposed in the second fin $108a_2$ and a fourth fin $108b_2$.

A pair of first source/drain regions 114 is disposed on/in the first fin $108a_1$. The first source/drain regions 114 may be regions of the first fin $108a_1$ having the second doping type. In other embodiments, the first source/drain regions 114 may be first epitaxial structures disposed on/in the first fin $108a_1$. In such embodiments, the first epitaxial structures are a semiconductor material (e.g., epitaxial silicon (Si), epitaxial SiGe, epitaxial silicon carbide (SiC), or the like). In further embodiments, the first epitaxial structures may have the second doping type.

A portion of the first fin $108a_1$ is disposed between the first source/drain regions 114. In some embodiments, the first doped region 110 is disposed in the portion of the first fin $108a_1$ that is disposed between the first source/drain regions 114. A first selectively-conductive channel is disposed in the portion of the first fin $108a_1$ that is disposed between the first source/drain regions 114. The first selectively-conductive channel extends between the first source/drain regions 114 (in the "y" direction). In further embodiments, the first source/drain regions 114 and the first selectively-conductive channel are part of a n-channel multi-gate MOSFET (e.g., n-channel FinFET, n-channel GAAFET, etc.).

A pair of second source/drain regions 116 is disposed on/in second fin $108a_2$. The second source/drain regions 116 may be regions of the second fin $108a_2$ having the first doping type. In other embodiments, the second source/drain regions 116 may be second epitaxial structures disposed on/in the second fin $108a_2$. In such embodiments, the second epitaxial structures are a semiconductor material (e.g., epitaxial Si, epitaxial SiGe, epitaxial SiC, or the like). In further embodiments, the second epitaxial structures may have the first doping type.

A portion of the second fin $108a_2$ is disposed between the second source/drain regions 116. In some embodiments, the second doped region 112 is disposed in the portion of the second fin $108a_2$ that is disposed between the second source/drain regions 116. A second selectively-conductive channel is disposed in the portion of the second fin $108a_2$ that is disposed between the second source/drain regions 116. The second selectively-conductive channel extends between the second source/drain regions 116 (in the "y" direction). In further embodiments, the second source/drain regions 116 and the second selectively-conductive channel are part of a p-channel multi-gate MOSFET (e.g., p-channel FinFET, p-channel GAAFET, etc.).

A first pick-up region 118 is disposed on/in the third fin $108b_1$. The first pick-up region 118 is electrically coupled to the first doped region 110. In some embodiments, the first pick-up region 118 may be a region of the third fin $108b_1$ having a same doping type as the first doped region 110. The first pick-up region 118 provides a low resistance electrical connection between a first pick-up contact (not shown) (e.g., a metal contact) and the first doped region 110, such that the first doped region 110 may be electrically coupled (or biased) to a first voltage (e.g., Vss, which may be, for example, ground).

In some embodiments, the first pick-up region 118 is a third epitaxial structure disposed on/in the third fin $108b_1$. In further embodiments, the third epitaxial structure is a semiconductor material (e.g., epitaxial Si, epitaxial SiGe, epitaxial SiC, or the like). In yet further embodiments, the third epitaxial structure comprises a first Group IV chemical element (e.g., Si) and a second Group IV chemical (e.g., Ge) that is different than the first Group IV chemical element. More specifically, the third epitaxial structure may be epitaxial SiGe. The third epitaxial structure may have the same doping type as the first doped region 110. In embodiments in which the first pick-up region 118 is the third epitaxial structure, the first pick-up region 118 may be referred to as a first epitaxial pick-up structure.

In some embodiments, the first pick-up region 118 continuously extends (in the "y" direction) from a first outermost sidewall of the third fin $108b_1$ to a second outermost sidewall of the third fin $108b_1$. The first outermost sidewall is laterally spaced from the second outermost sidewall (in the "y" direction). Because the first pick-up region 118 continuously extends from the first outermost sidewall to the second outermost sidewall, a size (e.g., length) of the first pick-up region 118 may be greater than a size (e.g., length) of a typical pick-up region (e.g., a pick-up region having a same size as source/drain regions). Because the size of the first pick-up region 118 may be greater than the size of the typical pick-up region, a resistance of the first pick-up region 118 may be less than a resistance of the typical pick-up region (e.g., an 85% reduction). In some embodiments, the resistance of the first pick-up region 118 may be less than or equal to 20,000 ohms.

The first pick-up region 118 may have a first center point disposed an equal distance from the first outermost sidewall and the second outermost sidewall. A thickness of the first pick-up region 118 may continuously decrease from the first center point to the first outermost sidewall. The thickness of the first pick-up region 118 may continuously decrease from the first center point to the second outermost sidewall. In some embodiments, the bottom surface of the first pick-up region 118 is convex.

In some embodiments, the first pick-up region 118 continuously extends (in the "z" direction) from a third outermost sidewall of the third fin $108b_1$ to a fourth outermost sidewall of the third fin $108b_1$. The third outermost sidewall is laterally spaced from the fourth outermost sidewall (in the "z" direction). The first pick-up region 118 may have a second center point disposed an equal distance from the third outermost sidewall and the fourth outermost sidewall. The thickness of the first pick-up region 118 may continuously decrease from the second center point to the third outermost sidewall. The thickness of the first pick-up region 118 may continuously decrease from the second center point to the fourth outermost sidewall. In further embodiments, a maximum thickness of the first pick-up region 118 may be greater than a maximum thickness of the first source/drain regions 114 and/or a maximum thickness of the second source/drain regions 116.

A second pick-up region 120 is disposed on/in the fourth fin $108b_2$. The second pick-up region 120 is electrically coupled to the second doped region 112. The second pick-up region 120 may be a region of the fourth fin $108b_2$ having a same doping type as the second doped region 112. The second pick-up region 120 provides a low resistance electrical connection between a second pick-up contact (not shown) (e.g., a metal contact) and the second doped region 112, such that the second doped region 112 may be electrically coupled (or biased) to a second voltage (e.g., Vdd, which may be, for example, 5 volts (V)).

In some embodiments, the second pick-up region 120 is a fourth epitaxial structure disposed on/in the fourth fin 108$b_2$. In further embodiments, the fourth epitaxial structure is a semiconductor material (e.g., epitaxial Si, epitaxial SiGe, epitaxial SiC, or the like). In yet further embodiments, the fourth epitaxial structure comprises the first Group IV chemical element (e.g., Si). More specifically, the fourth epitaxial structure may be epitaxial Si doped with phosphorus. The fourth epitaxial structure may have the same doping type as the second doped region 112. In embodiments in which the second pick-up region 120 is the fourth epitaxial structure, the second pick-up region 120 may be referred to as a second epitaxial pick-up structure.

In some embodiments, the second pick-up region 120 continuously extends (in the "y" direction) from a fifth outermost sidewall of the fourth fin 108$b_2$ to a sixth outermost sidewall of the fourth fin 108$b_2$. The fifth outermost sidewall is laterally spaced from the sixth outermost sidewall (in the "y" direction). Because the second pick-up region 120 continuously extends from the fifth outermost sidewall to the sixth outermost sidewall, a size (e.g., length) of the second pick-up region 120 may be greater than a size (e.g., length) of a typical pick-up region (e.g., a pick-up region having a same size as source/drain regions). Because the size of the second pick-up region 120 may be greater than the size of the typical pick-up region, a resistance of the second pick-up region 120 may be less than a resistance of the typical pick-up region.

The second pick-up region 120 may have a third center point disposed an equal distance from the fifth outermost sidewall and the sixth outermost sidewall. A thickness of the second pick-up region 120 may continuously decrease from the third center point to the fifth outermost sidewall. The thickness of the second pick-up region 120 may continuously decrease from the third center point to the sixth outermost sidewall. In some embodiments, the bottom surface of the second pick-up region 120 is convex.

In some embodiments, the second pick-up region 120 continuously extends (in the "z" direction) from a seventh outermost sidewall of the fourth fin 108$b_2$ to an eighth outermost sidewall of the fourth fin 108$b_2$. The seventh outermost sidewall is laterally spaced from the eighth outermost sidewall (in the "z" direction). The second pick-up region 120 may have a fourth center point disposed an equal distance from the seventh outermost sidewall and the eighth outermost sidewall. The thickness of the second pick-up region 120 may continuously decrease from the fourth center point to the seventh outermost sidewall. The thickness of the second pick-up region 120 may continuously decrease from the fourth center point to the eighth outermost sidewall. In further embodiments, a maximum thickness of the second pick-up region 120 may be greater than the maximum thickness of the first source/drain regions 114 and/or the maximum thickness of the second source/drain regions 116. In yet further embodiments, portions of the semiconductor substrate 102 that are not labeled (e.g., not labeled as the first doped region 110, the second doped region 112, the first pick-up region 118, the second pick-up region 120, the first source/drain regions 114, or the second source/drain regions 116) may have the first doping type.

Figure 2:
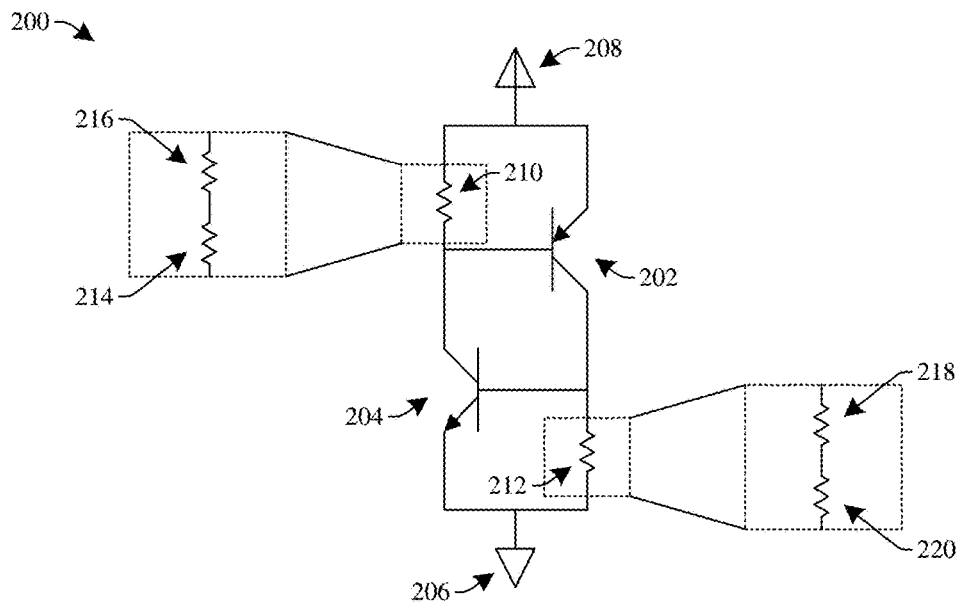
FIG. 2 illustrates a circuit diagram of some embodiments of an electrical circuit comprising a parasitic device of the IC of FIG. 1.

FIG. 2 illustrates a circuit diagram 200 of some embodiments of an electrical circuit comprising a parasitic device of the IC 100 of FIG. 1.

As shown in FIG. 2, the circuit diagram 200 comprises a PNP bipolar junction transistor (BJT) 202. In some embodiments, the PNP BJT 202 is created by junctions between one of the second source/drain regions 116, the second doped region 112, and the first doped region 110 (See, e.g., FIG. 1). Further, the circuit diagram 200 comprises a NPN BJT 204. In further embodiments, the NPN BJT 204 is created by one of the first source/drain regions 114, the first doped region 110, and the second doped region 112 (See, e.g., FIG. 1). The PNP BJT 202 and the NPN BJT 204 are connected together in such a way as to create a parasitic device (e.g., thyristor).

In some embodiments, the emitter of the NPN BJT 204, the base of the NPN BJT 204, and the collector of the PNP BJT 202 are electrically coupled to a first voltage node 206. The first voltage node 206 may have the first voltage (e.g., Vss). In further embodiments, the emitter of the PNP BJT 202, the base of the PNP BJT 202, and the collector of the NPN BJT 204 are electrically coupled to a second voltage node 208. The second voltage node 208 may have the second voltage (e.g., Vdd).

Further, the circuit diagram 200 comprises a first resistor 210 and a second resistor 212. The first resistor 210 represents an equivalent resistor of a third resistor 214 and a fourth resistor 216 connected in series. The second resistor 212 represents an equivalent resistor of a fifth resistor 218 and a sixth resistor 220 connected in series. The third resistor 214 represent a resistance of the second doped region 112. The fourth resistor 216 represents the resistance of the second pick-up region 120. The fifth resistor 218 represents a resistance of the first doped region 110. The sixth resistor 220 represents the resistance of the first pick-up region 118.

Under normal operating conditions, the parasitic device is in an "OFF" state (e.g., no (or minimal) current flowing through the thyristor). However, a triggering event may occur (e.g., an inadvertent voltage spike in the IC 100) that causes the parasitic device to switch to an "ON" state, thereby resulting in a latch-up event. During the latch-up event, a low-impedance path is formed that causes a large current to flow through the parasitic device (e.g., between a Vdd terminal and a Vss terminal), thereby causing the IC 100 to malfunction, or in some instances, destroying the IC 100.

For the triggering event to cause the latch-up event, the triggering event must, at least in part, cause a voltage across the parasitic device to reach (or exceed) a latch-up trigger voltage. As seen in the circuit diagram 200, the latch-up trigger voltage is dependent on a resistance of the first resistor 210 and/or the resistance of the second resistor 212. For example, the latch-up trigger voltage is dependent on the resistance of the first resistor 210 due to the resistance of the first resistor 210 affecting whether a base-emitter voltage of the PNP BJT 202 is sufficient to forward bias the PNP BJT 202. Because the latch-up trigger voltage is dependent on the resistance of the first resistor 210, the latch-up trigger voltage is dependent on a resistance of the third resistor 214 and the fourth resistor 216. In other words, the latch-up trigger voltage is dependent on the resistance of the second doped region 112 and the resistance of the second pick-up region 120. Further, the latch-up trigger voltage is dependent on the resistance of the second resistor 212 due to the resistance of the second resistor 212 affecting whether a base-emitter voltage of the NPN BJT 204 is sufficient to forward bias the NPN BJT 204. Because the latch-up trigger voltage is dependent on the resistance of the second resistor 212, the latch-up trigger voltage is dependent on a resistance of the fifth resistor 218 and the sixth resistor 220. In other words, the latch-up trigger voltage is dependent on the resistance of the first doped region 110 and the resistance of the first pick-up region 118.

As discussed above, the resistance of the first pick-up region 118 may be less than the resistance of the typical pick-up region due to the size of the first pick-up region 118 being greater than the size of the typical pick-up region. Therefore, the first pick-up region 118 reduces the resistance of the second resistor 212 over an IC comprising the typical pick-up region. Thus, the latch-up trigger voltage of the IC 100 may be improved (e.g., increased) over an IC having the typical pick-up region.

Further, as discussed above, the resistance of the second pick-up region 120 may be less than the resistance of the typical pick-up region due to the size of the second pick-up region 120 being greater than the size of the typical pick-up region. Therefore, the second pick-up region 120 reduces the resistance of the first resistor 210 over an IC comprising the typical pick-up region. Thus, the latch-up trigger voltage of the IC 100 may be improved over an IC having the typical pick-up region. Accordingly, the IC 100 may have improved (e.g., increased) latch-up immunity.

Figure 3:
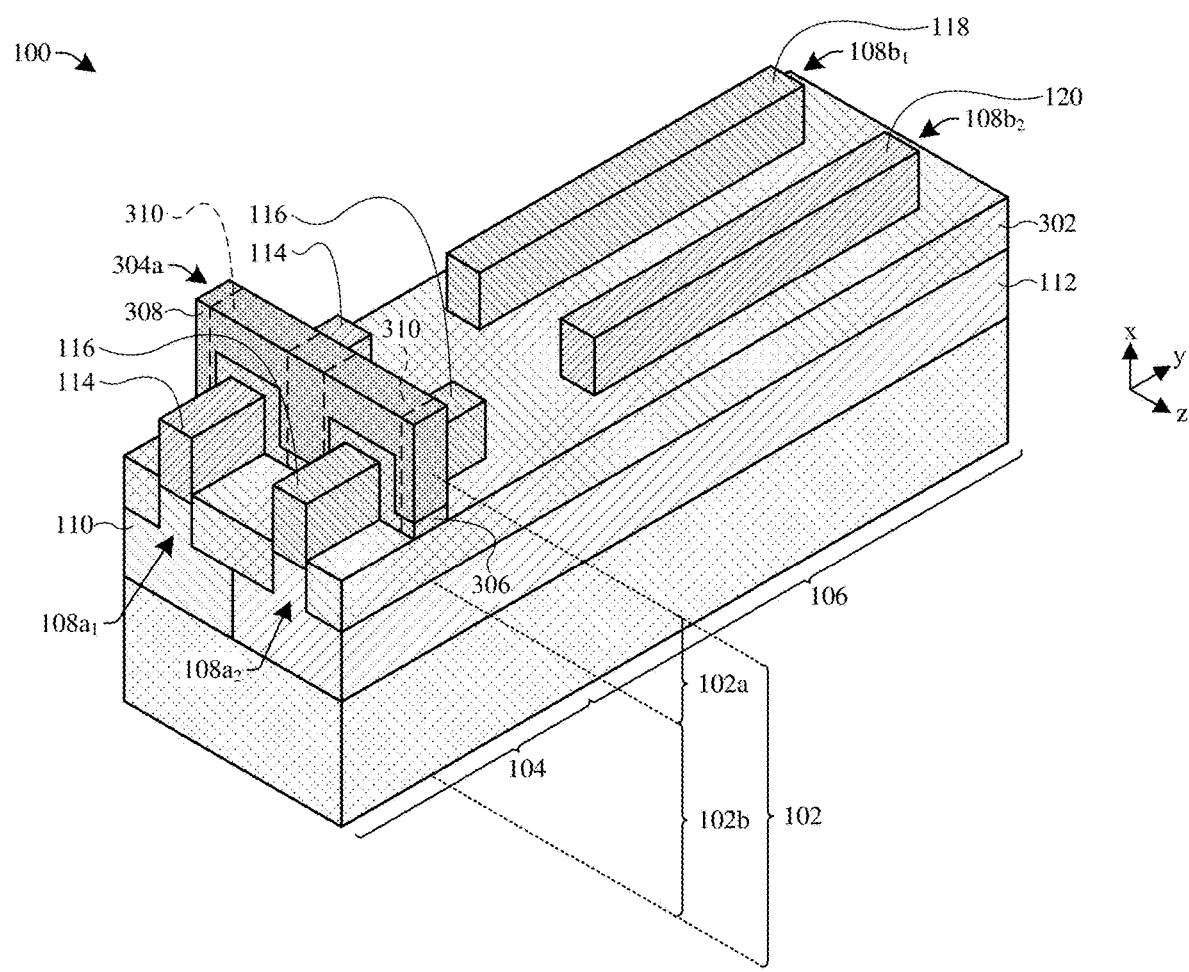
FIG. 3 illustrates an isometric view of some other embodiments of the IC of FIG. 1

FIG. 3 illustrates an isometric view of some other embodiments of the IC 100 of FIG. 1.

As shown in FIG. 3, an isolation structure 302 is disposed over the lower region 102b of the semiconductor substrate 102. The upper region 102a of the semiconductor substrate 102 extends vertically through the isolation structure 302, such that the fins 108 are at least partially disposed over the isolation structure 302. The isolation structure 302 electrically isolates the fins 108 from one another. In some embodiments, the isolation structure 302 may comprise, for example, an oxide (e.g., silicon dioxide ($SiO_2$)), a nitride (e.g., silicon nitride (SiN)), an oxy-nitride (e.g., silicon oxy-nitride ($SiO_xN_y$)), some other dielectric material, or a combination of the foregoing. The isolation structure 302 may be a multi-layer structure, for example, comprising one or more liner layers.

A first continuous gate structure 304a of a plurality of continuous gate structures 304 is disposed over the isolation structure 302 and over the fins 108. The first continuous gate structure 304a extends continuously across the isolation structure 302 and over the fins 108 (in the "z" direction). The first continuous gate structure 304a extends continuously (in the "z" direction) between the first source/drain regions 114 and the second source/drain regions 116.

The first continuous gate structure 304a comprises a continuous gate dielectric structure 306 and a continuous gate electrode structure 308. The continuous gate dielectric structure 306 extends continuously across the isolation structure 302 (in the "z" direction) and engages one or more of the fins of the first set of fins 108a on three sides. For example, the continuous gate dielectric structure 306 extends continuously across the isolation structure 302 (in the "z" direction) and engages three sides of the first fin $108a_1$ and three sides of the second fin $108a_2$.

The continuous gate electrode structure 308 is disposed over the continuous gate dielectric structure 306. The continuous gate electrode structure 308 extends continuously (in the "z" direction) on the continuous gate dielectric structure 306 and over the fins 108. In some embodiments, the continuous gate electrode structure 308 has a substantially planar upper surface.

In some embodiments, the continuous gate dielectric structure 306 comprises an oxide (e.g., $SiO_2$), a high-k dielectric (e.g., a dielectric material with a dielectric constant greater than 3.9), some other dielectric material, or a combination of the foregoing. The continuous gate dielectric structure 306 may be a multi-layered structure, for example, comprising one or more interfacial layers. In further embodiments, the continuous gate electrode structure 308 may comprise, for example, polysilicon, a metal (e.g., tungsten (W)), some other conductive material, or a combination of the foregoing. The continuous gate electrode structure 308 may be a multi-layered structure. For example, in some embodiments, the continuous gate electrode structure 308 may comprise, for example, a work function metal layer and a metal fill layer. In yet further embodiments, the first continuous gate structure 304a may comprise an interfacial layer, a high-k dielectric layer disposed over the interfacial layer, a barrier layer disposed over the high-k dielectric layer, a work function metal layer disposed over the barrier layer, and a metal fill layer disposed over the work function layer.

The first continuous gate structure 304a comprises a plurality of gate structures 310. In some embodiments, the gate structures 310 are portions of the first continuous gate structure 304a disposed between a pair of source/drain regions, respectively. For example, a first gate structure, which is a first portion of the first continuous gate structure 304a, is disposed between the first source/drain regions 114, and a second gate structure, which is a second portion of the first continuous gate structure 304a, is disposed between the second source/drain regions 116. Each of the gate structures 310 may engage three sides of one of the fins of the first set of fins 108a. For example, the first gate structure engages three sides of the first fin $108a_1$, and the second gate structure engages three sides of the second fin $108a_2$.

Each of the gate structures 310 comprise a portion of the continuous gate dielectric structure 306, which may be referred to as a gate dielectric structure, and a portion of the continuous gate electrode structure 308, which may be referred to as a gate electrode structure. For example, the first gate structure comprises a first portion of the continuous gate dielectric structure 306, which may be referred to as a first gate dielectric structure, and a first portion of the continuous gate electrode structure 308, which may be referred to as a first gate electrode structure. The first portion of the continuous gate dielectric structure 306 may contact the isolation structure 302 and engage the first fin $108a_1$ on three sides, and the first portion of the continuous gate electrode structure 308 directly overlies the first portion of the continuous gate dielectric structure 306. The gate electrode structures may be electrically coupled together by other portions of the first continuous gate structure 304a disposed between two neighboring gate electrode structures. For example, a third portion of the continuous gate electrode structure 308, which extends from the first gate structure to the second gate structure, may electrically couple the first gate structure to the second gate structure. It will be appreciated that, rather than the gate structures 310 being portions of the first continuous gate structure 304a, the gate structures 310 may be discrete gate structures that are separated from one another by a dielectric structure (e.g., by an interlayer dielectric structure).

The gate structures 310 control a conductivity of the selectively-conductive channels (e.g., switch between one or more conducting states and a non-conducting state) disposed between each pair of source/drain regions. For example, the first gate structure is configured to control the conductivity of the first selectively-conductive channel disposed between the first source/drain regions 114, and the second gate structure is configured to control the conductivity of the second selectively-conductive channel disposed between the second source/drain regions 116.

The first gate structure, the first selectively-conductive channel, and the first source/drain regions 114 form a first multi-gate MOSFET. More specifically, due to the doping types of the he first source/drain regions 114 and the first doped region 110, the first source/drain regions 114, the first gate structure, and the first selectively-conductive channel form a n-channel multi-gate MOSFET. The second gate structure, the second selectively-conductive channel, and the second source/drain regions 116 form a second multi-gate MOSFET. More specifically, due to the doping types of the second source/drain regions 116 and the second doped region 112, the second source/drain regions 116, the second gate structure, and the second selectively-conductive channel form a p-channel multi-gate MOSFET.

In some embodiments, the third portion of the continuous gate electrode structure 308 may electrically couple the first gate structure to the second gate structure, such that the n-channel multi-gate MOSFET and the p-channel multi-gate MOSFET form a complementary metal-oxide-semiconductor (CMOS) device (e.g., a CMOS inverter). It will be appreciated that an interconnect structure (e.g., copper interconnect) may electrically couple the n-channel multi-gate MOSFET and the p-channel multi-gate MOSFET together to form the CMOS device. In further embodiments, the n-channel multi-gate MOSFET and the p-channel multi-gate MOSFET are part of a memory device disposed on the IC 100 (e.g., static random-access memory (SRAM) device, dynamic random-access memory device, flash memory device, etc.). In yet further embodiments, the first pick-up region 118 and the second pick-up region 120 are parts of the memory device disposed on the IC 100

In some embodiments, the first source/drain regions 114 and/or the second source/drain regions 116 are disposed at least partially below an upper surface of the isolation structure 302 and at least partially over the upper surface of the isolation structure 302. In further embodiments, the first pick-up region 118 and/or the second pick-up region 120 are disposed at least partially below the upper surface of the isolation structure 302 and at least partially over the upper surface of the isolation structure 302. In further embodiments, the bottom surface of the first pick-up region 118 may be vertically spaced from the upper surface of the isolation structure 302 by a greater distance than bottom surfaces of the first source/drain regions 114 or bottom surfaces of the second source/drain regions 116 are vertically spaced from the upper surface of the isolation structure 302. In yet further embodiments, the bottom surface of the second pick-up region 120 may be vertically spaced from the upper surface of the isolation structure 302 by a greater distance than the bottom surfaces of the first source/drain regions 114 or the bottom surfaces of the second source/drain regions 116 are vertically spaced from the upper surface of the isolation structure 302.

Figure 4A:
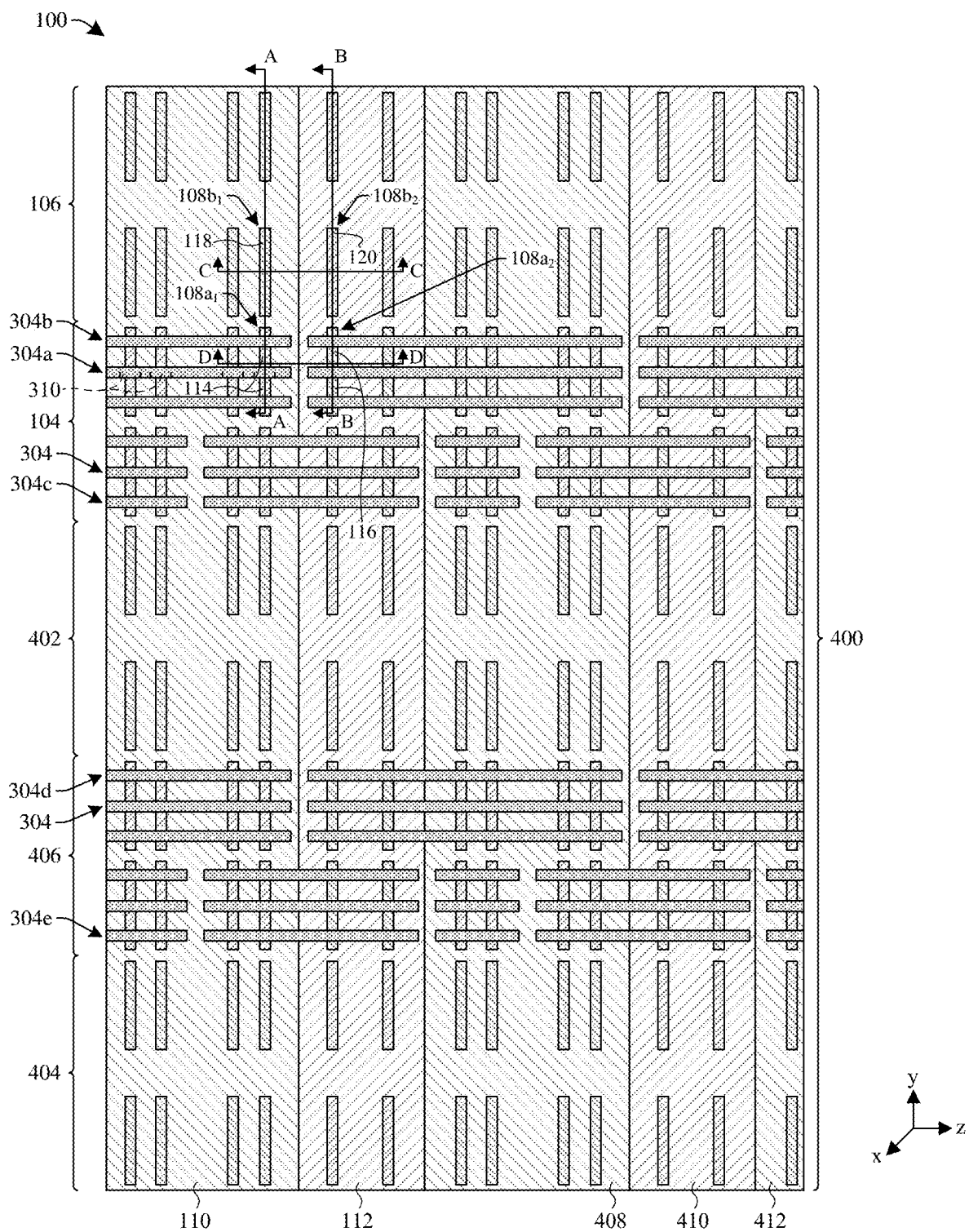
FIGS. 4A-4E illustrate various views of some other embodiments of the IC of FIG. 3.
Figure 4B:
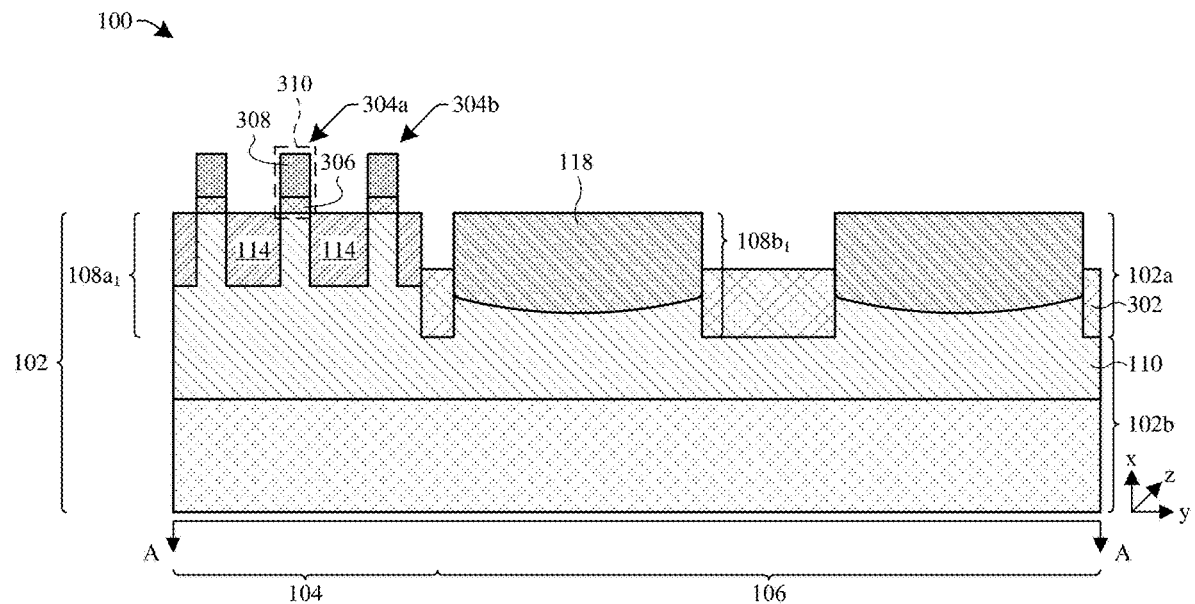
Figure 4C:
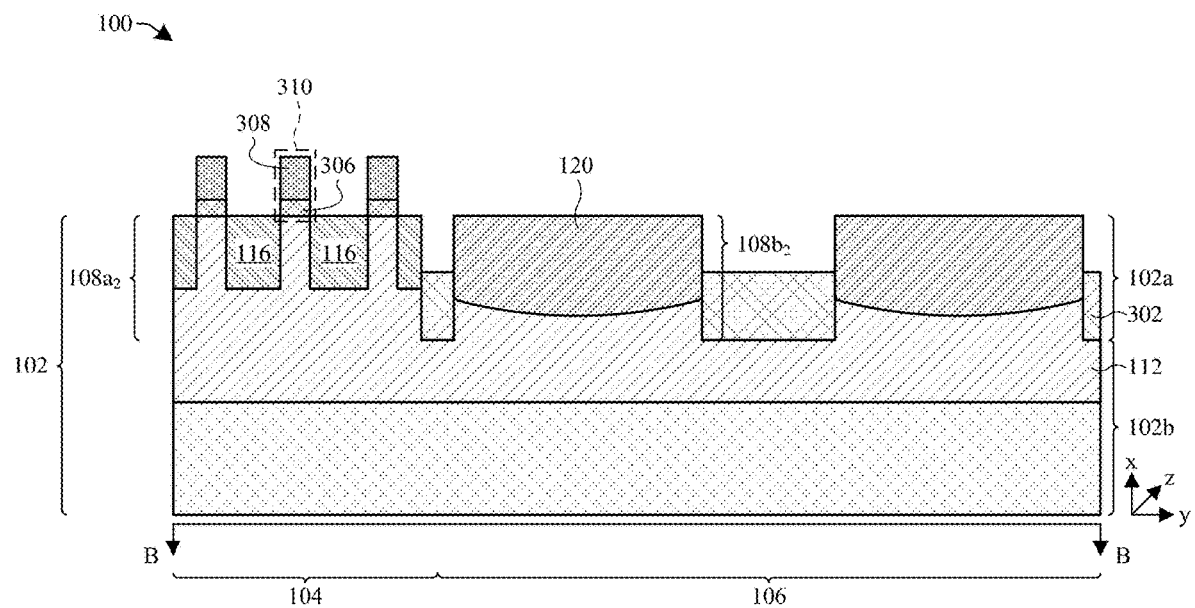
Figure 4D:
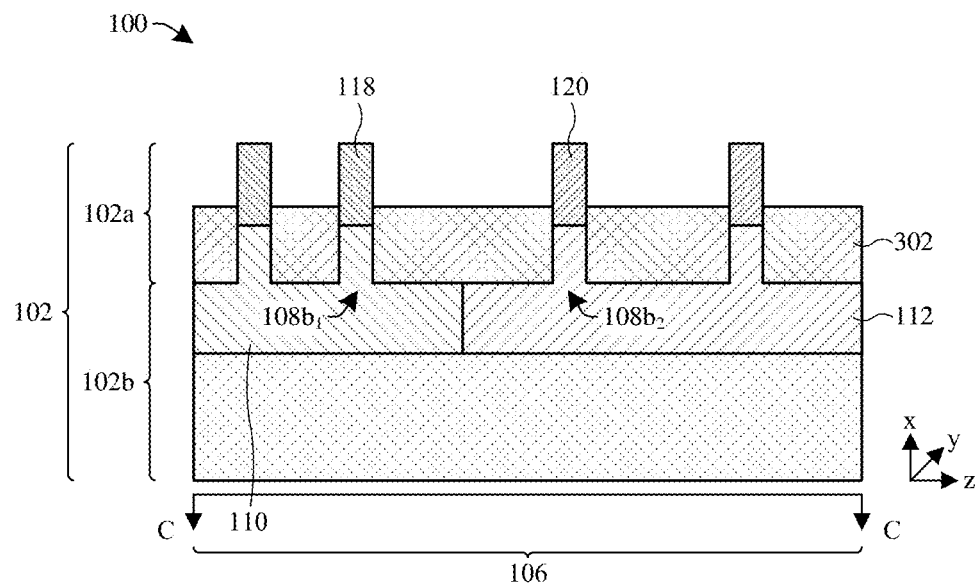
Figure 4E:
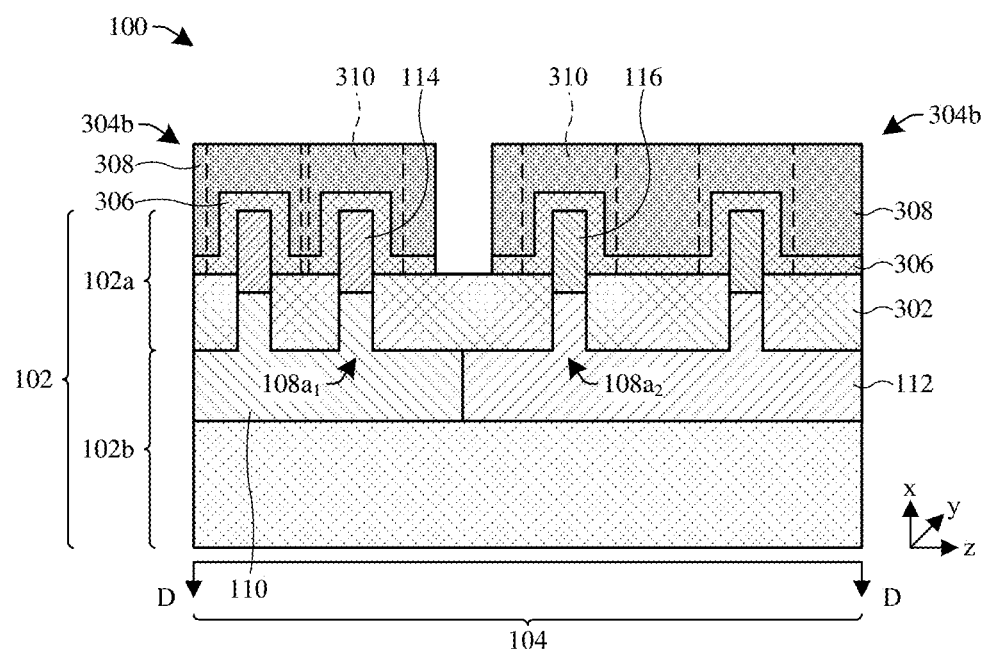

FIGS. 4A-4E illustrate various views of some other embodiments of the IC 100 of FIG. 3. FIG. 4A illustrates a layout view of some other embodiments of the IC of FIG. 3 without the isolation structure 302. FIG. 4B illustrates a cross-sectional view of some embodiments of the IC of FIG. 4A with the isolation structure 302 taken along line A-A of FIG. 4A. FIG. 4C illustrates a cross-sectional view of some embodiments of the IC of FIG. 4A with the isolation structure 302 taken along line B-B of FIG. 4A. FIG. 4D illustrates a cross-sectional view of some embodiments of the IC of FIG. 4A with the isolation structure 302 taken along line C-C of FIG. 4A. FIG. 4E illustrates a cross-sectional view of some embodiments of the IC of FIG. 4A with the isolation structure 302 taken along line D-D of FIG. 4A.

As shown in FIGS. 4A-4E, the IC 100 comprises a memory device 400 (e.g., SRAM device, dynamic random-access memory device, flash memory device, etc.). Further, the IC 100 comprises the second section 106, a third section 402, and a fourth section 404. In some embodiments, the second section 106 is referred to as a first edge pick-up section, the third section 402 is referred to as a middle pick-up section, and the fourth section 404 is referred to as a second edge pick-up section. The first section 104 is disposed between the second section 106 and the third section 402. In some embodiments, the first section 104 is referred to as a first device section. A fifth section 406 is disposed between the third section 402 and the fourth section 404. In some embodiments, the fifth section is referred to as a second device section.

In some embodiments, a third doped region 408, a fourth doped region 410, and a fifth doped region 412 are disposed in the semiconductor substrate 102. The third doped region 408 may be disposed between the second doped region 112 and the fourth doped region 410. The fourth doped region 410 may be disposed between the fifth doped region 412 and the third doped region 408. The third doped region 408 has the first doping type, the fourth doped region 410 has the second doping type, and the fifth doped region 412 has the first doping type. It will be appreciated that the first doped region 110, the third doped region 408, and the fifth doped region 412 may be portions of a sixth doped region that extends continuously through the semiconductor substrate 102. Moreover, it will be appreciated that the second doped region 112 and the fourth doped region 410 may be portions of a seventh doped region that extends continuously through the semiconductor substrate 102. In such embodiments, the sixth doped region may extend beneath the seventh doped region, or vice versa, so that the sixth doped region and the seventh doped region extend continuously through the semiconductor substrate 102.

The first fin $108a_1$ is one of a first plurality of fins. The first plurality of fins are disposed over the first doped region 110, the third doped region 408, and the fifth doped region 412. Further, the first plurality of fins are disposed in the first section 104 and/or the fifth section 406. It will be appreciated that, in some embodiments, the fins of the first plurality of fins comprise substantially similar features (e.g., structural features, doping type, etc.) as the first fin $108a_1$. The pair of first source/drain regions 114 is one pair of a plurality of pairs of third source/drain regions. One or more of the pairs of third source/drain regions are disposed on/in the fins of the first plurality of fins. It will be appreciated that, in some embodiments, the third source/drain regions comprise substantially similar features (e.g., structural features, doping type, etc.) as the first source/drain regions 114.

The second fin $108a_2$ is one of a second plurality of fins. The second plurality of fins are disposed over the second doped region 112 and the fourth doped region 410. Further, the second plurality of fins are disposed in the first section 104 and/or the fifth section 406. It will be appreciated that, in some embodiments, the fins of the second plurality of fins comprise substantially similar features (e.g., structural features, doping type, etc.) as the second fin $108a_2$. The pair of second source/drain regions 116 is one pair of a plurality of pairs of fourth source/drain regions. One or more of the pairs of fourth source/drain regions are disposed on/in the fins of the second plurality of fins. It will be appreciated that, in some embodiments, the fourth source/drain regions comprise substantially similar features (e.g., structural features, doping type, etc.) as the second source/drain regions 116.

The continuous gate structures of the plurality of continuous gate structures 304 may engage one or more of the first plurality of fins and/or one or more of the second plurality of fins. It will be appreciated that, in some embodiments, each of the continuous gate structures of the plurality of continuous gate structures 304 comprise substantially similar features (e.g., structural features, doping type, etc.) as the first continuous gate structure 304a. In some embodiments, the fins of the first plurality of fins are referred to as device fins (e.g., due to pairs of third source/drain regions being disposed on the fins of the first plurality of fins). In further embodiments, the fins of the second plurality of fins are also referred to as device fins (e.g., due to pairs of fourth source/drain regions being disposed on the fins of the second plurality of fins).

The third fin $108b_1$ is one of a third plurality of fins. The third plurality of fins are disposed over the first doped region 110, the third doped region 408, and the fifth doped region 412. Further, the third plurality of fins are disposed in the second section 106, the third section 402, and/or the fourth section 404. It will be appreciated that, in some embodiments, the fins of the third plurality of fins comprise substantially similar features (e.g., structural features, doping type, etc.) as the third fin $108b_1$. The first pick-up region 118 is one of a first plurality of pick-up regions. The pick-up regions of the first plurality of pick-up regions are disposed on the fins of the third plurality of fins, respectively. It will be appreciated that, in some embodiments, each of the pick-up regions of the first plurality of pick-up regions comprises substantially similar features (e.g., structural features, doping type, etc.) as the first pick-up region 118. In some embodiments, the fins of the third plurality of fins are referred to as pick-up fins (e.g., due to the first plurality of pick-up regions being disposed on the fins of the third plurality of fins). The third fin $108b_1$ may be disposed nearer the first fin $108a_1$ than any other fin of the second set of fins 108b.

The fourth fin $108b_2$ is one of a fourth plurality of fins. The fourth plurality of fins are disposed over the second doped region 112 and the fourth doped region 410. Further, the fourth plurality of fins are disposed in the second section 106, the third section 402, and/or the fourth section 404. It will be appreciated that, in some embodiments, the fins of the fourth plurality of fins comprise substantially similar features (e.g., structural features, doping type, etc.) as the fourth fin $108b_2$. The second pick-up region 120 is one of a second plurality of pick-up regions. The pick-up regions of the second plurality of pick-up regions are disposed on the fins of the fourth plurality of fins, respectively. It will be appreciated that, in some embodiments, each of the pick-up regions of the second plurality of pick-up regions comprises substantially similar features (e.g., structural features, doping type, etc.) as the second pick-up region 120. In some embodiments, the fins of the fourth plurality of fins are also referred to as pick-up fins (e.g., due to the second plurality of pick-up regions being disposed on the fins of the fourth plurality of fins). The fourth fin $108b_2$ may be disposed nearer the second fin $108a_2$ than any other fin of the second set of fins 108b.

In some embodiments, the only type of fins disposed in the first section 104 are device fins (e.g., fins in which source/drain regions are disposed on). In other words, the first section 104 does not comprise any pick-up fins (e.g., fins in which pick-up regions are disposed on). The only type of fins disposed in the fifth section 406 may be device fins.

In further embodiments, the only type of fins disposed in the second section 106 are pick-up fins. In other words, the second section 106 does not comprise any device fins. The only type of fins disposed in the third section 402 may be pick-up fins. In yet further embodiments, the only type of fins disposed in the fourth section 404 are pick-up fins.

In some embodiments, the first section 104 comprises a continuous region of device fins. In other words, in the first section 104, no pick-up fin laterally separates any two device fins (in the "y" direction or the "z" direction). The fifth section 406 may comprise a continuous region of device fins. In further embodiments, the second section 106 comprises a continuous region of pick-up fins. In other words, in the second section 106, no device fin laterally separates any two pick-up fins (in the "y" direction or the "z" direction). The third section 402 may comprise a continuous region of pick-up fins. In yet further embodiments, the fourth section 404 comprises a continuous region of pick-up fins.

In some embodiments, no continuous gate structures of the plurality of continuous gate structures 304 are disposed in the second section 106, the third section 402, and/or the fourth section 404. In further embodiments, no continuous gate structures of the plurality of continuous gate structures 304 engage (or directly contact) any of the pick-up fins. In further embodiments, the second section 106 is disposed between an outermost sidewall of a first outermost continuous gate structure 304b of the first section 104 and a first edge of the memory device 400 (or the IC 100). The first outermost continuous gate structure 304b may be disposed nearer the first edge of the memory device 400 (or the IC 100) than any other continuous gate structure of the plurality of continuous gate structures 304.

The third section 402 may be disposed between an outermost sidewall of a second outermost continuous gate structure 304c of the first section 104 and an outermost sidewall of a third outermost continuous gate structure 304d of the fifth section 406. In some embodiments, the fourth section 404 is disposed between an outermost sidewall of a fourth outermost continuous gate structure 304e of the fifth section 406 and a second edge of the memory device 400 (or the IC 100). The second edge of the memory device 400 (or the IC 100) is disposed opposite the first edge of the memory device 400 (or the IC 100). In further embodiments, the fourth outermost continuous gate structure 304e may be disposed nearer the second edge of the memory device 400 (or the IC 100) than any other continuous gate structure of the plurality of continuous gate structures 304.

FIGS. 4A-4E illustrates the fins 108 repeating in a first predefined pattern. However, it will be appreciated that the fins 108 are not required to repeat in the first predefined pattern. Rather, any layout of the fins 108 is possible, so long as only pick-up fins are disposed in the second section 106, the third section 402, and the fourth section 404 and only device fins are disposed in the first section 104 and the fifth section 406. Further, FIGS. 4A-4E illustrates the continuous gate structures of the plurality of continuous gate structures 304 arranged in a second predefined pattern. However, it will be appreciated that, in some embodiments, the continuous gate structures of the plurality of continuous gate structures 304 are not required to be arranged in the second predefined pattern. Rather, any layout is possible for the plurality of continuous gate structures 304, so long as no continuous gate structures of the plurality of continuous gate structures 304 are disposed in the second section 106, the third section 402, and/or the fourth section 404.

Figure 5A:
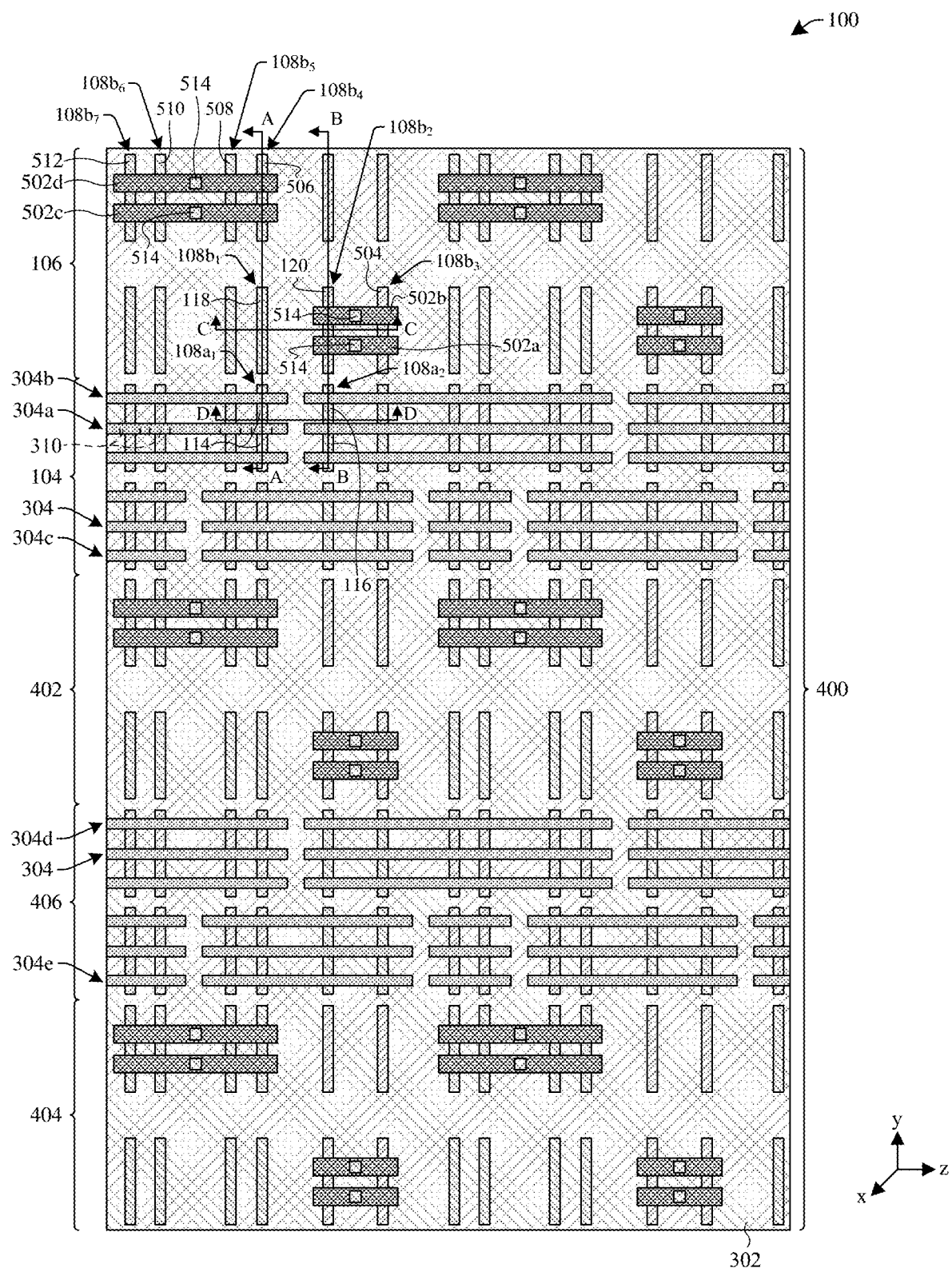
FIGS. 5A-5E illustrate various views of some other embodiments of the IC of FIG. 3.
Figure 5B:
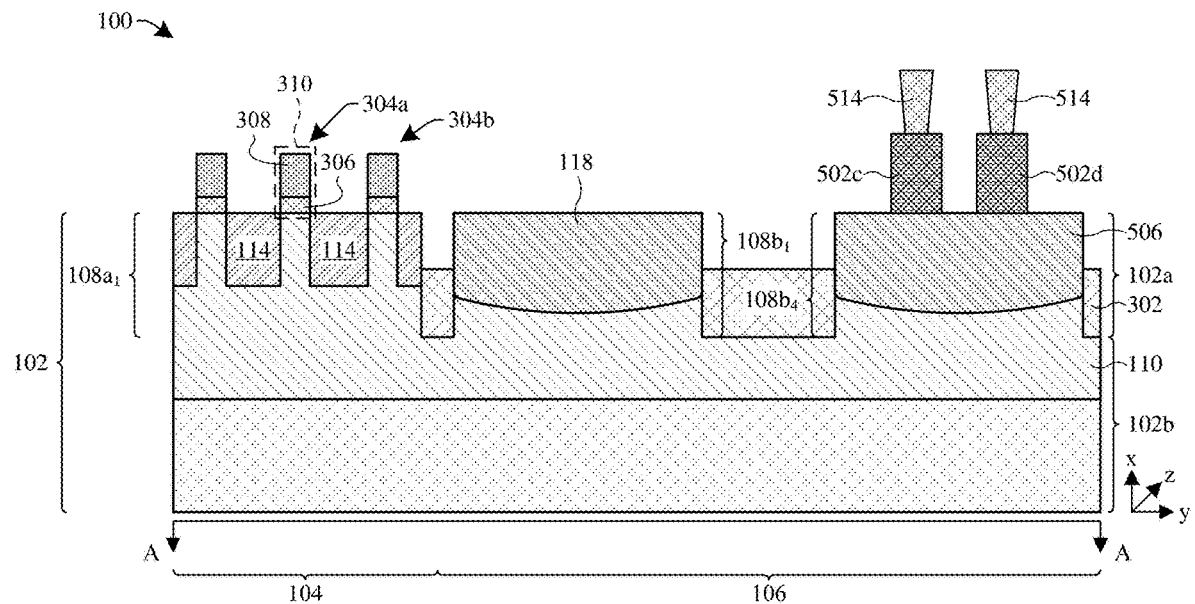
Figure 5C:
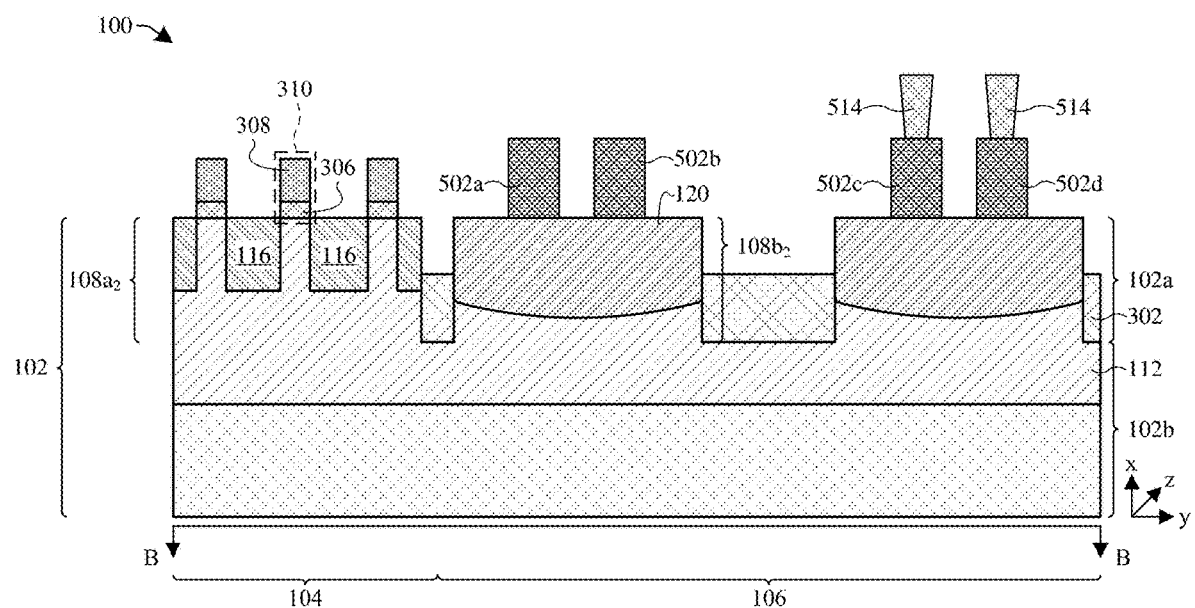
Figure 5D:
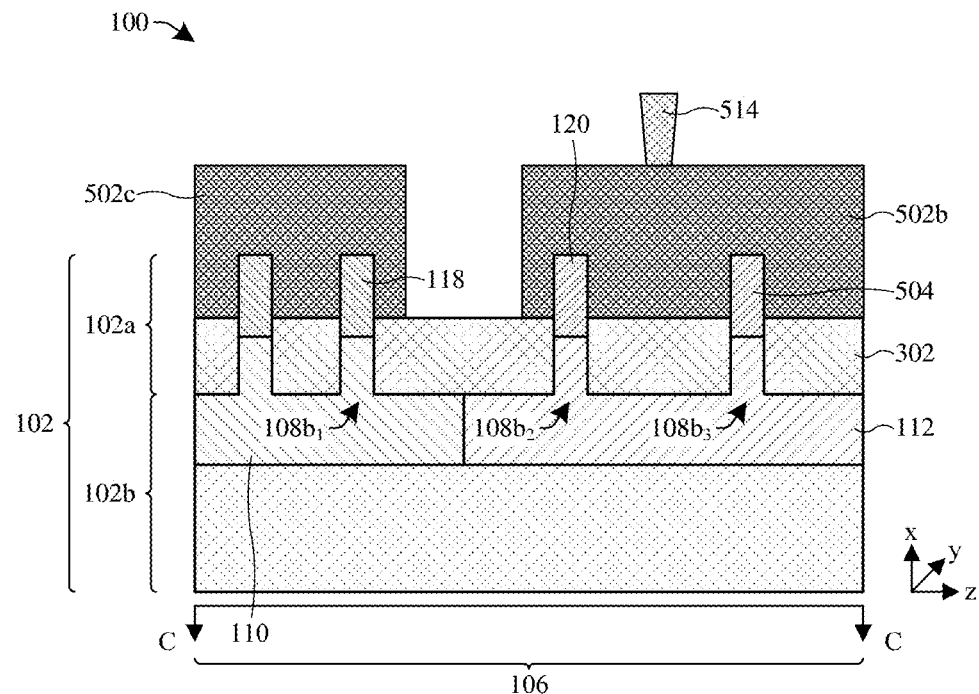
Figure 5E:
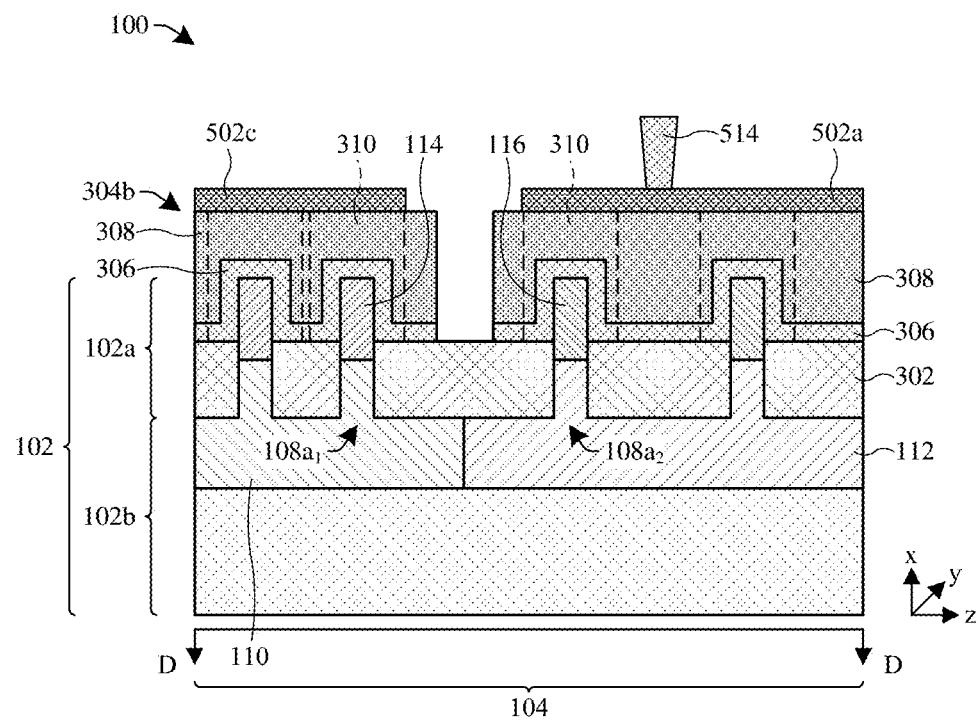

FIGS. 5A-5E illustrate various views of some other embodiments of the IC 100 of FIG. 3. FIG. 5A illustrates a layout view of some other embodiments of the IC of FIG. 3. FIG. 5B illustrates a cross-sectional view of some embodiments of the IC of FIG. 5A taken along line A-A of FIG. 5A. FIG. 5C illustrates a cross-sectional view of some embodiments of the IC of FIG. 5A taken along line B-B of FIG. 5A. FIG. 5D illustrates a cross-sectional view of some embodiments of the IC of FIG. 5A taken along line C-C of FIG. 5A. FIG. 5E illustrates a cross-sectional view of some embodiments of the IC of FIG. 5A taken along line D-D of FIG. 5A.

As shown in FIGS. 5A-5E, the IC 100 comprises a fifth fin 108b$_3$, a sixth fin 108b$_4$, a seventh fin 108b$_5$, an eighth fin 108b$_6$, and a ninth fin 108b$_7$. The fifth fin 108b$_3$ is disposed on a first side of the fourth fin 108b$_2$ and neighbors the fourth fin 108b$_2$. The fifth fin 108b$_3$ is one of the fourth plurality of fins. A third pick-up region 504 is disposed on/in the fifth fin 108b$_3$. The third pick-up region 504 is one of the second plurality of pick-up regions. In some embodiments, the fifth fin 108b$_3$ is laterally spaced (in the "z" direction) a first distance from the fourth fin 108b$_2$.

The sixth fin 108b$_4$ is disposed on a second side of the fourth fin 108b$_2$ opposite the first side. The sixth fin 108b$_4$ is one of the third plurality of fins. A fourth pick-up region 506 is disposed on/in the sixth fin 108b$_4$. The fourth pick-up region 506 is one of the first plurality of pick-up regions. The sixth fin 108b$_4$ is laterally spaced (in the "y" direction) from the fourth fin 108b$_2$. In some embodiments, the sixth fin 108b$_4$ is laterally spaced (in the "z" direction) from the fourth fin 108b$_2$ by a second distance that is greater than the first distance.

The seventh fin 108b$_5$ is disposed on a side of the sixth fin 108b$_4$, such that the sixth fin 108b$_4$ is disposed between the fifth fin 108b$_3$ and the seventh fin 108b$_5$. The seventh fin 108b$_5$ is one of the third plurality of fins. A fifth pick-up region 508 is disposed on/in the seventh fin 108b$_5$. The fifth pick-up region 508 is one of the first plurality of pick-up regions. In some embodiments, the seventh fin 108b$_5$ is laterally spaced (in the "z" direction) from the sixth fin 108b$_4$ by a third distance that is less than the first distance.

The eighth fin 108b$_6$ is disposed on a side of the seventh fin 108b$_5$, such that the seventh fin 108b$_5$ is disposed between the sixth fin 108b$_4$ and the eighth fin 108b$_6$. The eighth fin 108b$_6$ is one of the third plurality of fins. A sixth pick-up region 510 is disposed on/in the eighth fin 108b$_6$. The sixth pick-up region 510 is one of the first plurality of pick-up regions. In some embodiments, the eighth fin 108b$_6$ is laterally spaced (in the "z" direction) from the seventh fin 108b$_5$ by a fourth distance that is greater than the second distance.

The ninth fin 108b$_7$ is disposed on a side of the eighth fin 108b$_6$, such that the eighth fin 108b$_6$ is disposed between the seventh fin 108b$_5$ and the ninth fin 108b$_7$. The ninth fin 108b$_7$ is one of the third plurality of fins. A seventh pick-up region 512 is disposed on/in the ninth fin 108b$_7$. The seventh pick-up region 512 is one of the first plurality of pick-up regions. In some embodiments, the ninth fin 108b$_7$ is laterally spaced (in the "z" direction) from the eighth fin 108b$_6$ by the third distance.

In some embodiments, the third fin 108b$_1$, the fourth fin 108b$_2$, and the fifth fin 108b$_3$ are disposed in a first row. In further embodiments, the sixth fin 108b$_4$, the seventh fin 108b$_5$, the eighth fin 108b$_6$, and the ninth fin 108b$_7$ are disposed in a second row that is laterally spaced (in the "y" direction) from the first row. The first row may be laterally spaced from the second row (in the "y" direction) a fifth distance that is between the first distance and the second distance.

A first plurality of conductive contacts 502 (e.g., metal contacts) are disposed over the isolation structure 302 and over the fins 108. For example, a first conductive contact 502a, a second conductive contact 502b, a third conductive contact 502c, and a fourth conductive contact 502d are disposed over the isolation structure 302 and over the fins 108. In some embodiments, the first plurality of conductive contacts 502 may comprise, for example, tungsten (W), aluminum (Al), copper (Cu), or the like. In further embodiments, the conductive contacts of the first plurality of conductive contacts 502 may have upper surfaces disposed over upper surfaces of the continuous gate structures of the plurality of continuous gate structures 304. In yet further embodiments, the upper surfaces of the conductive contacts of the first plurality of conductive contacts 502 may be substantially planar.

The conductive contacts of the first plurality of conductive contacts 502 are electrically coupled to one or more pick-up regions. For example, the first conductive contact 502a is electrically coupled to both the second pick-up region 120 and the third pick-up region 504. In some embodiments, the first conductive contact 502a extends laterally (in the "z" direction) across the isolation structure 302 and contacts both the second pick-up region 120 and the third pick-up region 504. In further embodiments, the first conductive contact 502a extends laterally (in the "z" direction) across the isolation structure 302 and engages three sides of the fourth fin 108b$_2$ and three sides of the fifth fin 108b$_3$.

The second conductive contact 502b is electrically coupled to both the second pick-up region 120 and the third pick-up region 504. In some embodiments, the second conductive contact 502b extends laterally (in the "z" direction) across the isolation structure 302 and contacts both the second pick-up region 120 and the third pick-up region 504. In further embodiments, the second conductive contact 502b extends laterally (in the "z" direction) across the isolation structure 302 and engages three sides of the fourth fin 108b$_2$ and three sides of the fifth fin 108b$_3$.

The third conductive contact 502c is electrically coupled to the fourth pick-up region 506, the fifth pick-up region 508, the sixth pick-up region 510, and the seventh pick-up region 512. In some embodiments, the third conductive contact 502c extends laterally (in the "z" direction) across the isolation structure 302 and contacts the fourth pick-up region 506, the fifth pick-up region 508, the sixth pick-up region 510, and the seventh pick-up region 512. In further embodiments, the third conductive contact 502c extends laterally (in the "z" direction) across the isolation structure 302 and engages three sides of the sixth fin 108b$_4$, the seventh fin 108b$_5$, the eighth fin 108b$_6$, and the ninth fin 108b$_7$.

The fourth conductive contact 502d is electrically coupled to the fourth pick-up region 506, the fifth pick-up region 508, the sixth pick-up region 510, and the seventh pick-up region 512. In some embodiments, the fourth conductive contact 502d extends laterally (in the "z" direction) across the isolation structure 302 and contacts the fourth pick-up region 506, the fifth pick-up region 508, the sixth pick-up region 510, and the seventh pick-up region 512. In further embodiments, the fourth conductive contact 502d extends laterally (in the "z" direction) across the isolation structure 302 and engages three sides of the sixth fin 108b$_4$, the seventh fin 108b$_5$, the eighth fin 108b$_6$, and the ninth fin 108b$_7$.

A first plurality of conductive vias 514 (e.g., metal vias) are disposed over the fins 108 and the first plurality of conductive contacts 502. The conductive vias of the first plurality of conductive vias 514 are electrically coupled to one or more of the conductive contacts of the first plurality of conductive contacts 502. The conductive vias of the first plurality of conductive vias 514 extend vertically (in the "x" direction) over the plurality of conductive contacts 502. In some embodiments, the conductive vias of the first plurality of conductive vias 514 may extend vertically from the first plurality of conductive contacts 502 at a location disposed between two neighboring fins. For example, one of the conductive contacts of the first plurality of conductive contacts 502 is disposed between fourth fin 108$b_2$ and the fifth fin 108$b_3$. In further embodiments, the first plurality of conductive vias 514 may comprise, for example, W, Cu, Al, or the like.

Figure 6A:
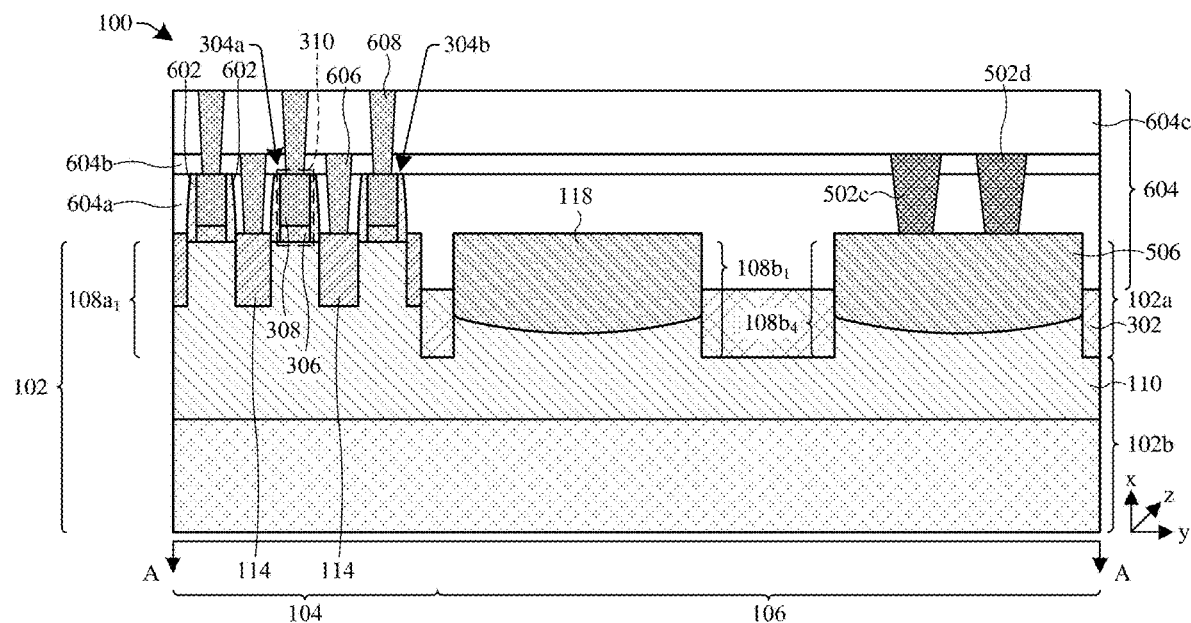
FIGS. 6A-6D illustrate various cross-sectional views of some other embodiments of the IC of FIGS. 5A-5E.
Figure 6B:
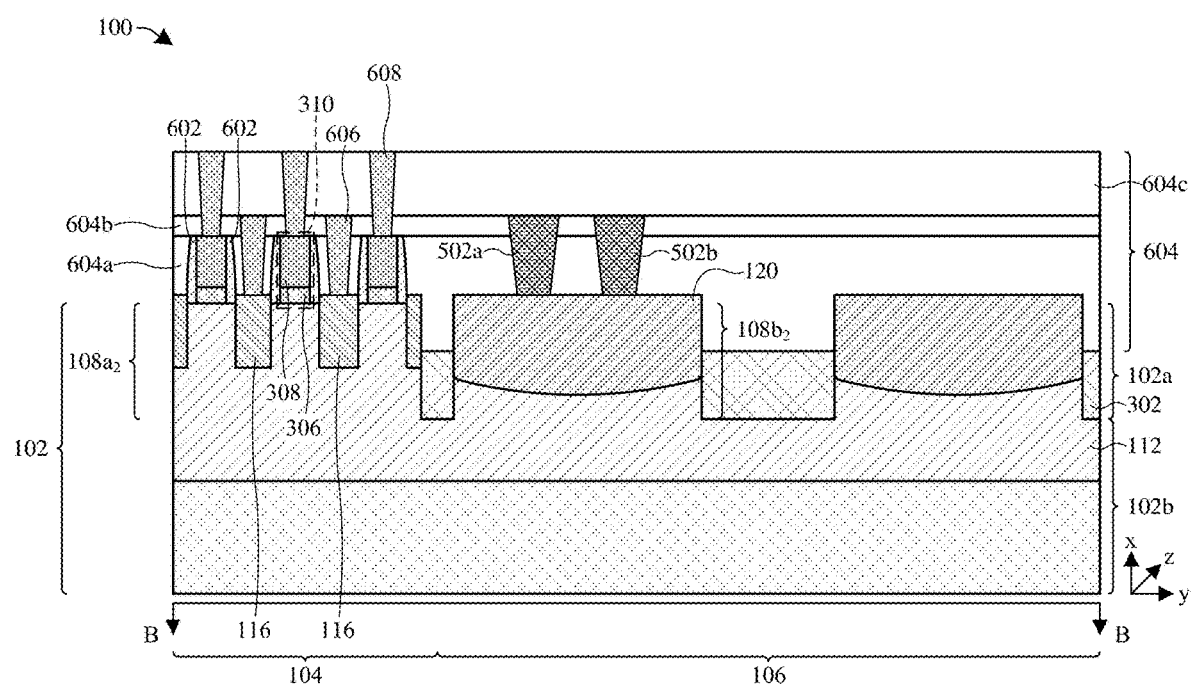
Figure 6C:
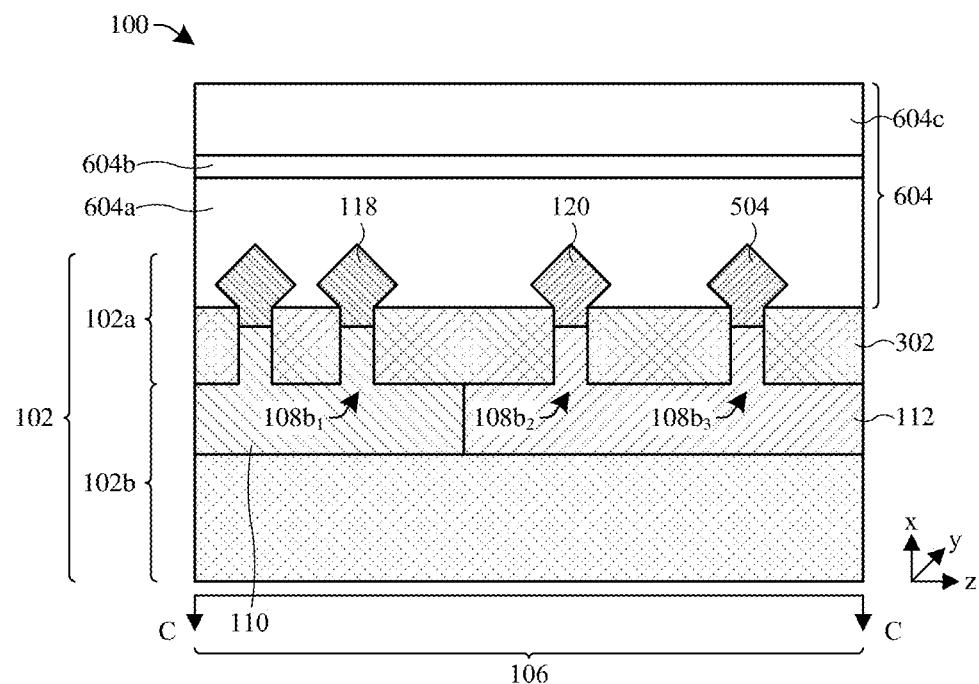
Figure 6D:
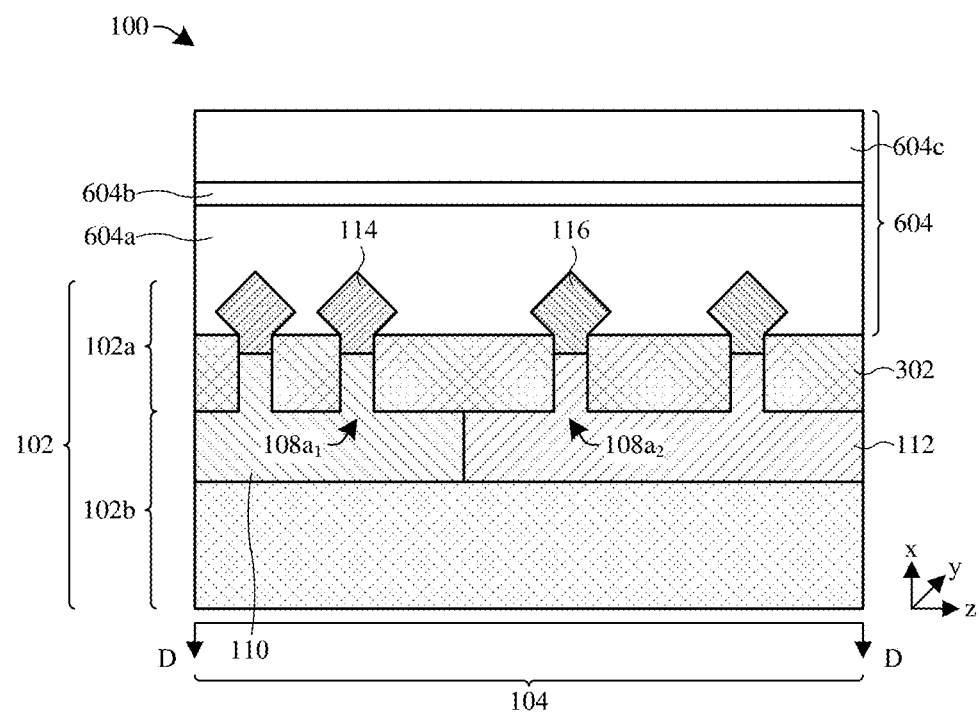

FIGS. 6A-6D illustrate various cross-sectional views of some other embodiments of the IC 100 of FIGS. 5A-5E. FIG. 6A illustrates a cross-sectional view of some other embodiments of the IC of FIG. 5A taken along line A-A of FIG. 5A. FIG. 6B illustrates a cross-sectional view of some other embodiments of the IC of FIG. 5A taken along line B-B of FIG. 5A. FIG. 6C illustrates a cross-sectional view of some other embodiments of the IC of FIG. 5A taken along line C-C of FIG. 5A. FIG. 6D illustrates a cross-sectional view of some other embodiments of the IC of FIG. 5A taken along line D-D of FIG. 5A.

As shown in FIGS. 6A-6D, the first source/drain regions 114 and/or the second source/drain regions 116 may have a diamond-shaped profile. In such embodiments, the first source/drain regions 114 and the second source/drain regions 116 may be epitaxial structures (e.g., epitaxial Si, epitaxial SiGe, epitaxial SiC, or the like). In further embodiments, the first pick-up region 118 and the second pick-up region 120 may have the diamond-shaped profile.

In some embodiments, sidewall spacers 602 are disposed over the semiconductor substrate 102 and on sides of the plurality of continuous gate structures 304. The sidewall spacers 602 may comprise, for example, an oxide (e.g., $SiO_2$), a nitride (e.g., SiN), an oxy-nitride ($SiO_XN_Y$), some other dielectric material, or a combination of the foregoing. The sidewall spacers 602 may be multi-layered structures, for example, comprising one or more sidewall spacer layers. The first source/drain regions 114 and/or the second source/drain regions 116 may contact one or more of the sidewall spacers 602. In yet further embodiments, the first source/drain regions 114 and/or the second source/drain regions 116 may extend vertically above an uppermost surface of the upper region 102$a$ of the semiconductor substrate 102.

An interlayer dielectric (ILD) structure 604 is disposed over the various structures discussed above (e.g., the semiconductor substrate 102, the first doped region 110, the second doped region 112, the fins 108, the plurality of continuous gate structures 304, the gate structures 310, the isolation structure 302, the first source/drain regions 114, the second source/drain regions 116, the first pick-up region 118, and the second pick-up region 120). The ILD structure 604 comprises one or more stacked ILD layers, which may respectively comprise a low-k dielectric (e.g., a dielectric material with a dielectric constant less than about 3.9), an oxide (e.g., ($SiO_2$), or the like. In some embodiments, the ILD structure 604 comprises a first ILD layer 604$a$, a second ILD layer 604$b$, and a third ILD layer 604$c$. In further embodiments, the first ILD layer 604$a$ may have an upper surface that is substantially co-planar with an upper surface of the continuous gate electrode structure 308 and/or upper surfaces of the sidewall spacers 602. The second ILD layer 604$b$ is disposed over the first ILD layer 604$a$, the plurality of continuous gate structures 304, and the sidewall spacers 602. The third ILD layer 604$c$ is disposed over the second ILD layer 604$b$.

A second plurality of conductive contacts 606 is disposed over the semiconductor substrate 102, in the first ILD layer 604$a$, and in the second ILD layer 604$b$. The second plurality of conductive contacts 606 extend above the semiconductor substrate 102 and vertically through both the first ILD layer 604$a$ and the second ILD layer 604$b$. In some embodiments, the conductive contacts of the second plurality of conductive contacts 606 are electrically coupled to the first source/drain regions 114 or the second source/drain regions 116. In further embodiments, upper surfaces of the conductive contacts of the second plurality of conductive contacts 606 may be substantially co-planar with an upper surface of the second ILD layer 604$b$. In yet further embodiments, the second plurality of conductive contacts 606 may comprise, for example, W, Al, Cu, or the like.

A third plurality of conductive contacts 608 is disposed over the continuous gate structures of the plurality of continuous gate structures 304, in the third ILD layer 604$c$, and in the second ILD layer 604$b$. The conductive contacts of the third plurality of conductive contacts 608 are electrically coupled to the continuous gate electrode structures of the plurality of continuous gate structures 304. In some embodiments, upper surfaces of the conductive contacts of the third plurality of conductive contacts 608 may be substantially co-planar with an upper surface of the third ILD layer 604$c$. In further embodiments, the third plurality of conductive contacts 608 may comprise, for example, W, Al, Cu, or the like.

In some embodiments, the upper surfaces of the conductive contacts of the first plurality of conductive contacts 502 may be substantially co-planar with the upper surface of the second ILD layer 604$b$. It will be appreciated that any number of additional ILD structures may be disposed over the third ILD layer 604$c$ and any number of other conductive features (e.g., metal lines, metal vias, etc.) may be disposed in the additional ILD structures. It will further be appreciated that the other conductive features may be electrically coupled to the first plurality of conductive contacts 502, the second plurality of conductive contacts 606, and/or the third plurality of conductive contacts 608 to form an interconnect structure (e.g., copper interconnect) that electrically couples various semiconductor devices of the IC 100 together in a predefined manner.

Figure 7:
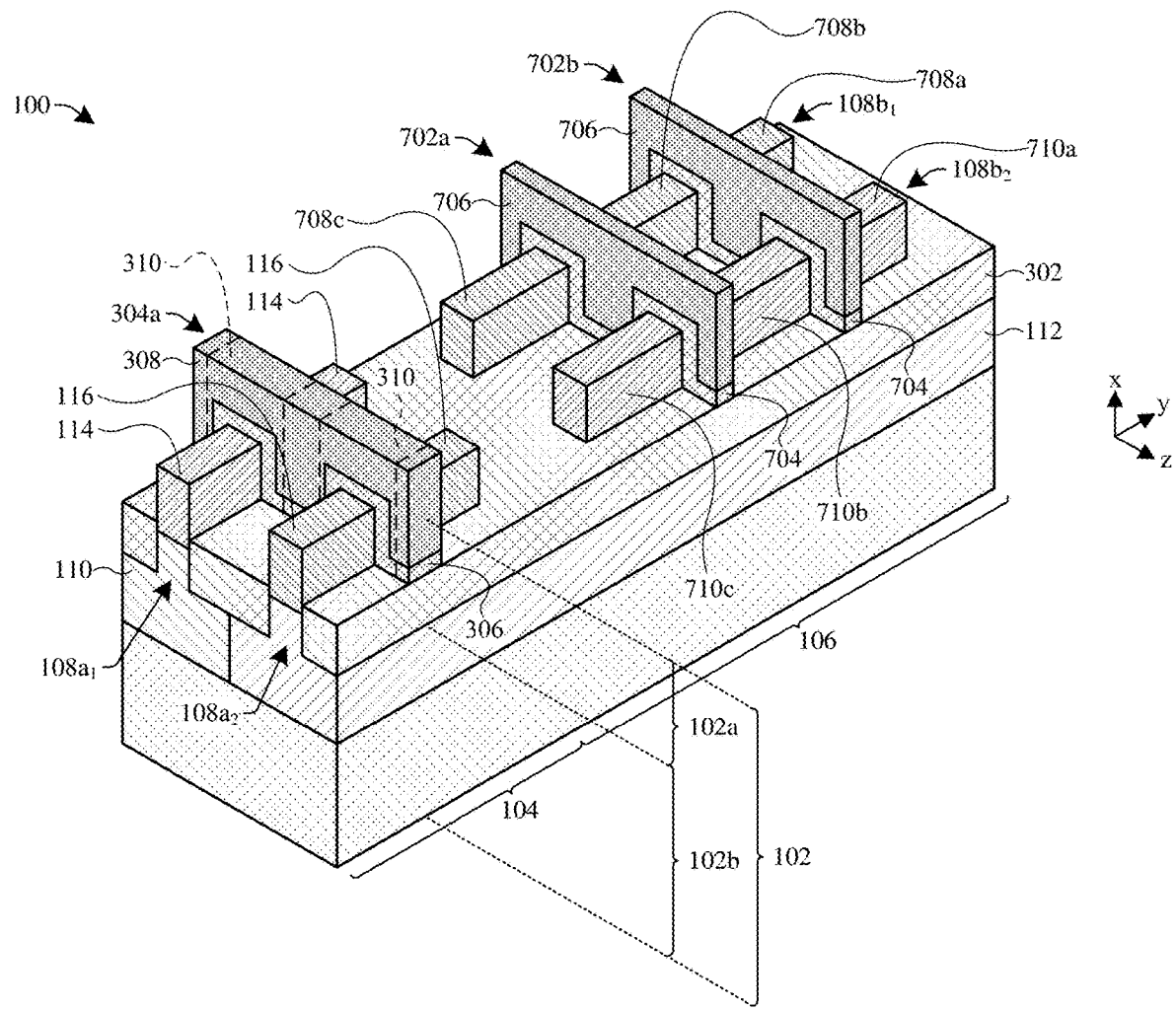
FIG. 7 illustrates an isometric view of some other embodiments of the IC of FIG. 1

FIG. 7 illustrates an isometric view of some other embodiments of the IC 100 of FIG. 1

As shown in FIG. 7, a plurality of pick-up gate structures 702 are disposed in the second section 106. The pick-up gate structures 702 are disposed over the isolation structure 302 and over the fins 108. The pick-up gate structures 702 engage one or more of the fins 108 of the second set of fins 108$b$. For example, a first pick-up gate structure 702$a$ engages three sides of the third fin 108$b_1$, and a second pick-up gate structure 702$b$ engages three sides of the fourth fin 108$b_2$.

In some embodiments, the pick-up gate structures 702 extend continuously (in the "z" direction) across the isolation structure 302 and engage multiple fins 108 of the second set of fins 108$b$. For example, the first pick-up gate structure 702$a$ extends across the isolation structure 302 (in the "z" direction) and engages three sides of the third fin 108$b_1$ and three sides of the fourth fin 108$b_2$. In such embodiments, the pick-up gate structures 702 may be referred to as continuous pick-up gate structures. Each of the pick-up gate structures 702 comprise a pick-up gate dielectric material 704 and a pick-up gate electrode material 706 overlying the pick-up gate dielectric material 704.

In some embodiments, the pick-up gate dielectric material 704 comprises an oxide (e.g., $SiO_2$), a high-k dielectric (e.g., a dielectric material with a dielectric constant greater than 3.9), some other dielectric material, or a combination of the foregoing. The pick-up gate dielectric material 704 may comprise multiple layers, for example, comprising one or more interfacial layers. In further embodiments, the pick-up gate electrode material 706 may comprise, for example, polysilicon, a metal (e.g., W), some other conductive material, or a combination of the foregoing. The pick-up gate electrode material 706 may comprise multiple layers. For example, in some embodiments, the pick-up gate electrode material 706 may comprise a work function metal layer and a metal fill layer. In further embodiments, the pick-up gate dielectric material 704 may be a same material(s) as a material(s) of the continuous gate dielectric structure 306. In yet further embodiments, the pick-up gate electrode material 706 may be a same material(s) as a material(s) of the continuous gate electrode structure 308.

A third plurality of pick-up regions 708 is disposed on/in the third fin $108b_1$. The pick-up regions of the third plurality of pick-up regions 708 are laterally spaced from one another (in the "y" direction). The pick-up regions of the third plurality of pick-up regions 708 comprise substantially similar features (e.g., structural features, doping type, etc.) as the first pick-up region 118. For example, the pick-up regions of the third plurality of pick-up regions 708 are electrically coupled to the third fin $108b_1$. However, rather than extending continuously from the first outermost sidewall of the third fin $108b_1$ to the second outermost sidewall the third fin $108b_1$, the pick-up regions of the third plurality of pick-up regions 708 extend partially (in the "y" direction) between the first outermost sidewall and the second outermost sidewall.

The pick-up gate structures 702 extend (in the "z" direction) between two neighboring pick-up regions of the third plurality of pick-up regions 708. For example, an eighth pick-up region 708a neighbors a ninth pick-up region 708b, and the second pick-up gate structure 702b extends (in the "z" direction) between the eighth pick-up region 708a and the ninth pick-up region 708b. Further, a tenth pick-up region 708c neighbors the ninth pick-up region 708b, and the first pick-up gate structure 702a extends (in the "z" direction) between the ninth pick-up region 708b and the tenth pick-up region 708c.

A fourth plurality of pick-up regions 710 is disposed on/in the fourth fin $108b_2$. The pick-up regions of the fourth plurality of pick-up regions 710 are laterally spaced from one another (in the "y" direction). The pick-up regions of the fourth plurality of pick-up regions 710 comprise substantially similar features (e.g., structural features, doping type, etc.) as the second pick-up region 120. For example, the pick-up regions of the fourth plurality of pick-up regions 710 are electrically coupled to the fourth fin $108b_2$. However, rather than extending continuously from the fifth outermost sidewall of the fourth fin $108b_2$ to the sixth outermost sidewall the fourth fin $108b_2$, the pick-up regions of the fourth plurality of pick-up regions 710 extend partially (in the "y" direction) between the fifth outermost sidewall and the sixth outermost sidewall.

The pick-up gate structures 702 extend (in the "z" direction) between two neighboring pick-up regions of the fourth plurality of pick-up regions 710. For example, an eleventh pick-up region 710a neighbors a twelfth pick-up region 710b, and the second pick-up gate structure 702b extends (in the "z" direction) between the eleventh pick-up region 710a and the twelfth pick-up region 710b. Further, a thirteenth pick-up region 710c neighbors the twelfth pick-up region 710b, and the first pick-up gate structure 702a extends (in the "z" direction) between the twelfth pick-up region 710b and the thirteenth pick-up region 710c.

Figure 8A:
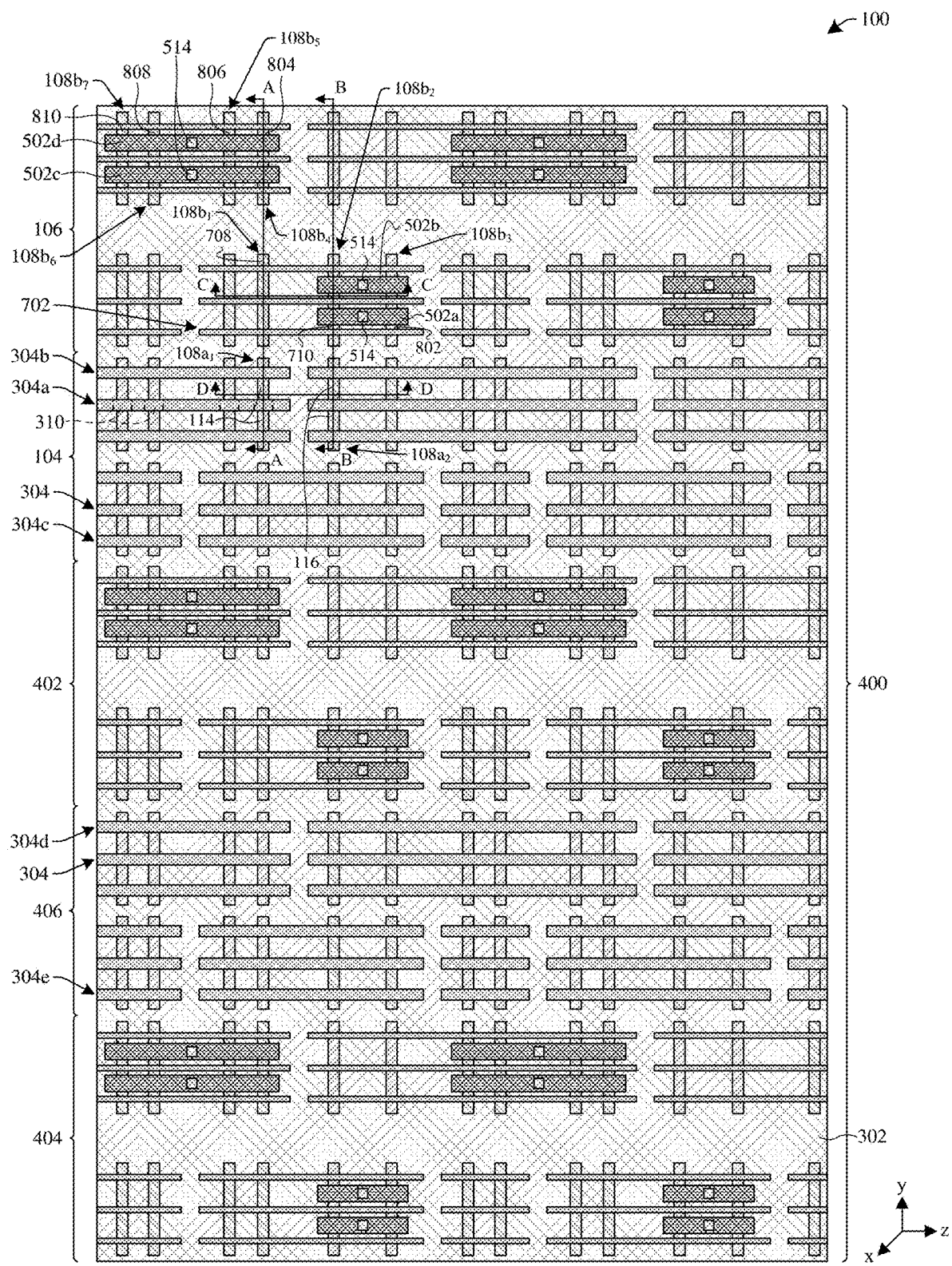
FIGS. 8A-8E illustrate various views of some other embodiments of the IC of FIG. 7.
Figure 8B:
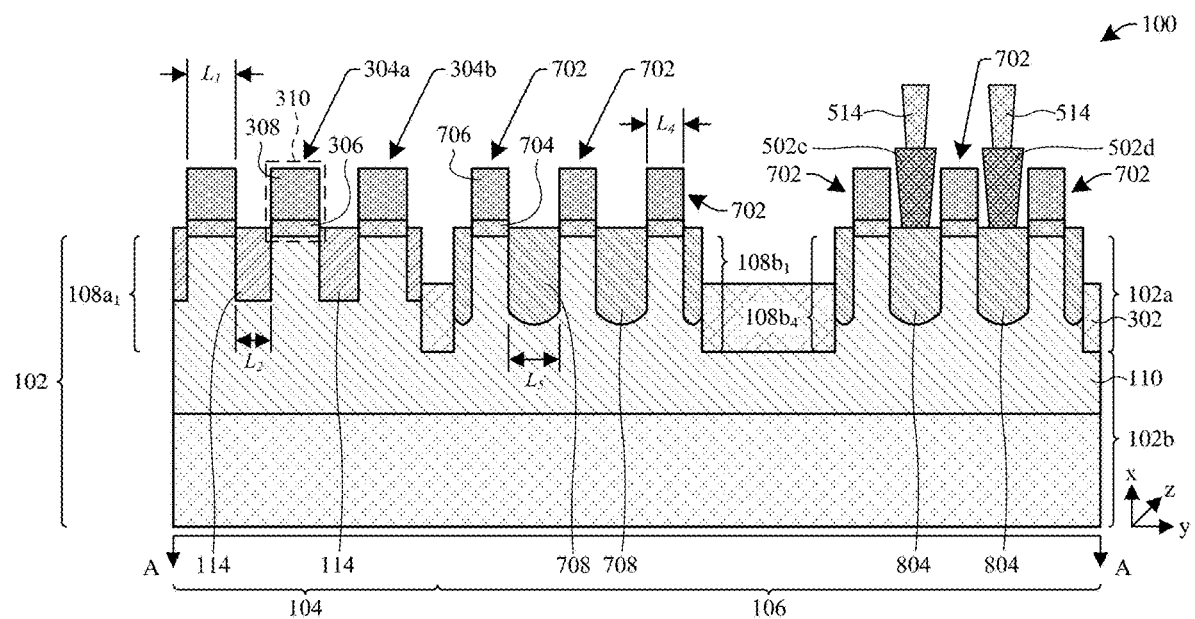
Figure 8C:
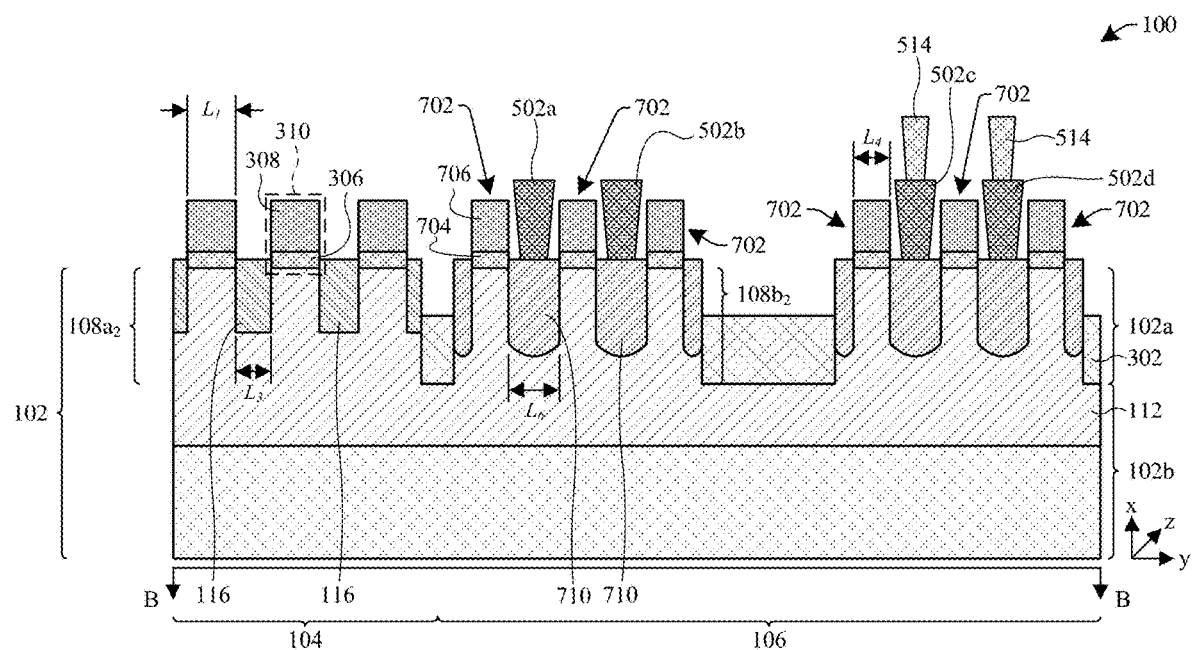
Figure 8D:
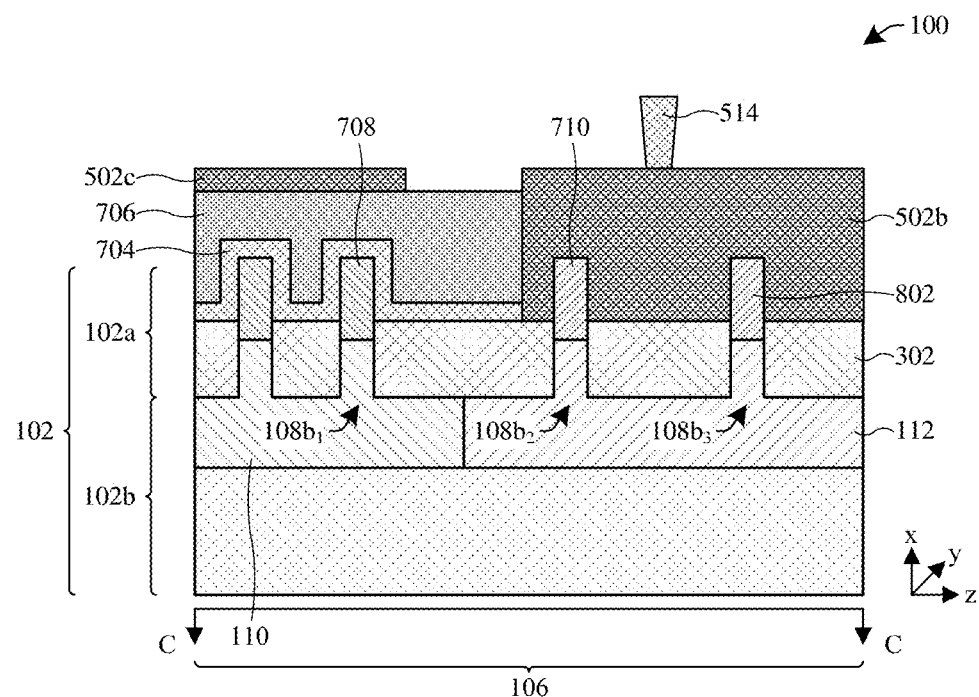
Figure 8E:
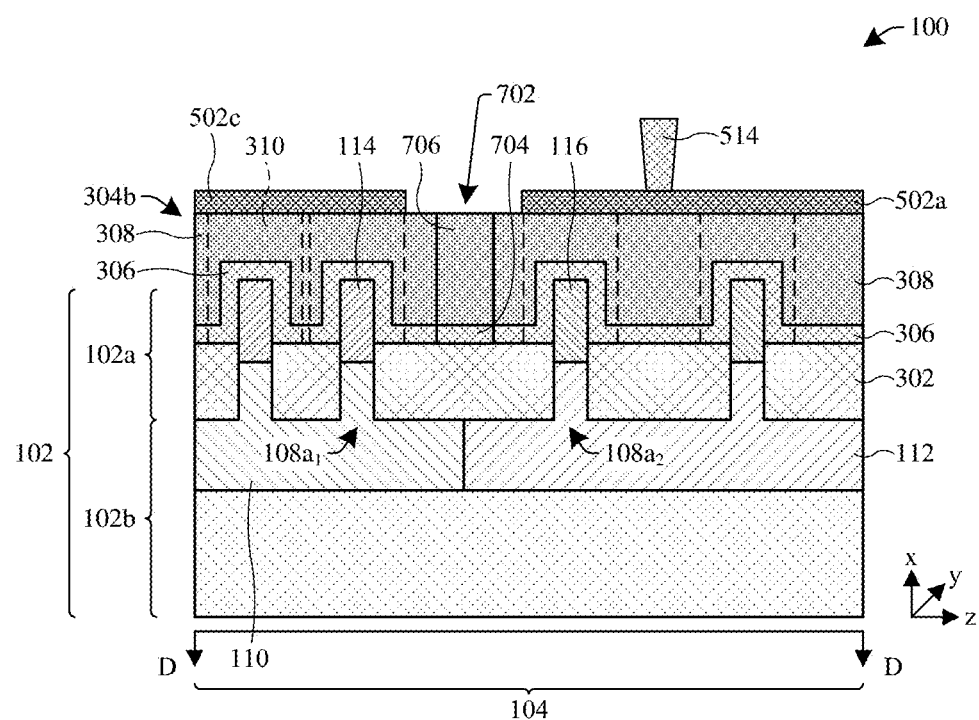

FIGS. 8A-8E illustrate various views of some other embodiments of the IC 100 of FIG. 7. FIG. 8A illustrates a layout view of some other embodiments of the IC of FIG. 7. FIG. 8B illustrates a cross-sectional view of some embodiments of the IC of FIG. 8A taken along line A-A of FIG. 8A. FIG. 8C illustrates a cross-sectional view of some embodiments of the IC of FIG. 8A taken along line B-B of FIG. 8A. FIG. 8D illustrates a cross-sectional view of some embodiments of the IC of FIG. 8A taken along line C-C of FIG. 8A. FIG. 8E illustrates a cross-sectional view of some embodiments of the IC of FIG. 8A taken along line D-D of FIG. 8A.

As shown in FIGS. 8A-8E, a fifth plurality of pick-up regions 802 is disposed on/in the fifth fin $108b_3$. The pick-up regions of the fifth plurality of pick-up regions 802 comprise substantially similar features as the second pick-up region 120. A sixth plurality of pick-up regions 804 is disposed on/in the sixth fin $108b_4$. A seventh plurality of pick-up regions 806 is disposed on/in the seventh fin $108b_5$. An eighth plurality of pick-up regions 808 is disposed on/in the eighth fin $108b_6$. A ninth plurality of pick-up regions 810 is disposed on/in the ninth fin $108b_7$. The pick-up regions of the sixth plurality of pick-up regions 804, the seventh plurality of pick-up regions 806, the eighth plurality of pick-up regions 808, and the ninth plurality of pick-up regions 810 comprise substantially similar features as the first pick-up region 118.

The conductive contacts of the first plurality of conductive contacts 502 extend laterally in parallel with the pick-up gate structures 702. In some embodiments, the pick-up gate structures 702 and the conductive contacts of the first plurality of conductive contacts 502 may be alternatingly disposed across a given fin (in the "y" direction). For example, a third pick-up gate, a fourth pick-up gate, and a fifth pick-up gate engage the sixth fin $108b_4$, and the third conductive contact 502c separates the third pick-up gate from the fourth pick-up gate and the fourth conductive contact 502d separates the fourth pick-up gate from the fifth pick-up gate.

The continuous gate structures of the plurality of continuous gate structures 304 have a first length $L_1$. The first source/drain regions 114 have a second length $L_2$. In some embodiments, the first source/drain regions 114 extend (in the "y" direction) between neighboring continuous gate structures of the plurality of continuous gate structures 304. In further embodiments, sides of the first source/drain regions 114 may be substantially aligned with sidewalls of the continuous gate structures of the plurality of continuous gate structures 304. The first source/drain regions 114 are spaced apart (in the "y" direction) by a sixth distance.

The second source/drain regions 116 have a third length $L_3$. In some embodiments, the third length is the same as the second length $L_2$. The second source/drain regions 116 may extend (in the "y" direction) between neighboring continuous gate structures of the plurality of continuous gate structures 304. In further embodiments, sides of the second source/drain regions 116 may be substantially aligned with the sidewalls of the continuous gate structures of the plurality of continuous gate structures 304. The second source/drain regions 116 are spaced apart (in the "y" direction) by a seventh distance. In yet further embodiments, the seventh distance may be the same as the sixth distance.

The pick-up gate structures 702 have a fourth length $L_4$. The fourth length $L_4$ is less than the first length $L_1$. In some embodiments, the fourth length $L_4$ may be less than or equal to sixty percent of the first length $L_1$. In further embodiments, a ratio of the first length $L_1$ to the fourth length $L_4$ is 1:0.6. In yet further embodiments, because the ratio of the first length $L_1$ to the fourth length $L_4$ is 1:0.6, the pick-up gate structures 702 may prevent damage to one or more of the continuous gate structures 304 during fabrication of the IC 100 (e.g., damage caused by a planarization process, such as a chemical-mechanical polishing) by acting as dishing prevention structures. It will be appreciated that the pick-up gate structures may have various lengths, each of which is less than the first length $L_1$.

The pick-up regions of the third plurality of pick-up regions 708 have a fifth length $L_5$. The fifth length $L_5$ is greater than the second length $L_2$. In some embodiments, the fifth length $L_5$ is greater than the third length $L_3$. The pick-up regions of the third plurality of pick-up regions 708 may extend (in the "y" direction) between some neighboring pick-up gate structures 702. In further embodiments, sidewalls of the pick-up regions of the third plurality of pick-up regions 708 may be substantially aligned with sidewalls of some of the pick-up gate structures 702. The pick-up regions of the third plurality of pick-up regions 708 are spaced apart (in the "y" direction) by an eighth distance. In yet further embodiments, the eighth distance is less than the sixth distance and/or the seventh distance.

Generally, first typical pick-up regions have an opposite doping type as the first source/drain regions 114 and have the second length $L_2$ (e.g., a same length as the first source/drain regions 114). Because the pick-up regions of the third plurality of pick-up regions 708 have the fifth length $L_5$, resistances of the pick-up regions of the third plurality of pick-up regions 708 may be less than resistances of the first typical pick-up regions (e.g., due to sizes of the pick-up regions of the third plurality of pick-up regions 708 being greater than sizes of the first typical pick-up regions). Therefore, the latch-up trigger voltage of the IC 100 may be improved (e.g., increased) over an IC having the first typical pick-up regions. Accordingly, the IC 100 may have improved latch-up immunity (e.g., due to the improved latch-up trigger voltage preventing malfunction (and/or destruction) of the IC 100). In some embodiments, the third plurality of pick-up regions 708 may have a resistance of about 90,000 ohms (which may be a 50% improvement over the first typical pick-up regions)

The pick-up regions of the fourth plurality of pick-up regions 710 have a sixth length $L_6$. The sixth length $L_6$ is greater than the third length $L_3$. In some embodiments, the sixth length $L_6$ is greater than the second length $L_2$. The pick-up regions of the fourth plurality of pick-up regions 710 may extend (in the "y" direction) between some neighboring pick-up gate structures 702. In further embodiments, sidewalls of the pick-up regions of the fourth plurality of pick-up regions 710 may be substantially aligned with sidewalls of some of the pick-up gate structures 702. The pick-up regions of the fourth plurality of pick-up regions 710 are spaced apart (in the "y" direction) by a ninth distance. In yet further embodiments, the ninth distance is less than the sixth distance and/or the seventh distance. The ninth distance may be the same as the eighth distance.

Generally, second typical pick-up regions have an opposite doping type as the second source/drain regions 116 and have the third length $L_3$ (e.g., a same length as the second source/drain regions 116). Because the pick-up regions of the fourth plurality of pick-up regions 710 have the sixth length $L_6$, resistances of the pick-up regions of the fourth plurality of pick-up regions 710 may be less than resistances of the second typical pick-up regions (e.g., due to sizes of the pick-up regions of the fourth plurality of pick-up regions 710 being greater than sizes of the second typical pick-up regions). Therefore, the latch-up trigger voltage of the IC 100 may be improved over an IC having the second typical pick-up regions. Accordingly, the IC 100 may have improved latch-up immunity. In some embodiments, the fourth plurality of pick-up regions 710 may have a resistance of about 90,000 ohms (which may be a 50% improvement over the second typical pick-up regions).

In some embodiments, the first outermost continuous gate structure 304b is disposed nearer the pick-up gate structures 702 disposed in the second section 106 than any other continuous gate structure of the plurality of continuous gate structures 304. The pick-up regions of the third plurality of pick-up regions 708 and/or the pick-up regions of the fourth plurality of pick-up regions 710 may contact the pick-up gate dielectric material 704 of the pick-up gate structures 702. In further embodiments, the pick-up regions of the third plurality of pick-up regions 708 and/or the pick-up regions of the fourth plurality of pick-up regions 710 may contact the isolation structure 302.

In some embodiments, the first conductive contact 502a extends laterally (in the "z" direction) across the isolation structure 302 and contacts one of the fourth plurality of pick-up regions 710 and one of the fifth plurality of pick-up regions 802. The second conductive contact 502b may extend laterally (in the "z" direction) across the isolation structure 302 and contact another one of the fourth plurality of pick-up regions 710 and another one of the fifth plurality of pick-up regions 802. In further embodiments, the third conductive contact 502c extends laterally (in the "z" direction) across the isolation structure 302 and contacts one of the sixth plurality of pick-up regions 804, one of the seventh plurality of pick-up regions 806, one of the eighth plurality of pick-up regions 808, and one of the ninth plurality of pick-up regions 810. In yet further embodiments, the fourth conductive contact 502d extends laterally (in the "z" direction) across the isolation structure 302 and contacts another one of the plurality of sixth pick-up regions 804, another one of the seventh plurality of pick-up regions 806, another one of the eighth plurality of pick-up regions 808, and another one of the ninth plurality of pick-up regions 810.

Figure 9A:
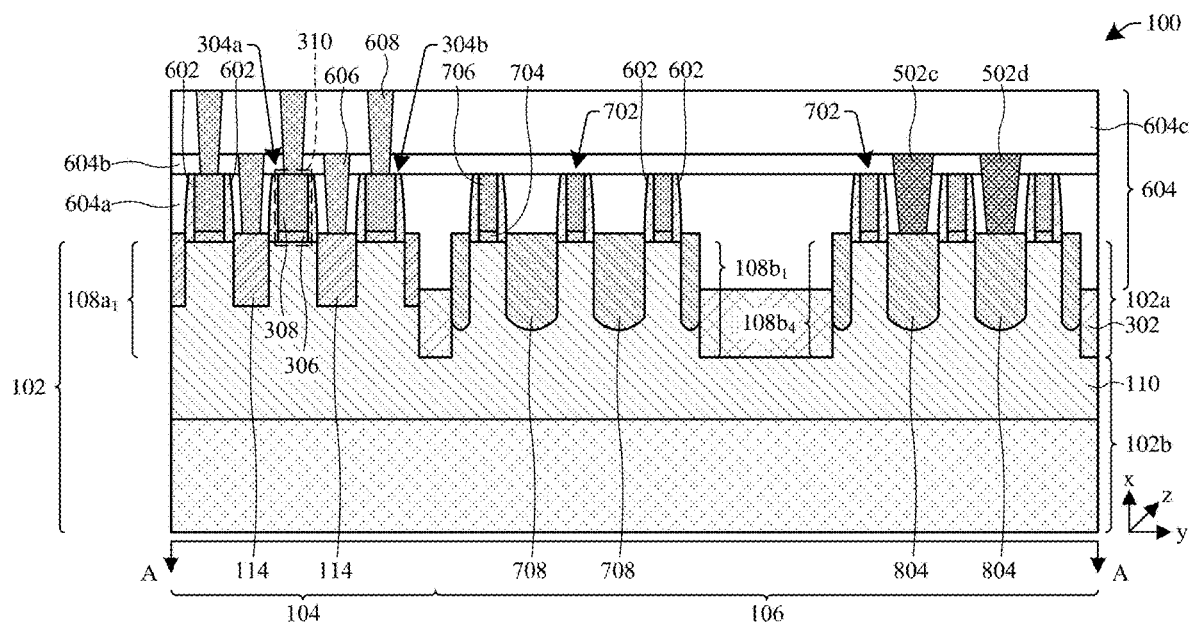
FIGS. 9A-9D illustrate various cross-sectional views of some other embodiments of the IC of FIGS. 8A-8E.
Figure 9B:
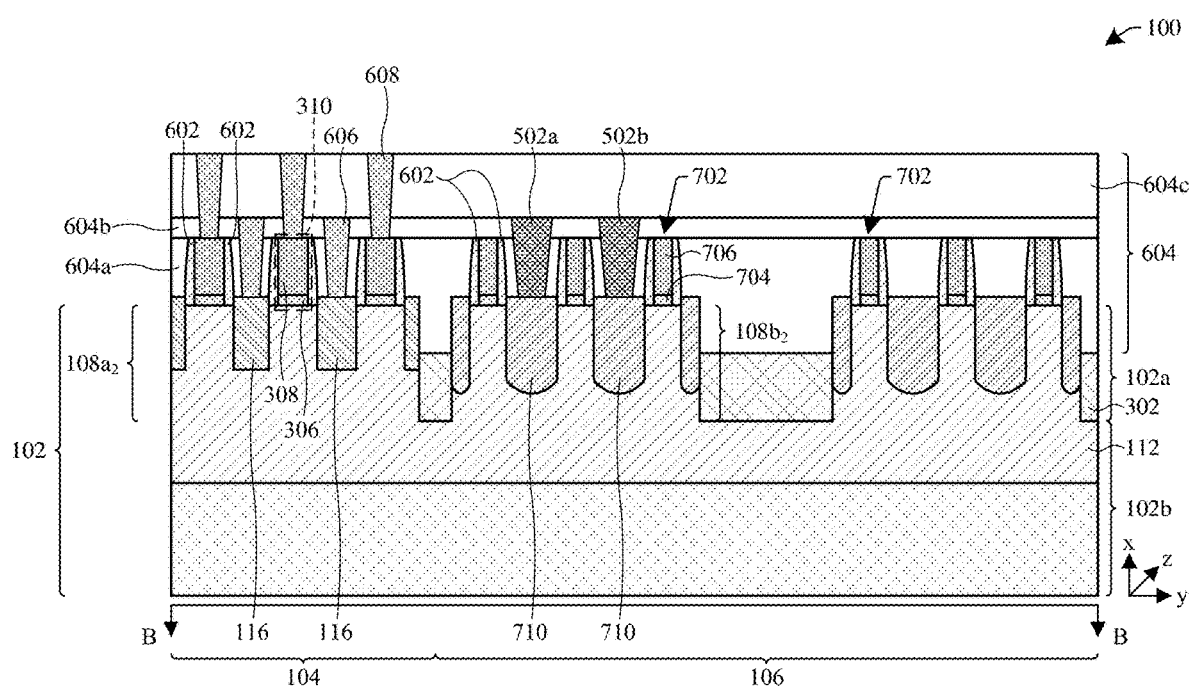
Figure 9C:
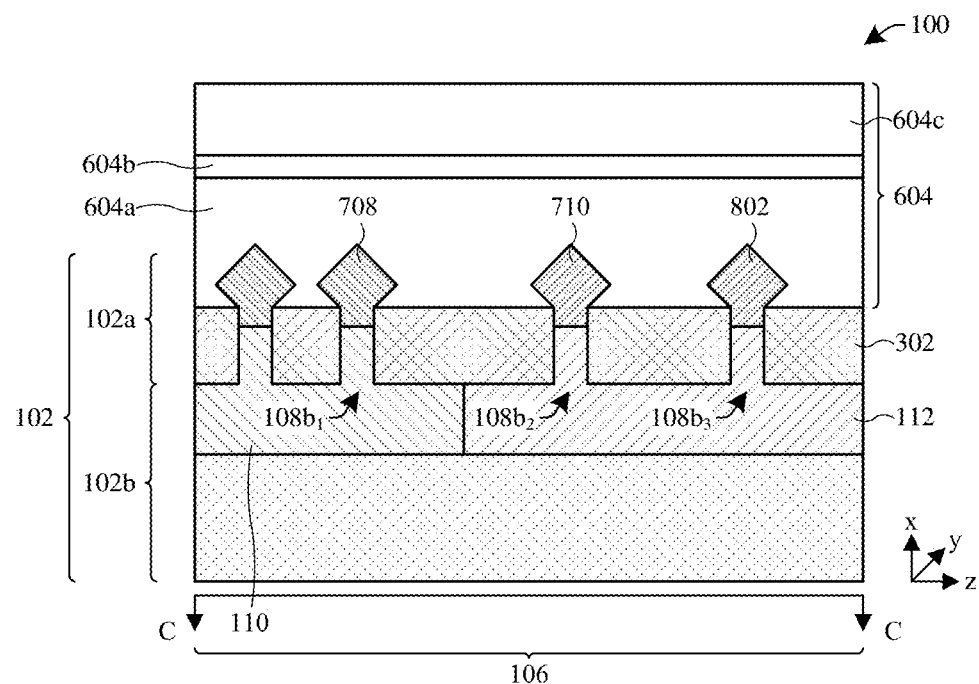
Figure 9D:
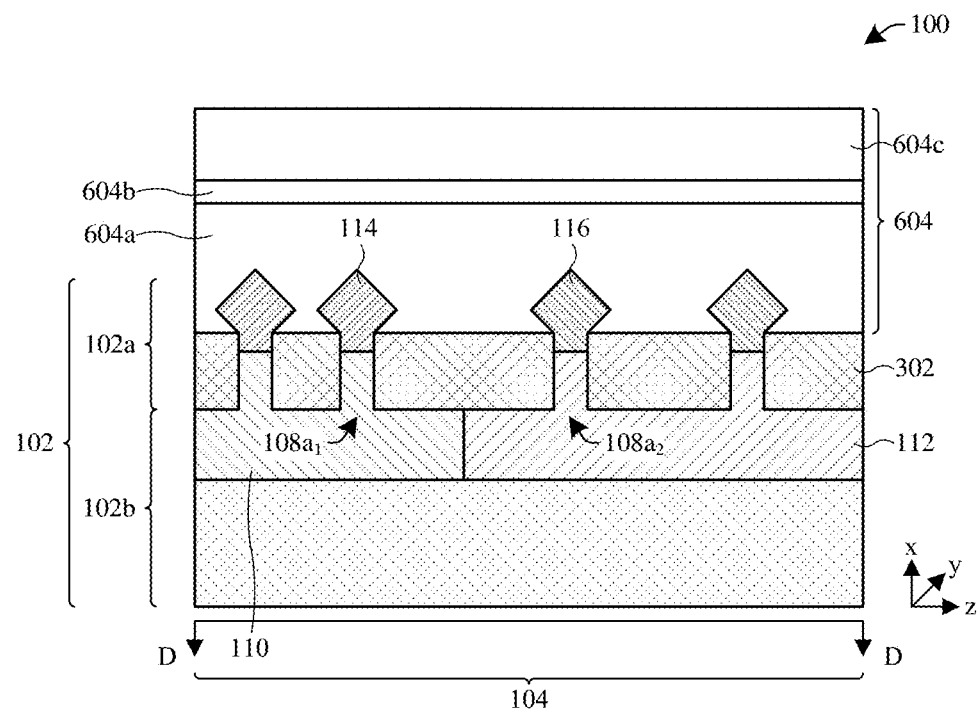

FIGS. 9A-9D illustrate various cross-sectional views of some other embodiments of the IC 100 of FIGS. 8A-8E. FIG. 9A illustrates a cross-sectional view of some other embodiments of the IC of FIG. 8A taken along line A-A of FIG. 8A. FIG. 9B illustrates a cross-sectional view of some other embodiments of the IC of FIG. 8A taken along line B-B of FIG. 8A. FIG. 9C illustrates a cross-sectional view of some other embodiments of the IC of FIG. 8A taken along line C-C of FIG. 8A. FIG. 9D illustrates a cross-sectional view of some other embodiments of the IC of FIG. 8A taken along line D-D of FIG. 8A.

As shown in FIGS. 9A-9D, the sidewall spacers 602 are disposed on sides of the pick-up gate structures 702. The sidewall spacers 602 disposed on the sides of the pick-up gate structures 702 may continuously extend (in the "z" direction) along the pick-up gate structures 702. In some embodiments, a length in which the sidewall spacers 602 extend laterally from the pick-up gate structures 702 may be substantially the same as a length in which the sidewall spacers 602 extend laterally from the continuous gate structures 304.

The ILD structure 604 is disposed over the pick-up gate structures 702. In some embodiments, no conductive contacts are electrically coupled to the pick-up gate structures 702 (e.g., none of the third plurality of conductive contacts 608). In such embodiments, the ILD structure 604 may completely cover the upper surfaces of the pick-up gate structures 702. In other embodiments, one or more conductive contacts may be electrically coupled to the pick-up gate structures 702 (e.g., one or more of the third plurality of conductive contacts 608). In further embodiments, the third plurality of pick-up regions 708 and/or the fourth plurality of pick-up regions may have the diamond-shaped profile.

Figure 10A:
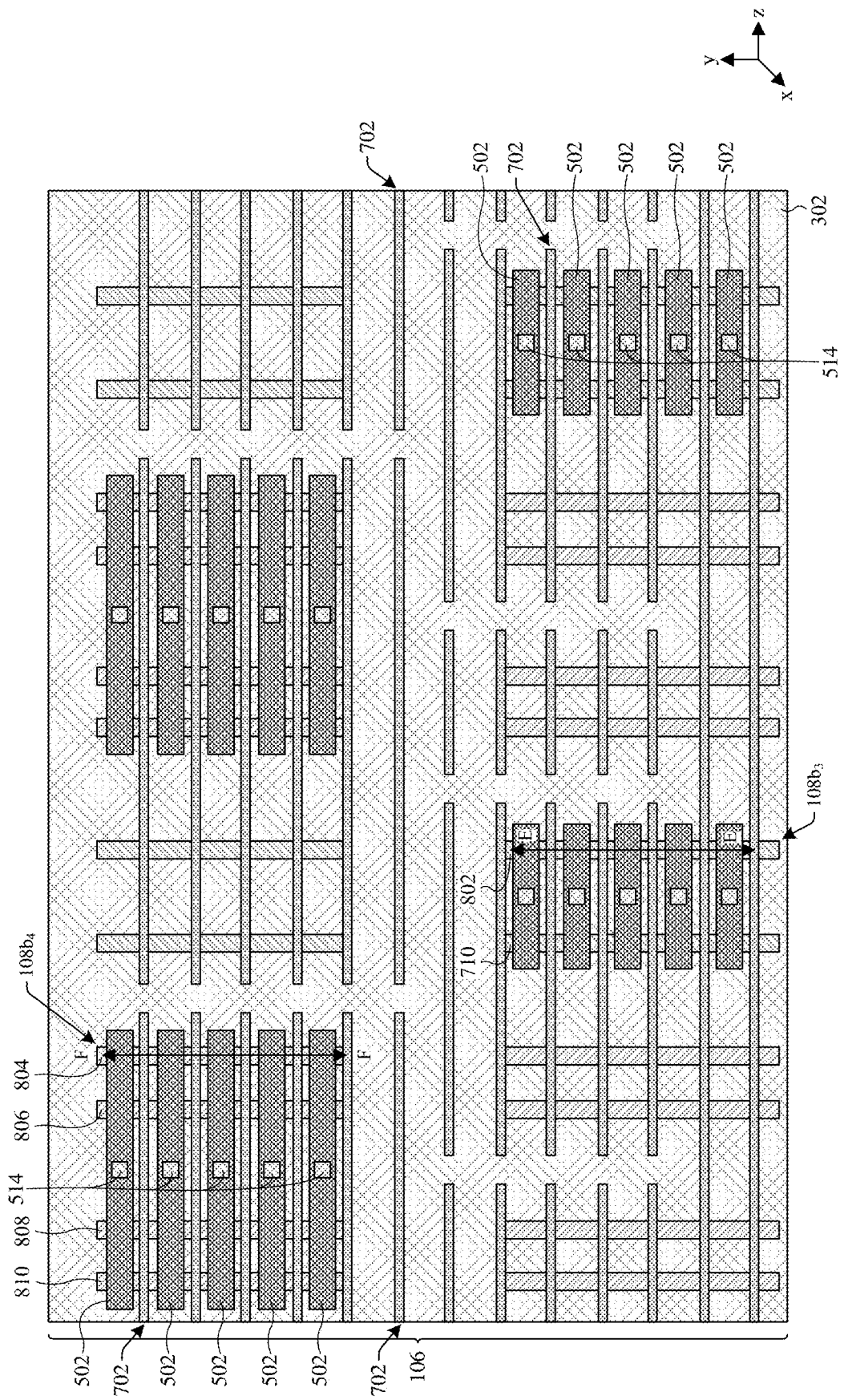
FIGS. 10A-10C illustrate various views of some other embodiments of the second section of the IC of FIGS. 8A-8E.
Figure 10B:
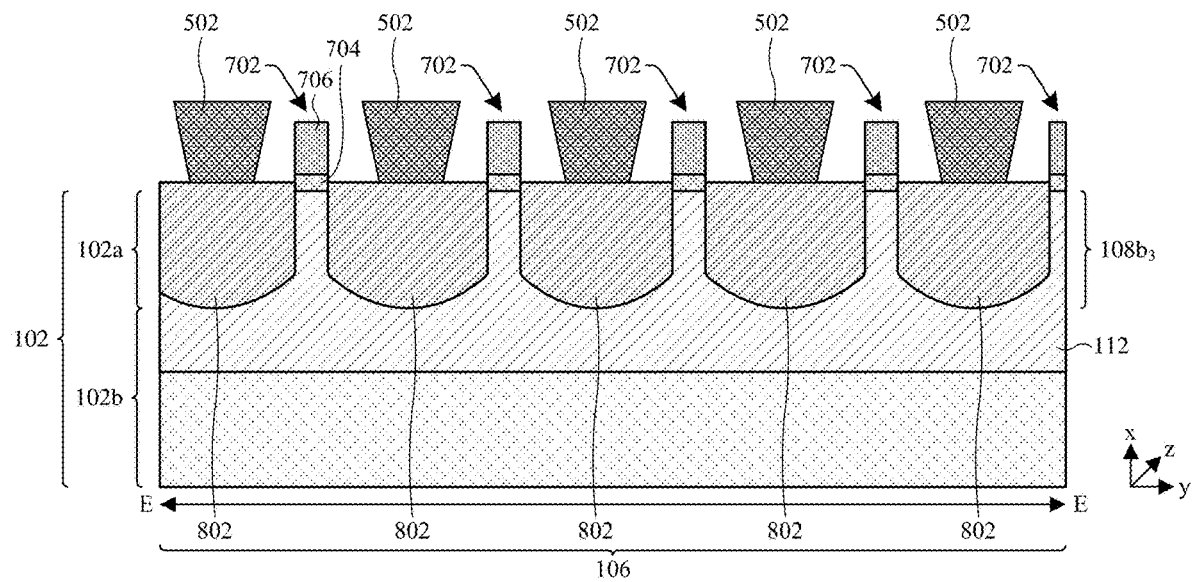
Figure 10C:
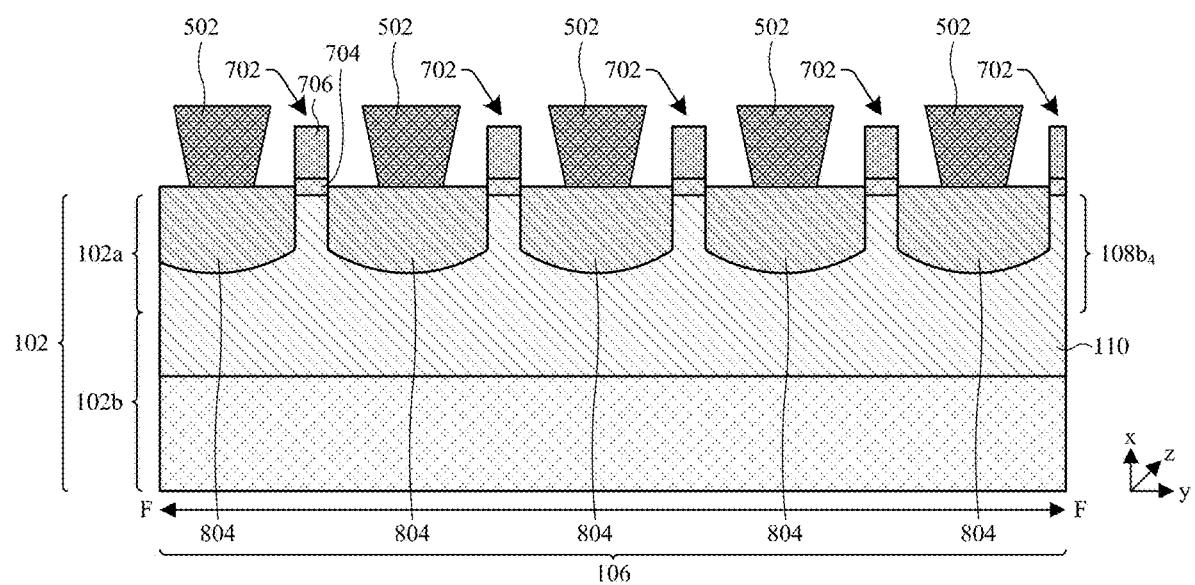

FIGS. 10A-10C illustrate various views of some other embodiments of the second section 106 of the IC 100 of FIGS. 8A-8E. FIG. 10A illustrates a layout view of some other embodiments of the second section of the IC of FIGS. 8A-8E. FIG. 10B illustrates a cross-sectional view of some embodiments of the second section of the IC of FIG. 10A taken along line E-E of FIG. 10A. FIG. 10C illustrates a cross-sectional view of some embodiments of the second section of the IC of FIG. 10A taken along line F-F of FIG. 10A.

As shown in FIGS. 10A-10C, five conductive contacts of the first plurality of conductive contacts 502 are electrically coupled to five pick-up regions of the fourth plurality of pick-up regions 710 and five pick-up regions of the fifth plurality of pick-up regions 802. Further, five other conductive contacts of the first plurality of conductive contacts 502 are electrically coupled to five pick-up regions of the sixth plurality of pick-up regions 804, five pick-up regions of the seventh plurality of pick-up regions 806, five pick-up regions of the eighth plurality of pick-up regions 808, and five pick-up regions of the ninth plurality of pick-up regions 810. In some embodiments, a thickness (e.g., extending vertically into the semiconductor substrate 102) of each of the pick-up regions of the fifth plurality of pick-up regions 802 may be greater than a thickness of each of the pick-up regions of the sixth plurality of pick-up regions 804, the seventh plurality of pick-up regions 806, the eighth plurality of pick-up regions 808, and the ninth plurality of pick-up regions 810. In further embodiments, a thickness of each of the pick-up regions of the fourth plurality of pick-up regions 710 may be greater than a thickness of each of the pick-up regions of the sixth plurality of pick-up regions 804, seventh plurality of pick-up regions 806, the eighth plurality of pick-up regions 808, and the ninth plurality of pick-up regions 810

Figure 11A:
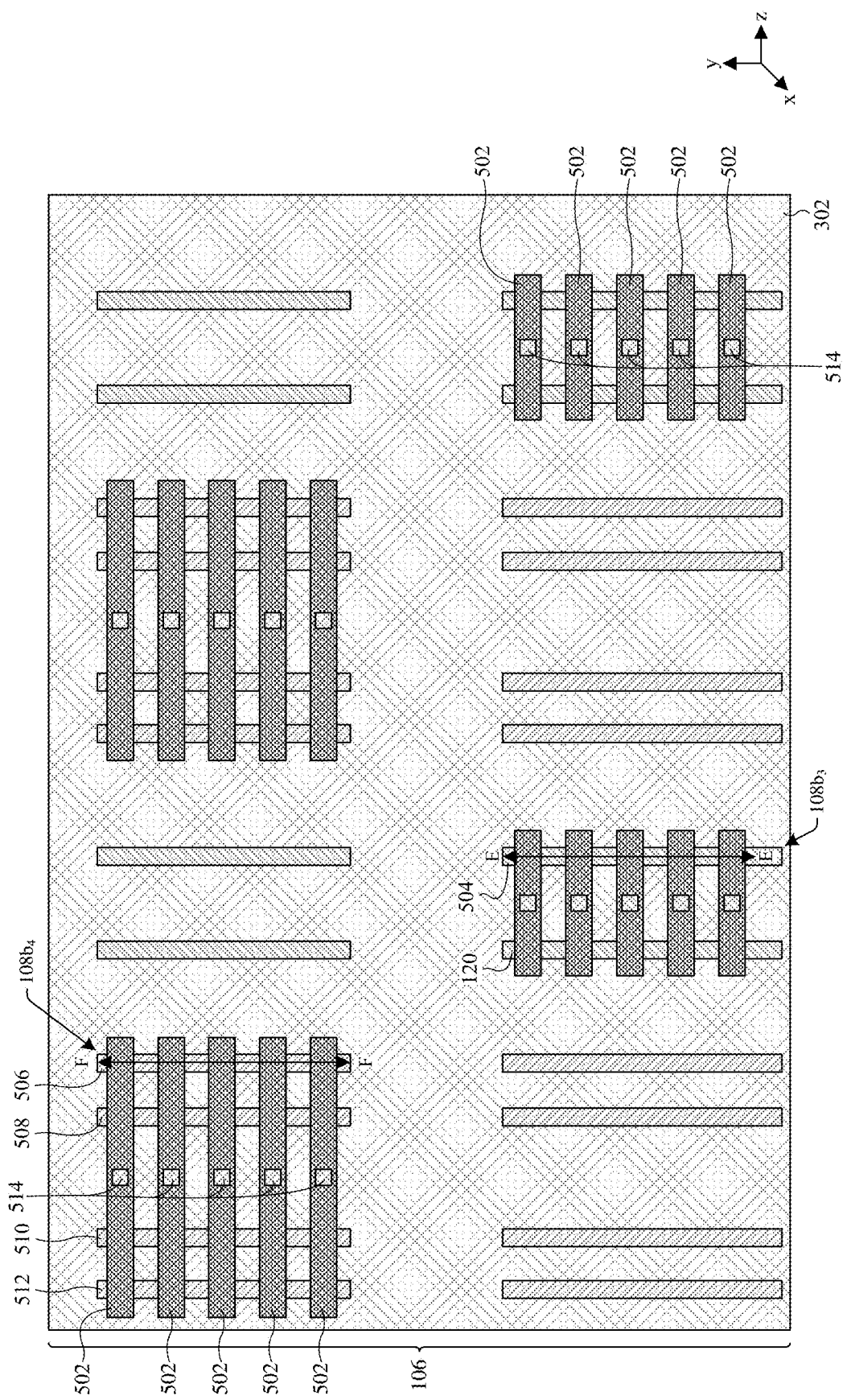
FIGS. 11A-11C illustrate various views of some other embodiments of the second section of the IC of FIGS. 5A-5E.
Figure 11B:
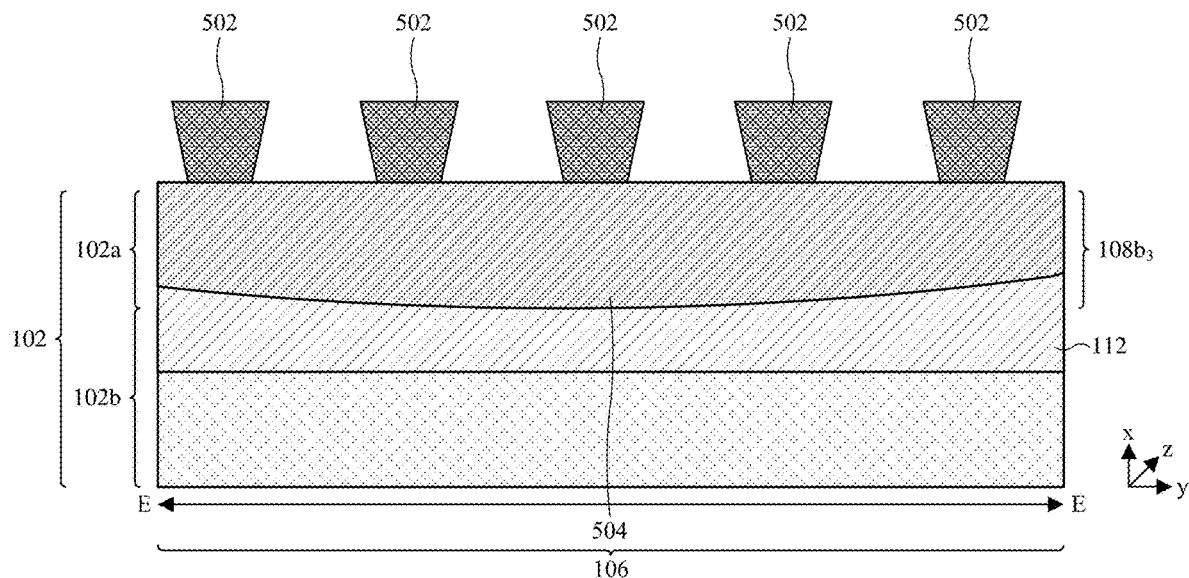
Figure 11C:
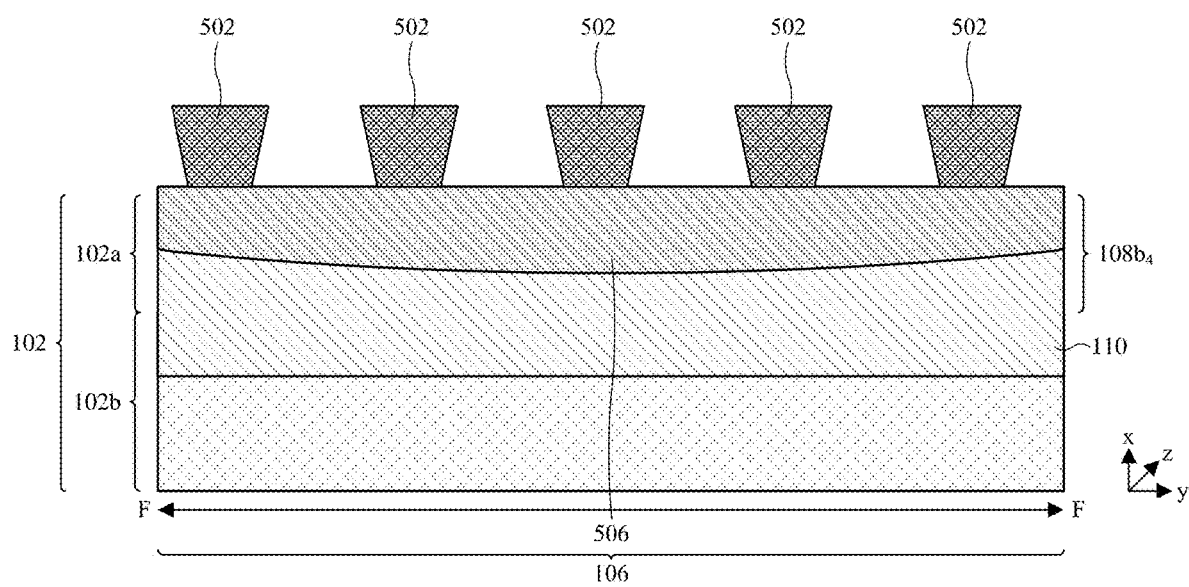

FIGS. 11A-11C illustrate various views of some other embodiments of the second section 106 of the IC 100 of FIGS. 5A-5E. FIG. 11A illustrates a layout view of some other embodiments of the second section of the IC of FIGS. 5A-5E. FIG. 11B illustrates a cross-sectional view of some embodiments of the second section of the IC of FIG. 11A taken along line E-E of FIG. 11A. FIG. 11C illustrates a cross-sectional view of some embodiments of the second section of the IC of FIG. 11A taken along line F-F of FIG. 11A.

As shown in FIGS. 11A-11C, five conductive contacts of the first plurality of conductive contacts 502 are electrically coupled to the second pick-up region 120 and the third pick-up region 504. Further, five other conductive contacts of the first plurality of conductive contacts 502 are electrically coupled to the fourth pick-up region 506, the fifth pick-up region 508, the sixth pick-up region 510, and the seventh pick-up region 512. In some embodiments, a thickness (e.g., extending vertically into the semiconductor substrate 102) of the third pick-up region 504 is greater than a thickness of the fourth pick-up region 506, the fifth pick-up region 508, the sixth pick-up region 510, and the seventh pick-up region 512. In further embodiments, a thickness of the second pick-up region 120 is greater than a thickness of the fourth pick-up region 506, the fifth pick-up region 508, the sixth pick-up region 510, and the seventh pick-up region 512.

FIGS. 12A-12B through FIGS. 23A-23B illustrate a series of various cross-sectional views of some embodiments for forming the IC 100 of FIGS. 9A-9D. Figures with the suffix "A" (e.g., FIG. 12A) illustrate a series of cross-sectional views of some embodiments for forming the structure illustrated in FIG. 9A. Figures with the suffix "B" (e.g., FIG. 12B) illustrate a series of cross-sectional views of some embodiments for forming the structure illustrated in FIG. 9B.

Figure 12A:
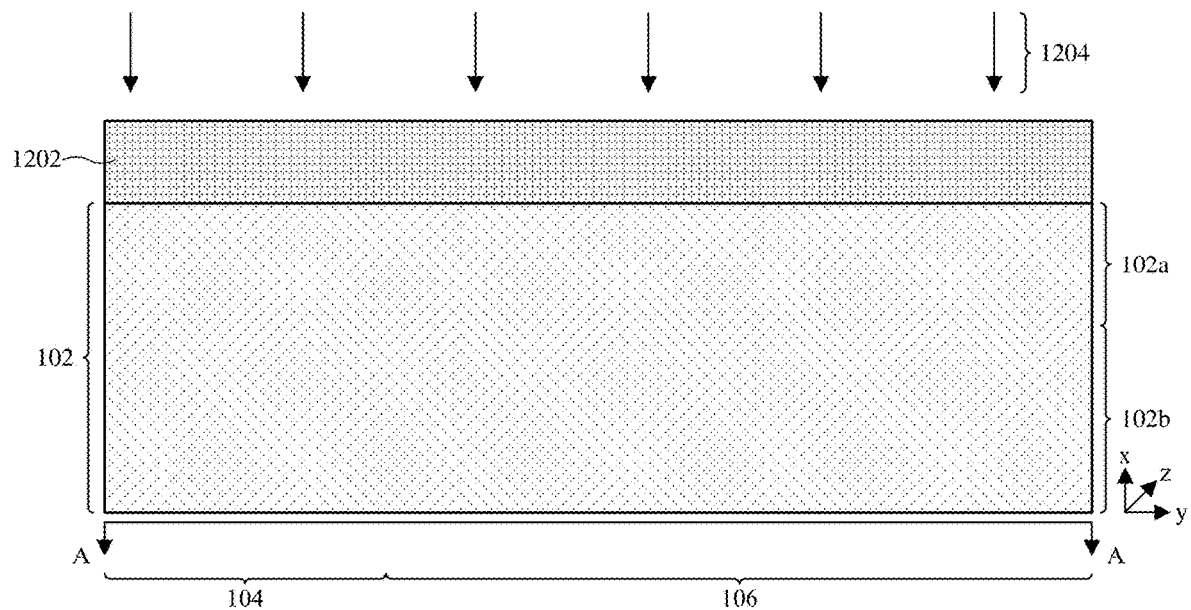
FIGS. 12A-12B through FIGS. 23A-23B illustrate a series of various cross-sectional views of some embodiments for forming the IC of FIGS. 9A-9D.
Figure 12B:
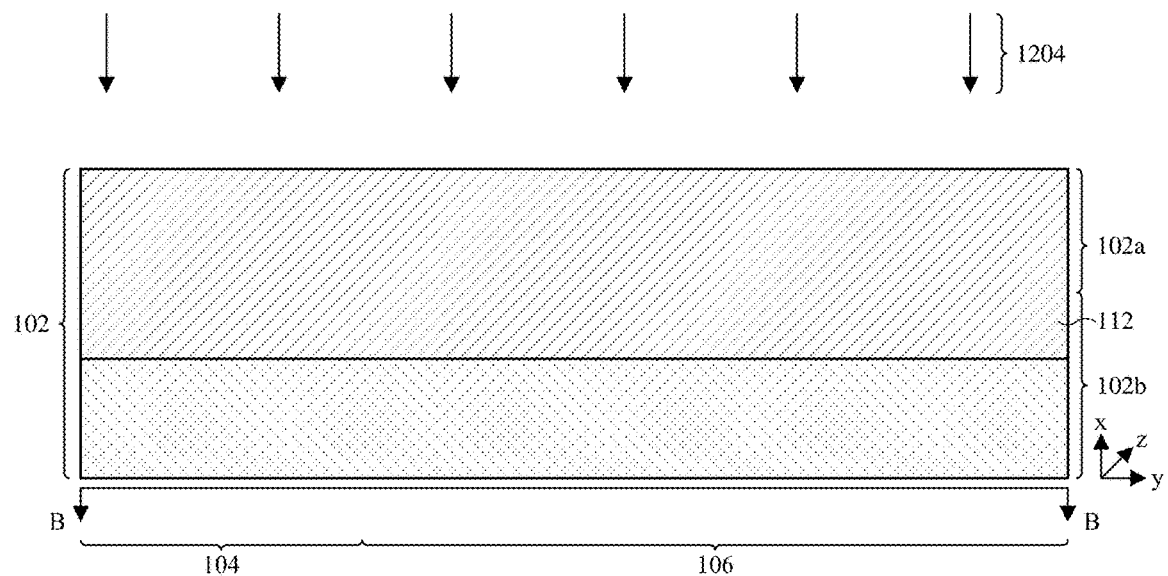

As shown in FIGS. 12A-12B, a second doped region 112 is formed in a semiconductor substrate 102. In some embodiments, a process for forming the second doped region 112 comprises forming a first patterned masking layer 1202 on the semiconductor substrate 102. In some embodiments, the first patterned masking layer 1202 may be formed by forming a masking layer (not shown) over the semiconductor substrate 102, exposing the masking layer to a pattern (e.g., via photolithography), and developing the masking layer to form the first patterned masking layer 1202. Thereafter, a first implantation process 1204 (e.g., an ion implantation process) is performed to implant second doping type dopants (e.g., n-type dopants, such as phosphorus atoms, arsenic atoms, or the like) into the semiconductor substrate 102, thereby forming the second doped region 112. Subsequently, the first patterned masking layer 1202 may be stripped away.

Figure 13A:
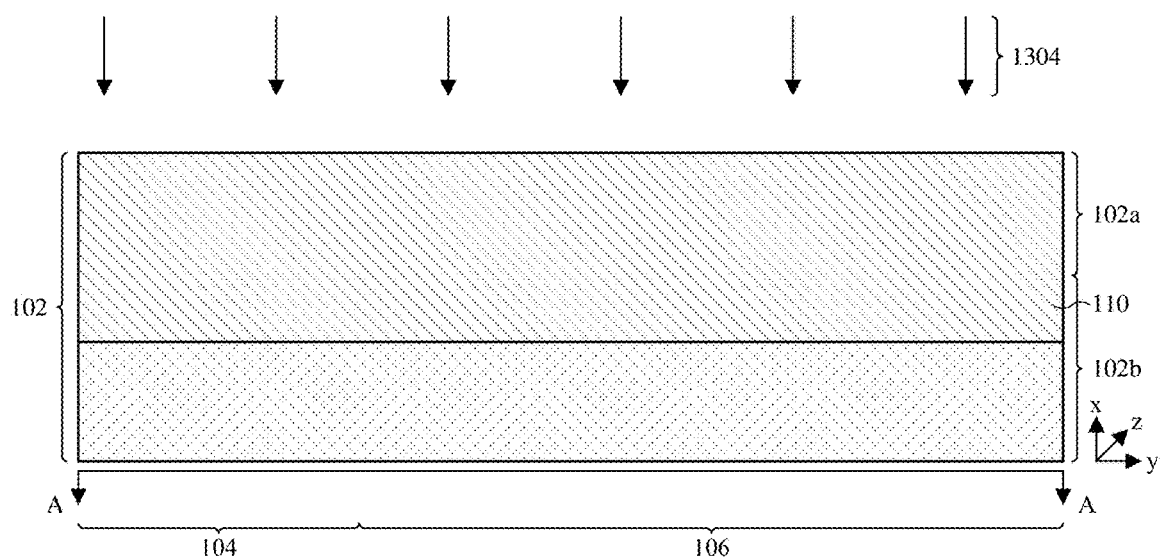
Figure 13B:
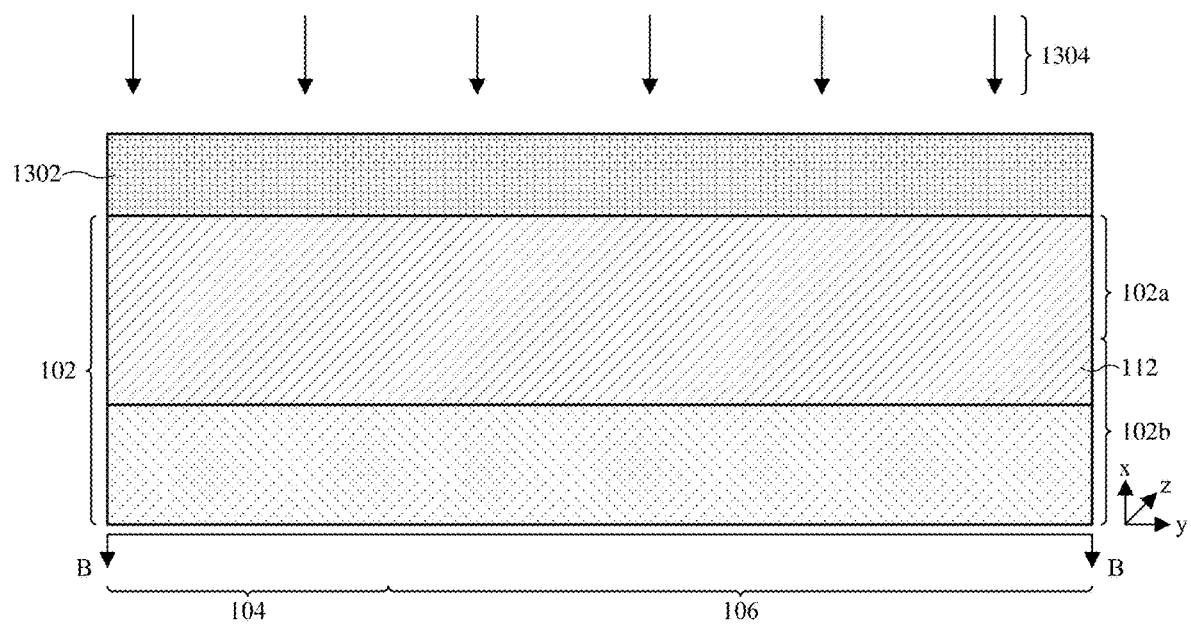

As shown in FIGS. 13A-13B, a first doped region 110 is formed in the semiconductor substrate 102. In some embodiments, a process for forming the first doped region 110 comprises forming a second patterned masking layer 1302 on the semiconductor substrate 102. Thereafter, a second implantation process 1304 is performed to implant first doping type dopants (e.g., p-type dopants, such as boron atoms, aluminum atoms, or the like) into the semiconductor substrate 102, thereby forming the first doped region 110. Subsequently, the second patterned masking layer 1302 may be stripped away. It will be appreciated that, in some embodiments, the first doped region 110 may be formed before the second doped region 112.

Figure 14A:
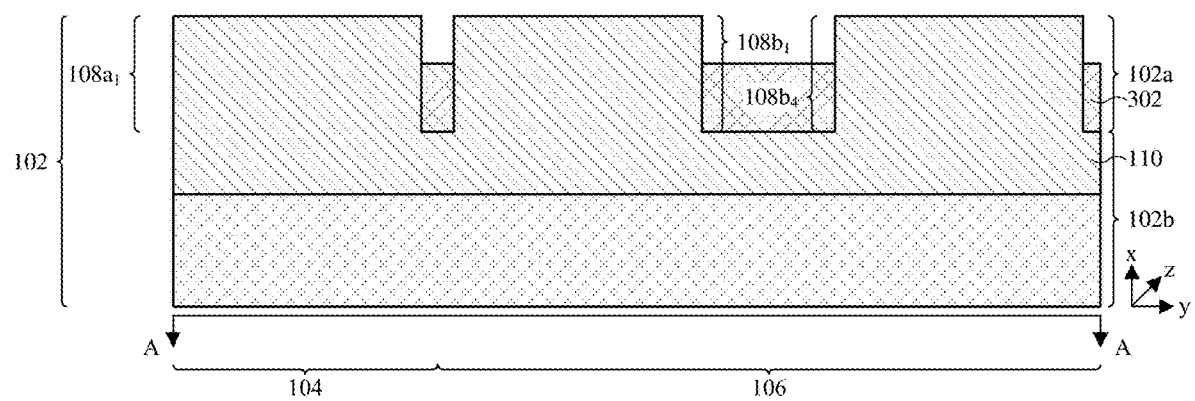
Figure 14B:
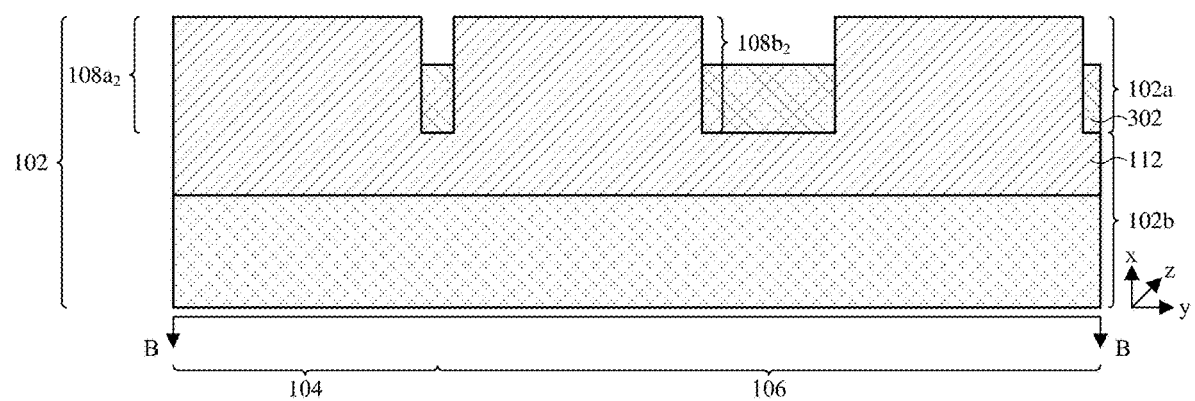

As shown in FIGS. 14A-14B, a plurality of fins 108 is formed in/from the semiconductor substrate 102. A first set of fins 108a of the fins 108 are formed in a first section 104, and a second set of fins 108b of the fins 108 are formed in a second section 106. In some embodiments, a process for forming the fins 108 comprises forming a patterned masking layer (not shown) (e.g., a hardmask) on the semiconductor substrate 102. Thereafter, an etching process is performed on the semiconductor substrate 102 to form recesses in the semiconductor substrate 102, thereby leaving portions of the semiconductor substrate 102 that are masked by the patterned masking layer in place as the fins 108. The etching process may be a dry etching process, a wet etching process, a reactive ion etching process, some other etching process, or a combination of the foregoing. In further embodiments, the fins 108 may be formed using a mandrel-spacer double patterning process, some other multiple patterning process, or a combination of the foregoing.

Also shown in FIGS. 14A-14B, an isolation structure 302 is formed over a lower region 102b of the semiconductor substrate 102. In some embodiments, a process for forming the isolation structure 302 comprise depositing an isolation layer (not shown) on the semiconductor substrate 102 and covering the fins 108. In further embodiments, the isolation layer may be deposited by, for example, chemical vapor deposition (CVD), physical vapor deposition (PVD), atomic layer deposition (ALD), thermal oxidation, some other deposition process, or a combination of the foregoing. A planarization process (e.g., chemical-mechanical polishing (CMP)) is then performed to remove an upper portion of the isolation layer. The planarization process may also remove the patterned masking layer used to form the fins 108. Thereafter, an etching process is performed on the isolation layer to recess the isolation layer below upper surfaces of the fins 108, thereby forming the isolation structure 302.

Figure 15A:
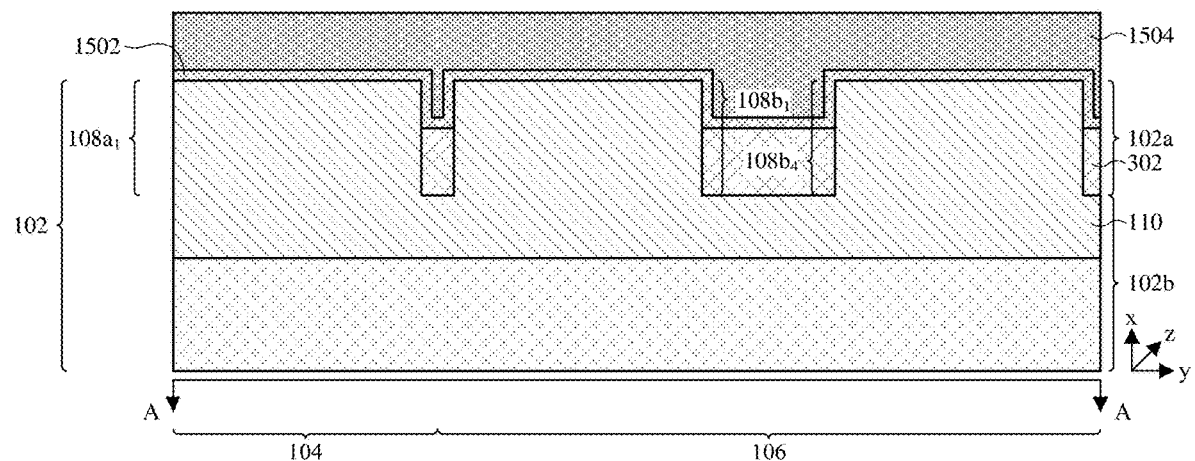
Figure 15B:
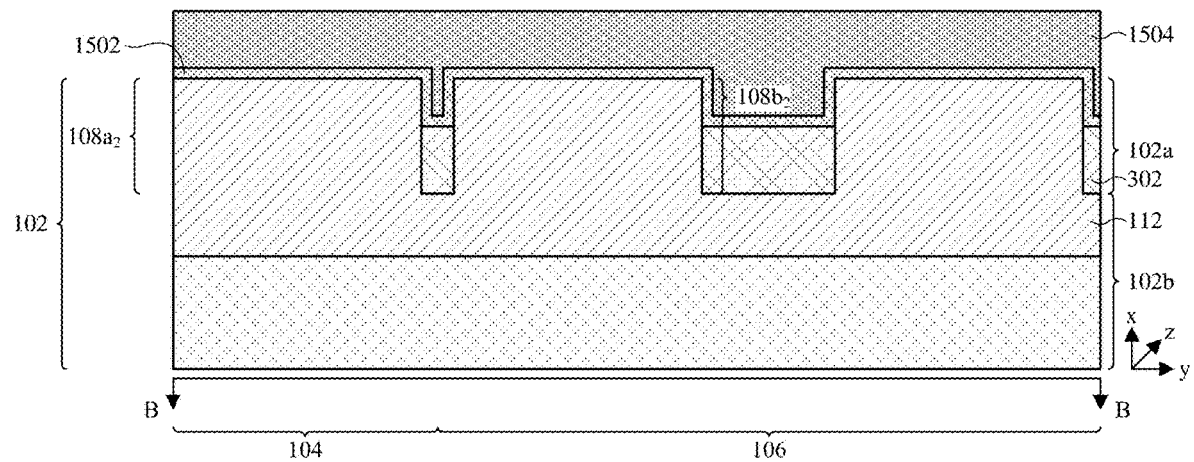

As shown in FIGS. 15A-15B, a gate dielectric layer 1502 is formed over the isolation structure 302 and covering the fins 108. In some embodiments, the gate dielectric layer 1502 is a conformal layer that continuously extends across the isolation structure 302 and engages each of the fins 108 on three sides. In further embodiments, the gate dielectric layer 1502 comprises an oxide (e.g., $SiO_2$), a high-k dielectric (e.g., a dielectric material with a dielectric constant greater than 3.9), some other dielectric material, or a combination of the foregoing. The gate dielectric layer 1502 may comprise multiple layers, for example, comprising one or more interfacial layers. In further embodiments, the gate dielectric layer 1502 may have a thickness of about 30 angstroms (Å). In yet further embodiments, a process for forming the gate dielectric layer 1502 comprises depositing the gate dielectric layer 1502 on the isolation structure 302 and the fins 108 by, for example, CVD, PVD, ALD, some other deposition process, or a combination of the foregoing.

Also shown in FIGS. 15A-15B, a gate electrode layer 1504 is formed over the gate dielectric layer 1502. In some embodiments, the gate electrode layer 1504 comprises, for example, polysilicon, a metal (e.g., W), some other conductive material, or a combination of the foregoing. The gate electrode layer 1504 may comprise multiple layers. For example, in some embodiments, the gate electrode layer 1504 may comprise, for example, a work function metal layer and a metal fill layer. In further embodiments, the gate electrode layer 1504 may have a thickness of about 900 Å. In yet further embodiments, a process for forming the gate electrode layer 1504 comprises depositing the gate electrode layer 1504 on the gate dielectric layer 1502 by, for example, CVD, PVD, ALD, sputtering, electrochemical plating, electroless plating, some other deposition process, or a combination of the foregoing.

Figure 16A:
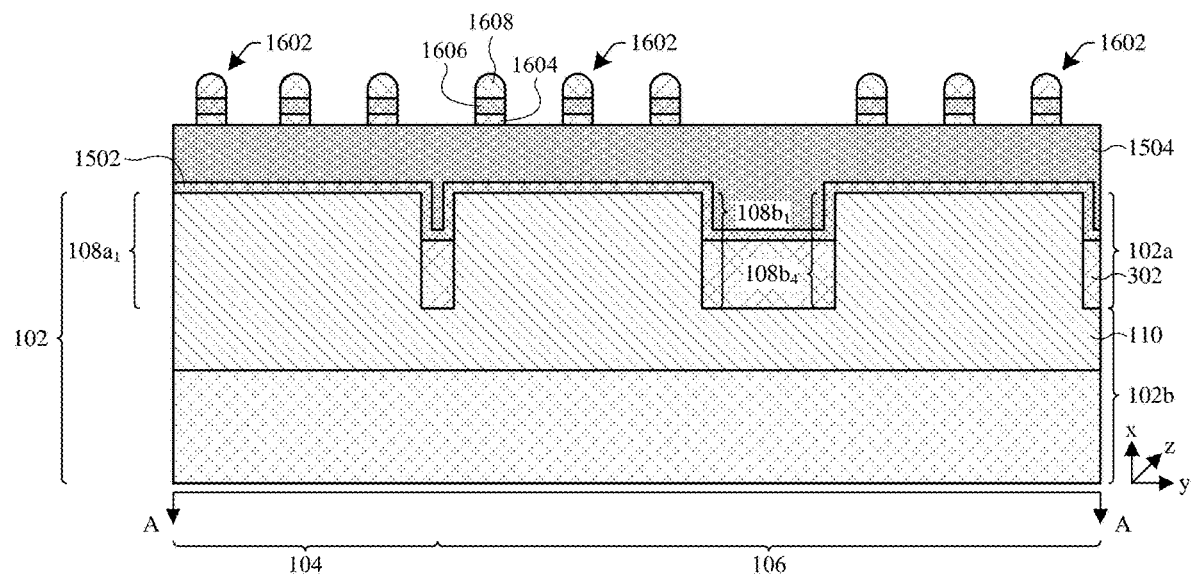
Figure 16B:
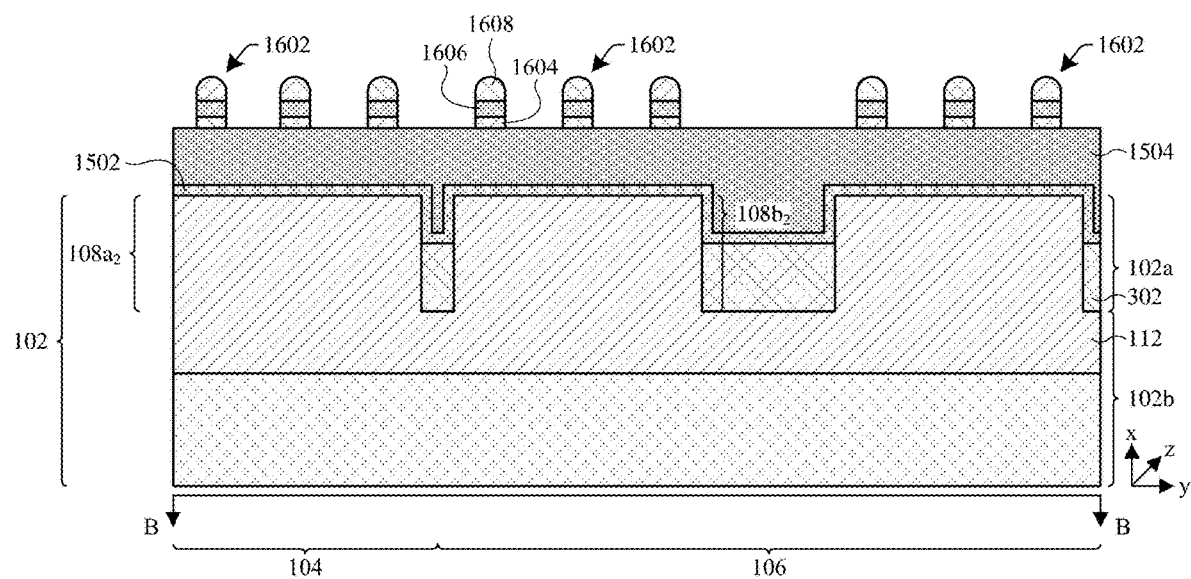

As shown in FIGS. 16A-16B, a plurality of masking structures 1602 are formed over the gate electrode layer 1504 and the gate dielectric layer 1502. The plurality of masking structures 1602 comprise first dielectric structures 1604, respectively, second dielectric structures 1606, respectively, and third dielectric structures 1608, respectively. In some embodiments, the masking structures 1602 are formed having lengths that are substantially the same as the first length $L_1$ (See, e.g., FIGS. 8A-8E).

In some embodiments, the first dielectric structures 1604 comprise an oxide (e.g., $SiO_2$), a nitride (e.g., SiN), or the like. The second dielectric structures 1606 may comprise, for example, a nitride (e.g., SiN), an oxide (e.g., $SiO_2$), or the like. In further embodiments, the third dielectric structures 1608 comprise an oxide (e.g., $SiO_2$), a nitride (e.g., SiN), or the like. In further embodiments, the first dielectric structures 1604 comprise SiN, the second dielectric structures 1606 comprise $SiO_2$, and the third dielectric structures 1608 comprise SiN. In further embodiments, upper surfaces of the third dielectric structures 1608 may be curved (e.g., convex).

In some embodiments, a process for forming the masking structures 1602 comprises depositing a first dielectric layer (not shown) on the gate electrode layer 1504 by, for example, CVD, PVD, ALD, or the like. A second dielectric layer (not shown) is then deposited on the first dielectric layer by, for example, CVD, PVD, ALD, or the like. A third dielectric layer (not shown) is then deposited on the second dielectric layer by, for example, CVD, PVD, ALD, or the like. Thereafter, a patterned masking layer (not shown) is formed on the third dielectric layer. An etching process is then performed on the first dielectric layer, the second dielectric layer, and the third dielectric layer to remove unmasked portions of the first dielectric layer, the second dielectric layer, and the third dielectric layer, thereby forming the masking structures 1602. The etching process may be a dry etching process, a wet etching process, a reactive ion etching process, some other etching process, or a combination of the foregoing. Subsequently, in some embodiments, the patterned masking layer is stripped away.

Figure 17A:
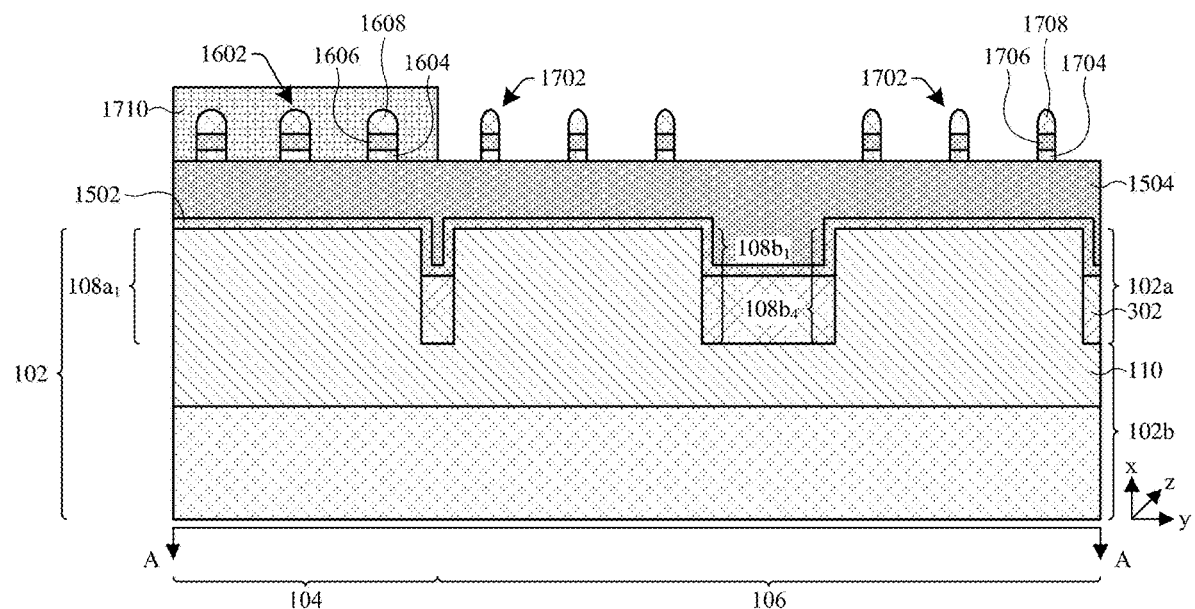
Figure 17B:
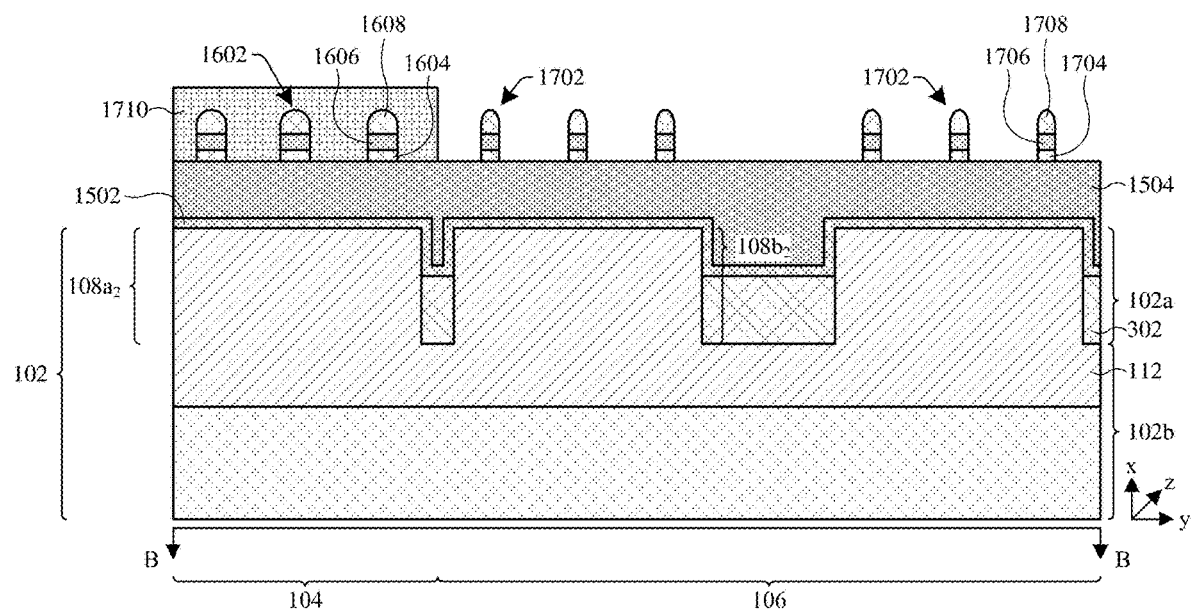

As shown in FIGS. 17A-17B, a plurality of trimmed masking structures 1702 are formed over the second set of fins 108b. The trimmed masking structures 1702 are masking structures 1602 (See, e.g., FIGS. 16A-16B) that have had their lengths reduced. In some embodiments, the reduced lengths of the trimmed masking structures 1702 may be substantially the same as the fourth length $L_4$ (See, e.g., FIGS. 8A-8E). The plurality of trimmed masking structures 1702 comprise first trimmed dielectric structures 1704, respectively, second trimmed dielectric structures 1706, respectively, and third trimmed dielectric structures 1708, respectively. The first trimmed dielectric structures 1704 are first dielectric structures 1604 (See, e.g., FIGS. 16A-16B) that have had their lengths reduced. The second trimmed dielectric structures 1706 are second dielectric structures 1606 (See, e.g., FIGS. 16A-16B) that have had their lengths reduced. The third trimmed dielectric structures 1708 are third dielectric structures 1608 (See, e.g., FIGS. 16A-16B) that have had their lengths reduced.

In some embodiments, a process for forming the trimmed masking structures 1702 comprises forming a third patterned masking layer 1710 over the gate electrode layer 1504 and covering the masking structures 1602 disposed over the first set of fins 108a. With the third patterned masking layer 1710 in place, an etching process is performed on the unmasked masking structures 1602 (e.g., the masking structures disposed over the second set of fins 108b), to reduce the lengths of the unmasked masking structures 1602, thereby forming the trimmed masking structures 1702 over the second set of fins 108b. The etching process may be a dry etching process, a wet etching process, a reactive ion etching process, some other etching process, or a combination of the foregoing. Subsequently, in some embodiments, the third patterned masking layer 1710 may be stripped away.

Figure 18A:
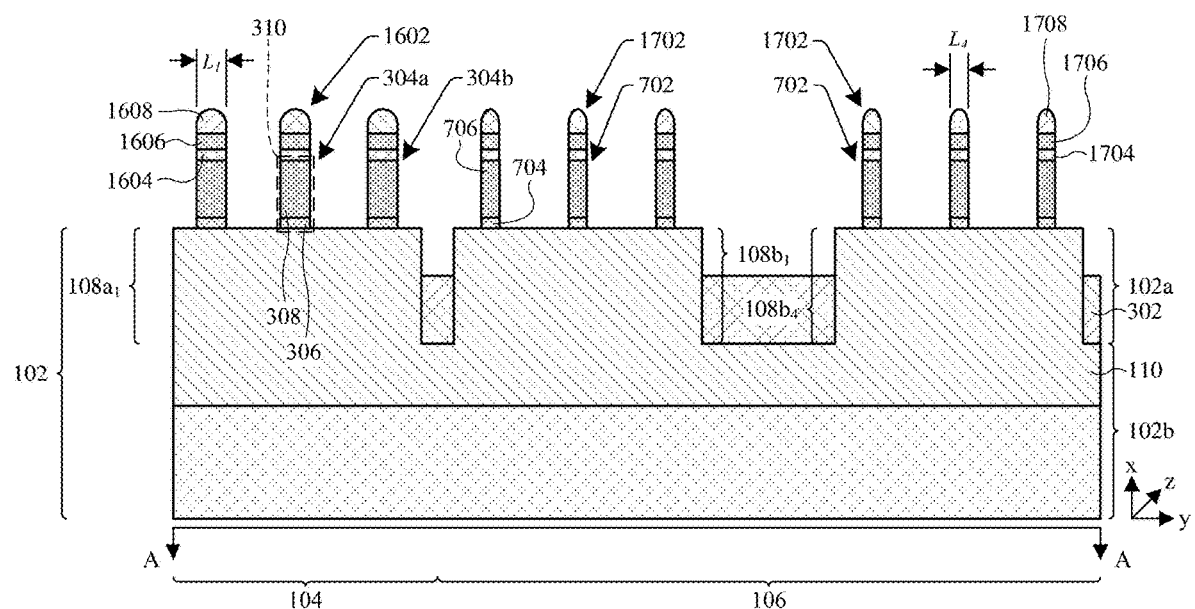
Figure 18B:
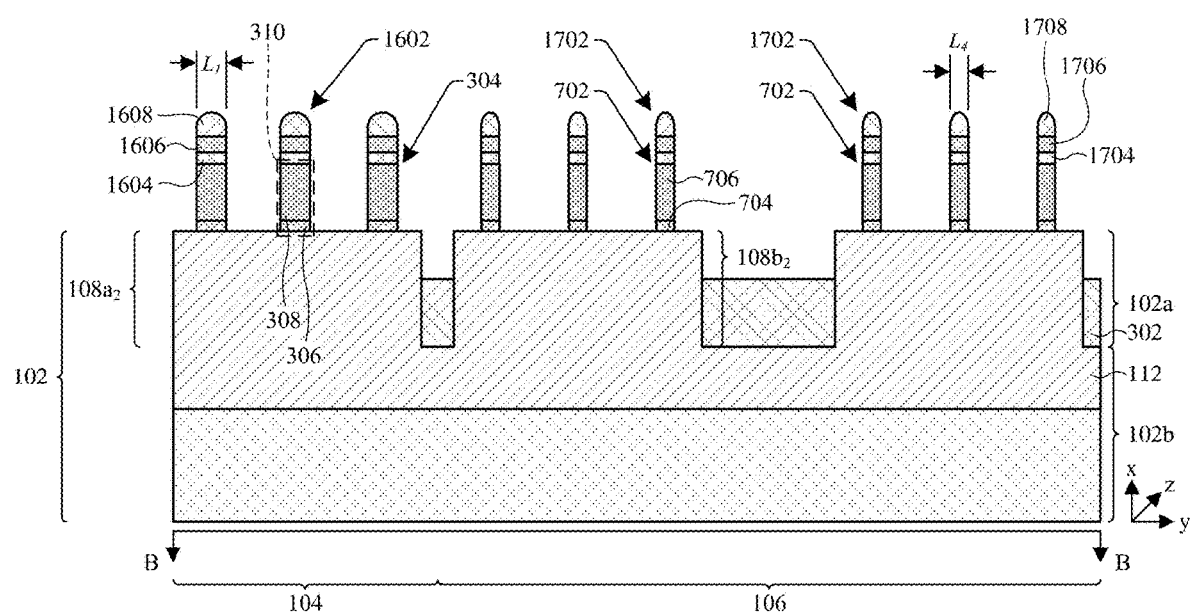

As shown in FIGS. 18A-18B, a plurality of continuous gate structures 304 are formed over the first set of fins 108a and over the isolation structure 302. Further, a plurality of pick-up gate structures 702 are formed over the second set of fins 108b and over the isolation structure 302. Each of the pick-up gate structures 702 have a length that is less than a length of each of the continuous gate structures 304 (See, e.g., FIGS. 8A-8E). In some embodiments, the continuous gate structures 304 are formed having the first length $L_1$ (See, e.g., FIGS. 8A-8E). In further embodiments, the pick-up gate structures 702 are formed having the fourth length $L_4$ (See, e.g., FIGS. 8A-8E). Each of the continuous gate structures 304 comprise a continuous gate dielectric structure 306 and a continuous gate electrode structure 308. Each of the pick-up gate structures 702 comprise a pick-up gate dielectric material 704 and a pick-up gate electrode material 706.

In some embodiments, a process for forming the continuous gate structures 304 and the pick-up gate structures 702 comprises performing an etching process into the gate dielectric layer 1502 and the gate electrode layer 1504 with the masking structures 1602 in place over the first set of fins 108a and the trimmed masking structures 1702 in place over the second set of fins 108b. The etching process removes portions of the gate dielectric layer 1502 and the gate electrode layer 1504 that are not masked by the masking structures 1602 or the trimmed masking structures 1702, thereby forming the continuous gate structures 304 and the pick-up gate structures 702. The etching process may be a dry etching process, a wet etching process, a reactive ion etching process, some other etching process, or a combination of the foregoing. Subsequently, in some embodiments, the masking structures 1602 and the trimmed masking structures 1702 are removed.

It will be appreciated that, in some embodiments, the pick-up gate structures 702 may not be formed (See, e.g., FIGS. 5A-5E). In such embodiments, no masking structures 1602 (and/or trimmed masking structures 1702) are formed over the second set of fins 108b. In further such embodiments, not forming masking structures 1602 over the second set of fins 108b comprises not masking portions of the first dielectric layer, the second dielectric layer, and/or the third dielectric layer that are disposed over the second set of fins 108b.

Figure 19A:
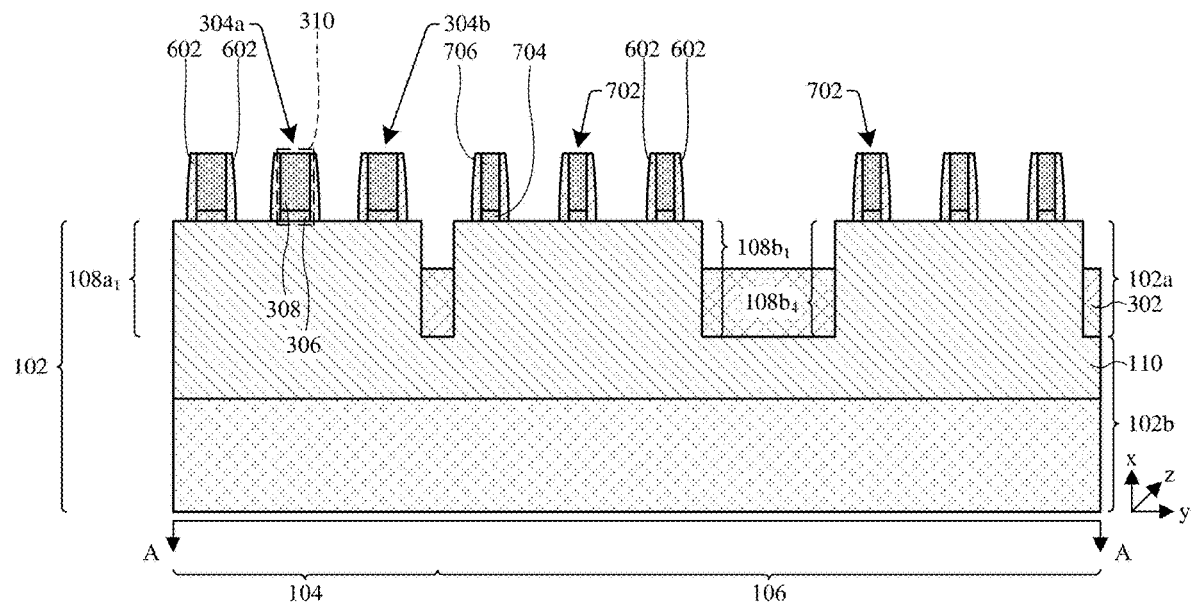
Figure 19B:
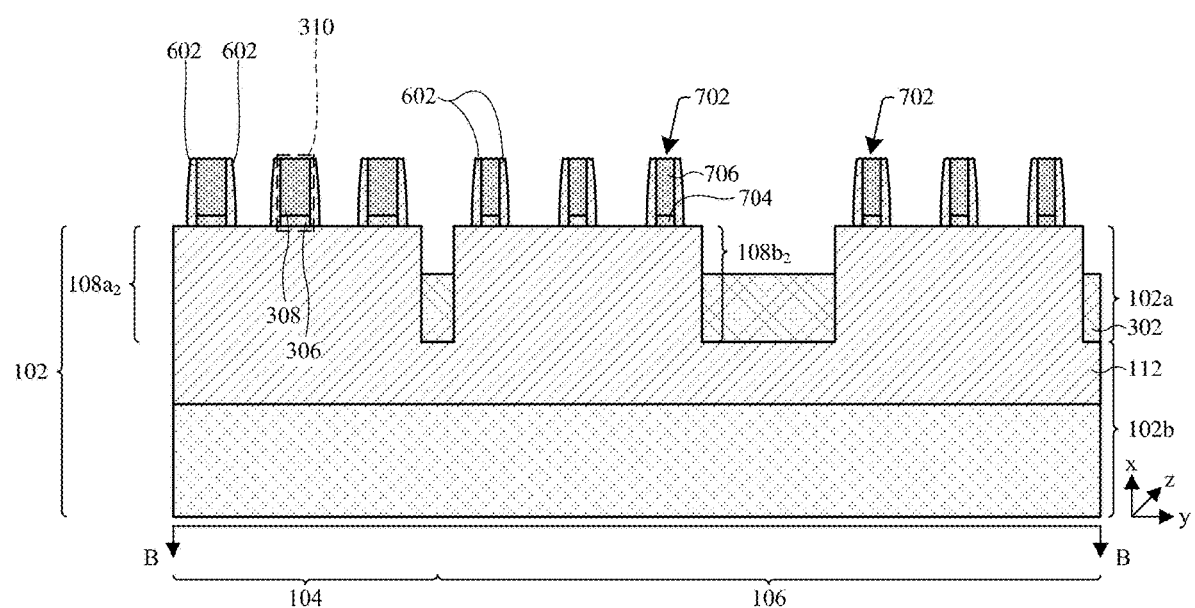

As shown in FIGS. 19A-19B, sidewall spacers 602 are formed over the semiconductor substrate 102 and on sides of the continuous gate structures 304 and sides of the pick-up gate structures 702. In some embodiments, a process for forming the sidewall spacers 602 comprises depositing a spacer layer (not shown) over the isolation structure 302, over the fins 108, over the continuous gate structures 304, and over the pick-up gate structures 702. In further embodiments, the spacer layer may be deposited by PVD, CVD, ALD, or the like. The spacer layer is subsequently etched to remove the spacer layer from horizontal surfaces, leaving the spacer layer along opposite sidewalls of the continuous gate structures 304 and opposite sides of the pick-up gate structures 702 as the sidewall spacers 602. In yet further embodiments, the spacer layer may comprise, for example, a nitride (e.g., SiN), an oxy-nitride (e.g., $SiO_XN_Y$), or the like. It will be appreciated that, in some embodiments, the sidewall spacers 602 may be formed before the masking structures 1602 and the trimmed masking structures 1702 are removed. In such embodiments, the sidewall spacers 602 may be formed extending vertically along sidewalls of the masking structures 1602 and the trimmed masking structures 1702.

Figure 20A:
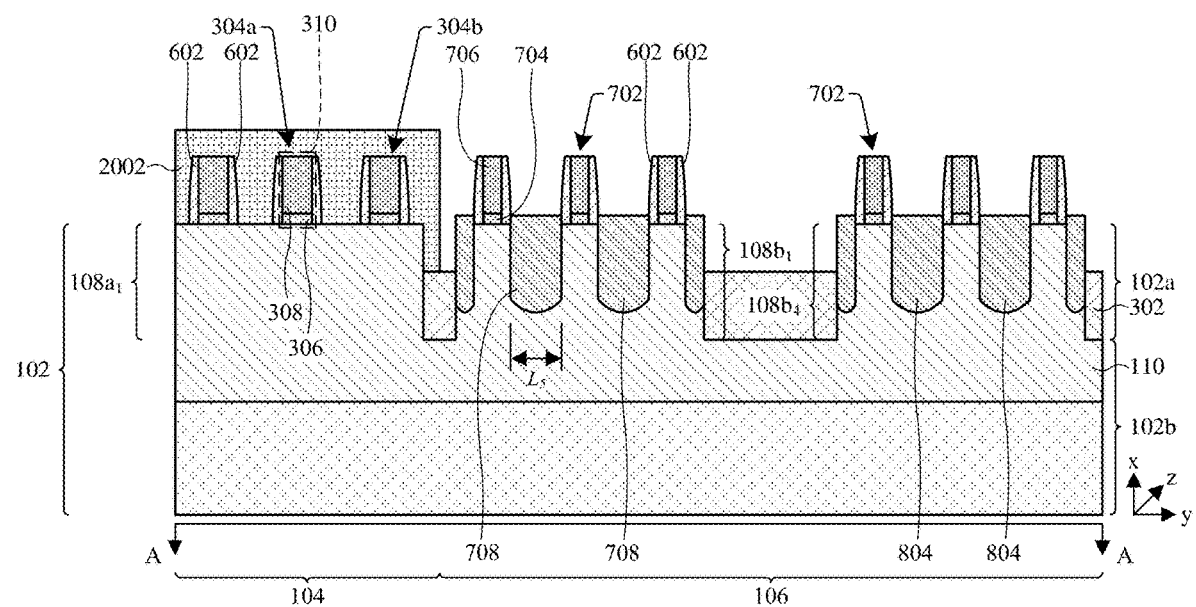
Figure 20B:
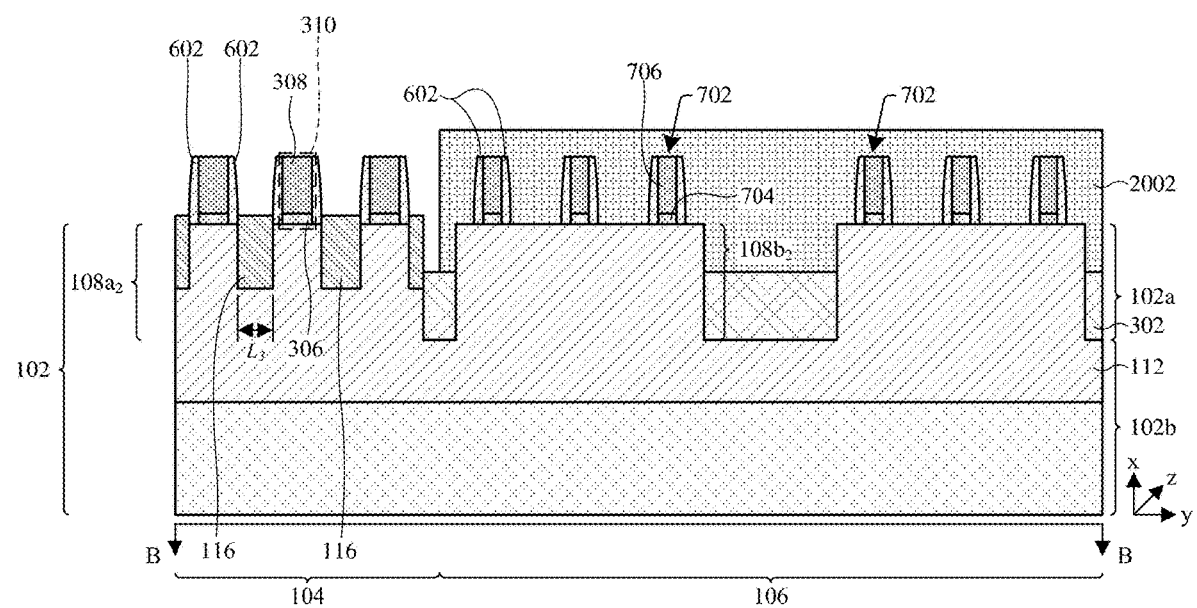

As shown in FIGS. 20A-20B, a pair of second source/drain regions 116, a third plurality of pick-up regions 708, and a sixth plurality of pick-up regions 804 are formed in the semiconductor substrate 102. In some embodiments, the second source/drain regions 116 are formed having the third length $L_3$ (See, e.g., FIGS. 8A-8E). In further embodiments, the third plurality of pick-up regions 708 and the sixth plurality of pick-up regions 804 are formed having the fifth length $L_5$ (See, e.g., FIGS. 8A-8E).

In some embodiments, a process for forming the second source/drain regions 116, the third plurality of pick-up regions 708, and the sixth plurality of pick-up regions 804 comprises forming a sixth patterned masking layer 2002 over the isolation structure 302, the sidewall spacers 602, the fins 108, the continuous gate structures 304, and the pick-up gate structures 702. In further embodiments, the sixth patterned masking layer 2002 covers the first fin $108a_1$, portions of the continuous gate structures 304 disposed over the first fin $108a_1$, the fourth fin $108b_2$, and portions of the pick-up gate structures 702 disposed over the fourth fin $108b_2$.

With the sixth patterned masking layer 2002 in place, a third etching process is then performed on the semiconductor substrate 102 to form recesses in the second fin $108a_2$, the third fin $108b_1$, and the sixth fin $108b_4$. The recesses formed in the second fin $108a_2$ are formed on opposite sides of the continuous gate structures 304 disposed over the second fin $108a_2$, the recesses formed in the third fin $108b_1$ are formed on opposite sides of the pick-up gate structures 702 disposed over the third fin $108b_1$, and the recesses formed in the sixth fin $108b_4$ are formed on opposite sides of the pick-up gate structures 702 disposed over the sixth fin $108b_4$. In yet further embodiments, the third etching process may be a dry etching process, a wet etching process, some other suitable etching process, or a combination of the foregoing.

Thereafter, a first epitaxial process is performed to grow the second source/drain regions 116 from the recesses formed in the second fin $108a_2$, the third plurality of pick-up regions 708 from the recesses formed in the third fin $108b_1$, and the sixth plurality of pick-up regions 804 from the recesses formed in the sixth fin $108b_4$. The first epitaxial process may be, for example, a vapor-phase epitaxial process, a liquid-phase epitaxial process, a molecular-beam epitaxial process, some other epitaxial process, or a combination of the foregoing. In some embodiments, the first epitaxial process may in-situ dope the second source/drain regions 116, the third plurality of pick-up regions 708, and the sixth plurality of pick-up regions 804 with the first doping type dopants (e.g., p-type dopants). It will be appreciated that the second source/drain regions 116, the third plurality of pick-up regions 708, and the sixth plurality of pick-up regions 804 may be formed by other suitable processes (e.g., one or more ion implantation processes).

It will be appreciated that any number of source/drain regions having the same doping type and chemical composition as the second source/drain regions 116 may be formed in the semiconductor substrate 102 by the above process for forming the second source/drain regions 116, the third plurality of pick-up regions 708, and the sixth plurality of pick-up regions 804. It will further be appreciated that any number of pick-up regions having the same doping type and chemical composition as the third plurality of pick-up regions 708 and the sixth plurality of pick-up regions 804 may be formed in the semiconductor substrate 102 by the above process for forming the second source/drain regions 116, the third plurality of pick-up regions 708, and the sixth plurality of pick-up regions 804.

Figure 21A:
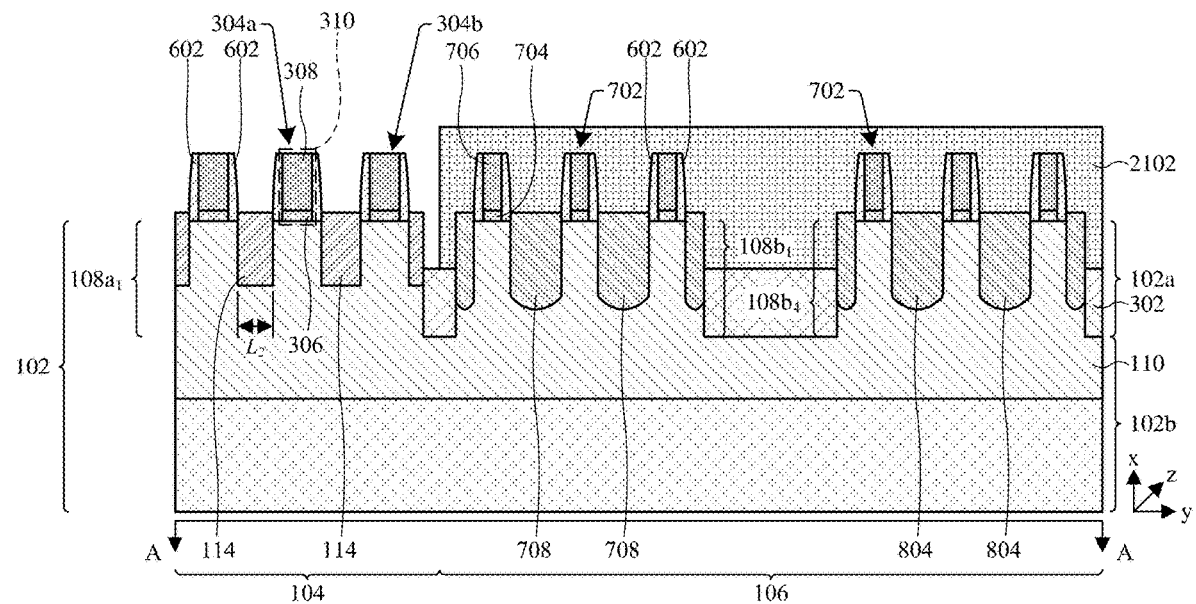
Figure 21B:
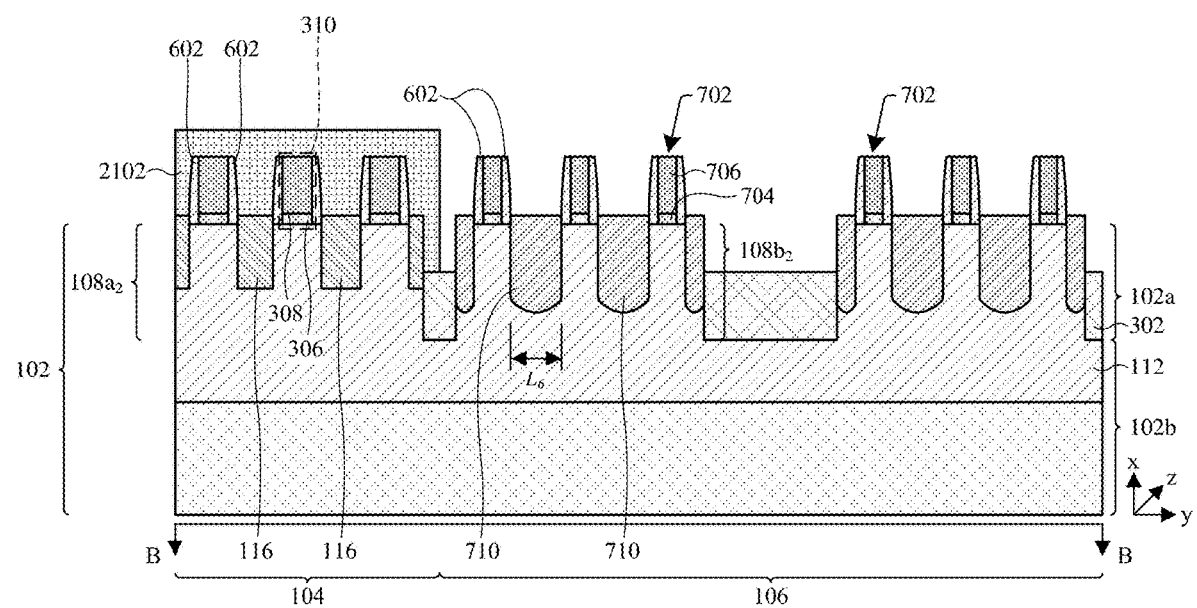

As shown in FIGS. 21A-21B, a pair of first source/drain regions 114 and a fourth plurality of pick-up regions 710 are formed in the semiconductor substrate 102. In some embodiments, the first source/drain regions 114 are formed having the second length $L_2$ (See, e.g., FIGS. 8A-8E). In further embodiments, the fourth plurality of pick-up regions 710 are formed having the sixth length $L_6$ (See, e.g., FIGS. 8A-8E).

In some embodiments, a process for forming the first source/drain regions 114 and the fourth plurality of pick-up regions 710 comprises forming a seventh patterned masking layer 2102 over the isolation structure 302, the sidewall spacers 602, the fins 108, the continuous gate structures 304, and the pick-up gate structures 702. In further embodiments, the seventh patterned masking layer 2102 covers the second fin $108a_2$, portions of the continuous gate structures 304 disposed over the second fin $108a_2$, the third fin $108b_1$, portions of the pick-up gate structure 702 disposed over the third fin $108b_1$, the sixth fin $108b_4$, and portions of the pick-up gate structure 702 disposed over the third fin $108b_4$.

With the seventh patterned masking layer 2102 in place, a fourth etching process is then performed on the semiconductor substrate 102 to form recesses in the first fin $108a_1$ and the fourth fin $108b_2$. The recesses formed in the first fin $108a_1$ are formed on opposite sides of the continuous gate structures 304 disposed over the first fin $108a_1$, and the recesses formed in the fourth fin $108b_2$ are formed on opposite sides of the pick-up gate structures 702 disposed over the fourth fin $108b_2$. In yet further embodiments, the fourth etching process may be a dry etching process, a wet etching process, some other suitable etching process, or a combination of the foregoing.

Thereafter, a second epitaxial process is performed to grow the first source/drain regions 114 from the recesses formed in the first fin $108a_1$ and the fourth plurality of pick-up regions 710 from the recesses formed in the fourth fin $108b_2$. The second epitaxial process may be, for example, a vapor-phase epitaxial process, a liquid-phase epitaxial process, a molecular-beam epitaxial process, some other epitaxial process, or a combination of the foregoing. In some embodiments, the second epitaxial processes may in-situ dope the first source/drain regions 114 and the fourth plurality of pick-up regions 710 with the second doping type dopants (e.g., n-type dopants). It will be appreciated that the first source/drain regions 114 and the fourth plurality of pick-up regions 710 may be formed by other suitable processes (e.g., one or more ion implantation processes).

It will be appreciated that any number of source/drain regions having the same doping type and chemical composition as the first source/drain regions 114 may be formed in the semiconductor substrate 102 by the above process for forming the first source/drain regions 114 and the fourth plurality of pick-up regions 710. Further, it will be appreciated that any number of pick-up regions having the same doping type and chemical composition as the fourth plurality of pick-up regions 710 may be formed in the semiconductor substrate 102 by the above process for forming the first source/drain regions 114 and the fourth plurality of pick-up regions 710. Moreover, it will be appreciated that the first source/drain regions 114 and the fourth plurality of pick-up regions 710 may be formed before the second source/drain regions 116, the third plurality of pick-up regions 708, and the sixth plurality of pick-up regions 804.

Figure 22A:
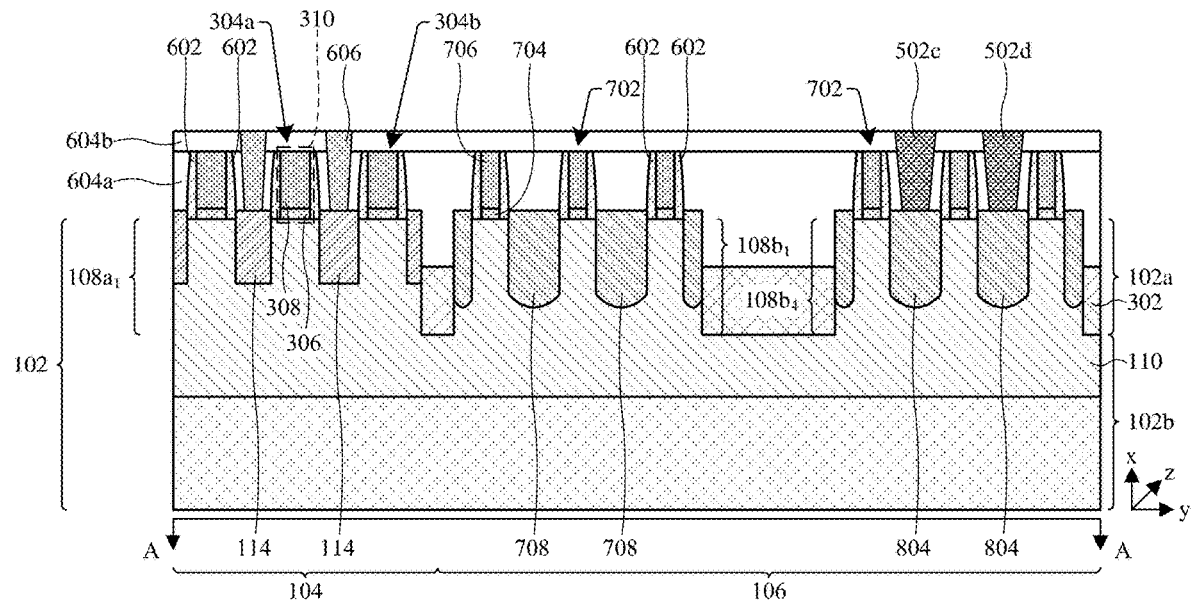
Figure 22B:
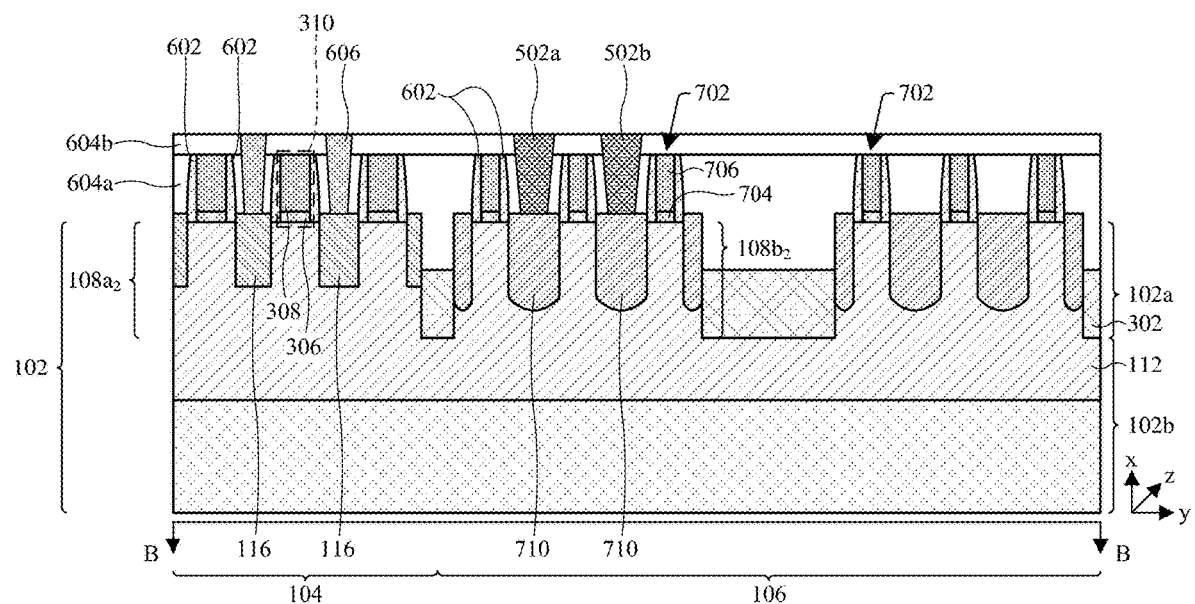

As shown in FIGS. 22A-22B, a first interlayer dielectric (ILD) layer 604a is formed over the isolation structure 302, the fins 108, the first source/drain regions 114, the second source/drain regions 116, the third plurality of pick-up regions 708, the fourth plurality of pick-up regions 710, the sixth plurality of pick-up regions 804, the sidewall spacers 602, the continuous gate structures 304, and the pick-up gate structures 702. In some embodiments, a process for forming the first ILD layer 604a comprises depositing the first ILD layer 604a on the isolation structure 302 and covering the isolation structure 302, the fins 108, the first source/drain regions 114, the second source/drain regions 116, the third plurality of pick-up regions 708, the fourth plurality of pick-up regions 710, the sixth plurality of pick-up regions 804, the sidewall spacers 602, the continuous gate structures 304, and the pick-up gate structures 702. Thereafter, a planarization process (e.g., CMP) may be performed on the first ILD layer 604a to remove an upper portion of the first ILD layer 604a.

In some embodiments, the planarization process may be performed on the continuous gate structures 304, the pick-up gate structures 702, and the sidewall spacers 602. In further embodiments, an upper surface of the first ILD layer 604a may be substantially co-planar with upper surfaces of the continuous gate structures 304, the pick-up gate structures 702, and the sidewall spacers 602. In yet further embodiments, the pick-up gate structures 702 may act as dishing prevention structures to prevent the planarization process performed on the first ILD layer 604a from damaging one or more of the continuous gate structures 304. For example, the pick-up gate structures 702 may prevent excessive dishing at an edge of the first section 104 and an edge of the second section 106. It will be appreciated that, after the first ILD layer 604a is formed, in some embodiments, a replacement gate process may be performed to replace the continuous gate electrode structures of the continuous gate structures 304 with continuous metal gate electrode structures (e.g., via a high-k/metal gate replacement gate process). It will be further appreciated that, in some embodiments, the replacement gate process may be performed to replace the pick-up gate electrode material 706 of the pick-up gate structures 702 with a pick-up gate metal electrode material (e.g., a same material as the continuous metal gate electrode structures).

Also shown in FIGS. 22A-22B, a second ILD layer 604b is formed over the first ILD layer 604a, the continuous gate structures 304, the pick-up gate structures 702, and the sidewall spacers 602. Further, a first plurality of conductive contacts 502 and a second plurality of conductive contacts 606 are formed over the fins 108 and in both the first ILD layer 604a and the second ILD layer 604b. The first plurality of conductive contacts 502 are formed extending vertically (in the "x" direction) from pick-up regions through both the first ILD layer 604a and the second ILD layer 604b. In some embodiments, the first plurality of conductive contacts 502 are formed extending laterally (in the "z" direction) through both the first ILD layer 604a and the second ILD layer 604b, such that the first plurality of conductive contacts 502 contact one or more pick-up regions. The second plurality of conductive contacts 606 are formed extending vertically (in the "x" direction) from source/drain regions through both the first ILD layer 604a and the second ILD layer 604b. In further embodiments, the second plurality of conductive contacts 606 are formed extending laterally (in the "z" direction) through both the first ILD layer 604a and the second ILD layer 604b, such that the second plurality of conductive contacts 606 contact one or more source/drain regions.

In some embodiments, a process for forming the second ILD layer 604b, the first plurality of conductive contacts 502, and the second plurality of conductive contacts 606 comprises depositing the second ILD layer 604b over the first ILD layer 604a, the continuous gate structures 304, the pick-up gate structures 702, and the sidewall spacers 602. Thereafter, a first plurality of contact openings (or trenches) are formed extending through both the second ILD layer 604b and the first ILD layer 604a. The first plurality of contact openings (or trenches) correspond to the first plurality of conductive contacts 502 and the second plurality of conductive contacts 606. A conductive material (e.g., W) is then formed on the second ILD layer 604b and in the first plurality of contact openings (or trenches). Thereafter, a planarization process (e.g., CMP) is performed on the conductive material to form the first plurality of conductive contacts 502 and the second plurality of conductive contacts 606. In further embodiments, the planarization process is performed on the second ILD layer 604b to remove an upper portion of the second ILD layer 604b.

Figure 23A:
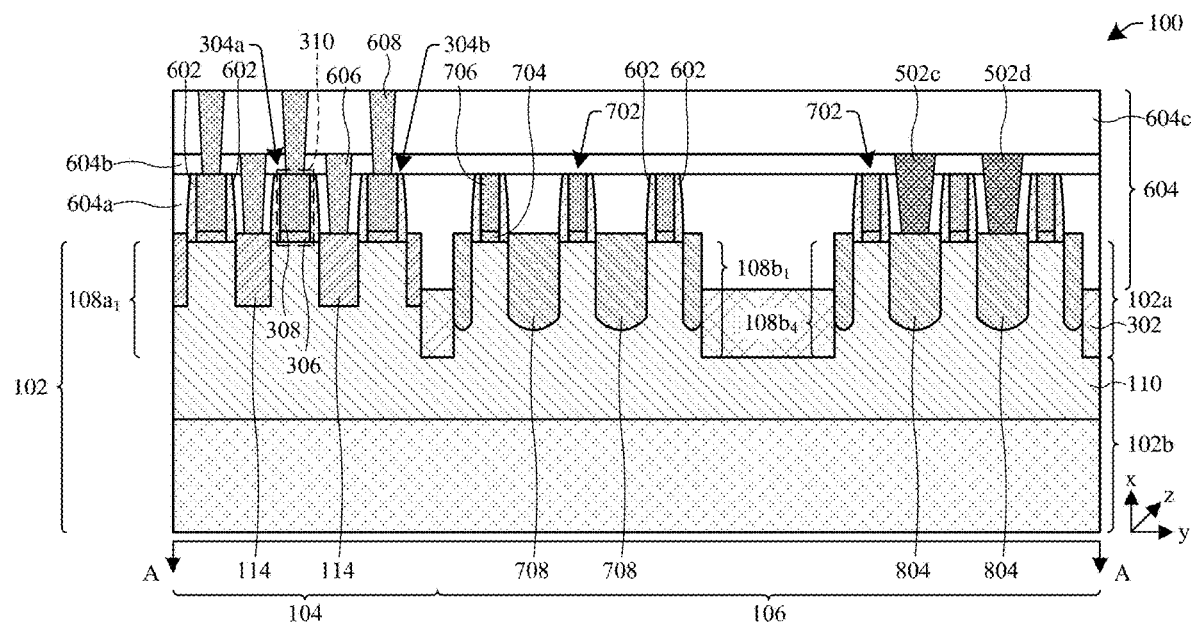
Figure 23B:
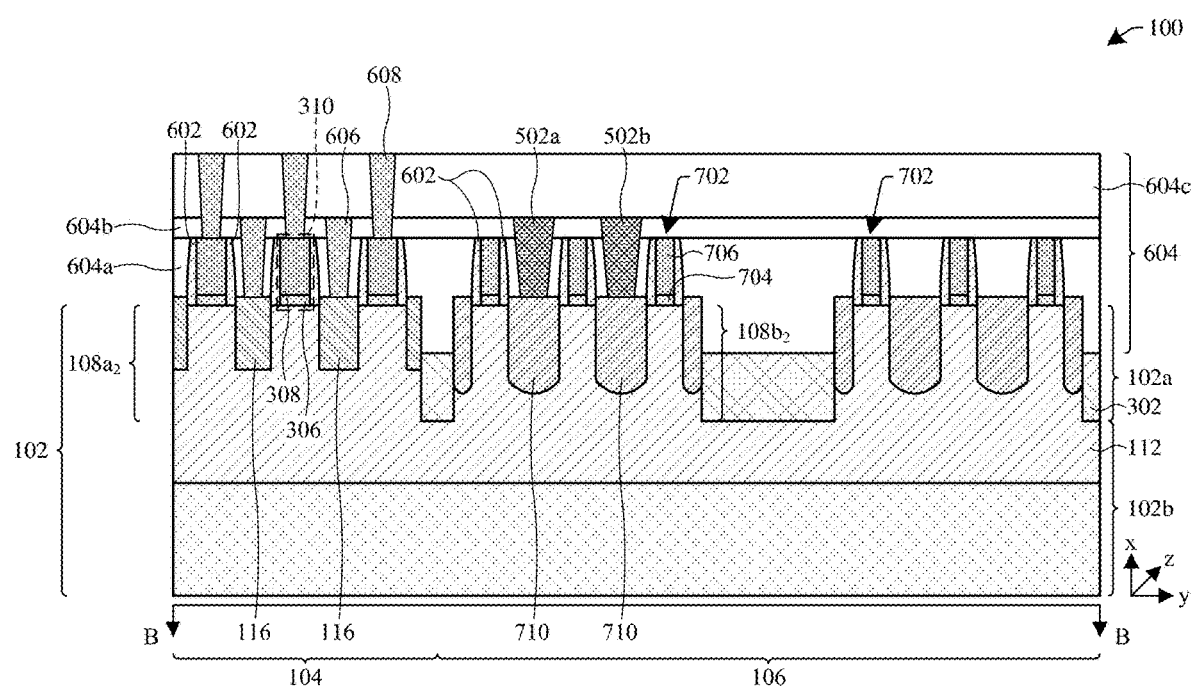

As shown in FIGS. 23A-23B, a third ILD layer 604c is formed over the second ILD layer 604b, the first plurality of conductive contacts 502, and the second plurality of conductive contacts 606. Further, a third plurality of conductive contacts 608 are formed over the continuous gate structures 304 and the pick-up gate structures 702. The third plurality of conductive contacts 608 are formed in the third ILD layer 604c and the second ILD layer 604b. The third plurality of conductive contacts 608 are formed extending vertically (in the "x" direction) from the continuous gate structures 304 through both the second ILD layer 604b and the third ILD layer 604c.

In some embodiments, a process for forming the third ILD layer 604c and the third plurality of conductive contacts 608 comprises depositing the third ILD layer 604c over the second ILD layer 604b, the first plurality of conductive contacts 502, and the second plurality of conductive contacts 606. Thereafter, a second plurality of contact openings are formed extending through both the third ILD layer 604c and the second ILD layer 604b. The second plurality of contact openings correspond to the third plurality of conductive contacts 608. A conductive material (e.g., W) is then formed on the third ILD layer 604c and in the second plurality of contact openings. Thereafter, a planarization process (e.g., CMP) is performed on the conductive material to form the third plurality of conductive contacts 608. In further embodiments, the planarization process is performed on the third ILD layer 604c to remove an upper portion of the third ILD layer 604c. While not shown, it will be appreciated that any number of additional ILD layers/structures may be formed over the third ILD layer 604c, and any number of other conductive features (e.g., metal lines, metal vias, etc.) may be formed in the additional ILD layers/structures to form an interconnect structure (e.g., copper interconnect) that interconnects various semiconductor devices of the IC 100.

Figure 24:
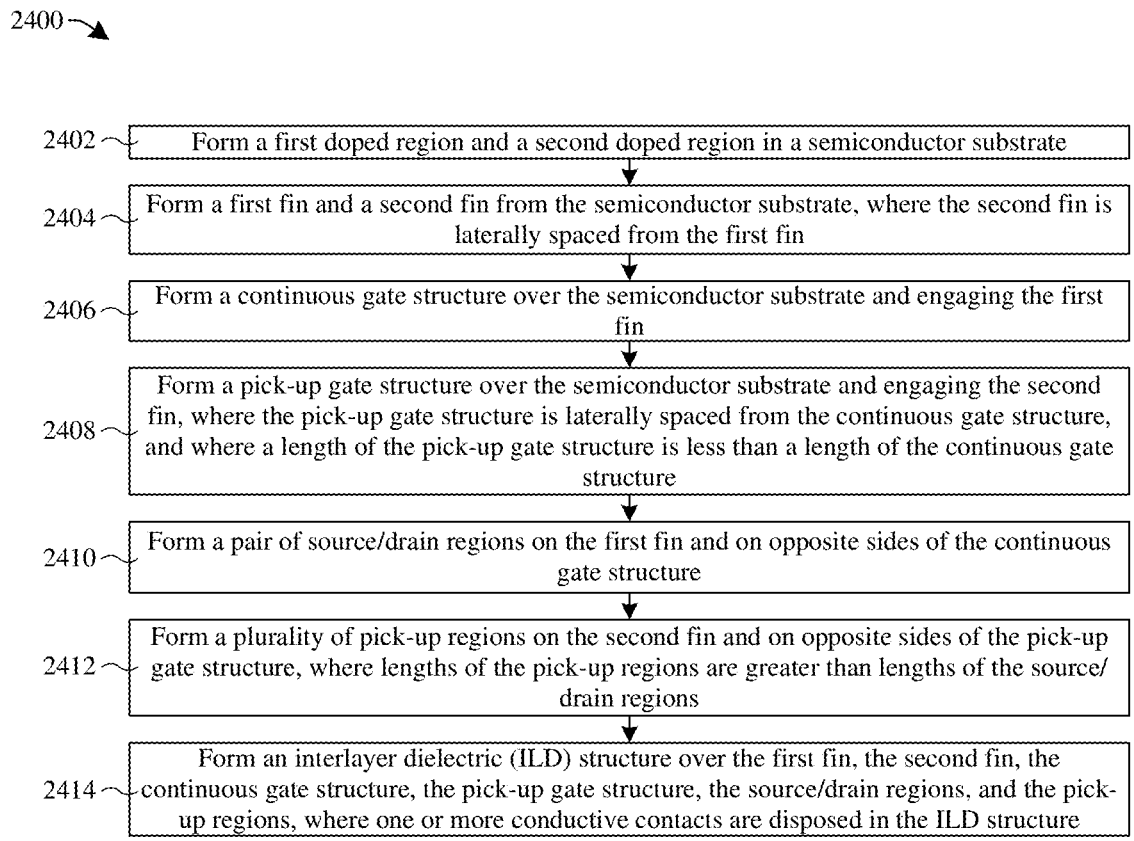
FIG. 24 illustrates a flowchart of some embodiments of a method for forming an IC having improved latch-up immunity.

FIG. 24 illustrates a flowchart of some embodiments of a method for forming an integrated chip (IC) having improved latch-up immunity. While the flowchart 2400 of FIG. 24 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2402, a first doped region and a second doped region are formed in a semiconductor substrate. FIGS. 12A-12B through FIGS. 13A-13B illustrate a series of various cross-sectional views of some embodiments corresponding to act 2402.

At act 2404, a first fin and a second fin are formed from the semiconductor substrate, where the second fin is laterally spaced from the first fin. FIGS. 14A-14B illustrate various cross-sectional view of some embodiments corresponding to act 2404.

At act 2406, a continuous gate structure is formed over the semiconductor substrate and engaging the first fin. FIGS. 15A-15B through FIGS. 18A-18B illustrate a series of various cross-sectional views of some embodiments corresponding to act 2406.

At act 2408, a pick-up gate structure is formed over the semiconductor substrate and engaging the second fin, where the pick-up gate structure is laterally spaced from the continuous gate structure, and where a length of the pick-up gate structure is less than a length of the continuous gate structure. FIGS. 15A-15B through FIGS. 18A-18B illustrate a series of various cross-sectional views of some embodiments corresponding to act 2408. In other embodiments, the pick-up gate structure is not formed over the semiconductor substrate (See, e.g., FIGS. 5A-5E).

At act 2410, a pair of source/drain regions are formed on the first fin and on opposite sides of the continuous gate structure. FIGS. 19A-19B through FIGS. 21A-21B illustrate a series of various cross-sectional views of some embodiments corresponding to act 2410.

At act 2412, a plurality of pick-up regions are formed on the second fin and on opposite sides of the pick-up gate structure, where lengths of the pick-up regions are greater than lengths of the source/drain regions. FIGS. 19A-19B through FIGS. 21A-21B illustrate a series of various cross-sectional views of some embodiments corresponding to act 2412. In other embodiments, a pick-up region may be formed on the second fin that continuously extends from a first outermost sidewall of the second fin to a second outermost sidewall of the second fin (See, e.g., FIGS. 5A-5E).

At act 2414, an interlayer dielectric (ILD) structure is formed over the first fin, the second fin, the continuous gate structure, the pick-up gate structure, the source/drain regions, and the pick-up regions, where one or more conductive contacts are disposed in the ILD structure. FIGS. 22A-22B through FIGS. 23A-23B illustrate a series of various cross-sectional views of some embodiments corresponding to act 2414.

In some embodiments, the present application provides an integrated chip (IC) comprising a device section and a pick-up section disposed on a first side of the device section. Further, the IC comprises a semiconductor substrate. A first fin of the semiconductor substrate is disposed in the device section. A second fin of the semiconductor substrate is disposed in the pick-up section and laterally spaced from the first fin in a first direction. A continuous gate structure is disposed in the device section, where the continuous gate structure extends laterally over both the semiconductor substrate and the first fin in a second direction that is perpendicular to the first direction, and where a first outermost sidewall of the continuous gate structure is laterally spaced from the second fin in the first direction. A first epitaxial pick-up structure is disposed on the second fin, where the first epitaxial pick-up structure continuously extends from a second outermost sidewall of the second fin to a third outermost sidewall of the second fin. The second outermost sidewall is laterally spaced from the third outermost sidewall in the first direction, where the second outermost sidewall faces the first outermost sidewall.

In some embodiments, the present application provides an integrated chip (IC) comprising a first device section and a first pick-up section disposed on a first side of the device section. Further, the IC comprises a semiconductor substrate. A first fin of the semiconductor substrate is disposed in the first device section. A second fin of the semiconductor substrate is disposed in the first pick-up section and laterally spaced from the first fin. A first doped region having a first doping type is disposed in the semiconductor substrate, where the first doped region continuously extends from the first device section into the first pick-up section. A first continuous gate structure is disposed in the first device section, where the first continuous gate structure has a first length, and where the first continuous gate structure extends laterally over both the semiconductor substrate and the first fin. A pair of first source/drain regions is disposed on the first fin, where the first source/drain regions are disposed on opposite sides of the first continuous gate structure, and where diode junctions exists between the first source/drain regions and the first doped region. A first epitaxial pick-up structure and a second epitaxial pick-up structure are disposed on the second fin, where the first epitaxial pick-up structure is spaced from the second epitaxial pick-up structure, and where both the first and second epitaxial pick-up structures are electrically coupled to the first doped region. A first pick-up gate structure is disposed in the first pick-up section and spaced from the first continuous gate structure, where the first pick-up gate structure has a second length less than the first length. The first pick-up gate structure extends laterally over the semiconductor substrate, over the second fin, and between the first and second epitaxial pick-up structures.

In some embodiments, the present application provides method for forming an integrated chip (IC). The method comprises receiving a semiconductor substrate having an upper region and a lower region. A first doped region is formed in the semiconductor substrate. A first fin of the semiconductor substrate and a second fin of the semiconductor substrate are formed by selectively removing a first portion of the upper region of the semiconductor substrate, where the first doped region is disposed in the first fin and extends continuously through the semiconductor substrate into the second fin. A continuous gate structure having a first length is formed over the lower region of the semiconductor substrate and engaging the first fin. A pick-up gate structure is formed over the lower region of the semiconductor substrate and engaging the second fin, where the pick-up gate structure is spaced from the continuous gate structure, and where the pick-up gate structure has a second length that is less than the first length. A pair of source/drain regions is formed on the first fin, where the source/drain regions are disposed on opposite sides of the continuous gate structure. A first epitaxial pick-up structure and a second epitaxial pick-up structure are formed on the second fin, where the first epitaxial pick-up structure and the second epitaxial pick-up structure are disposed on opposite sides of the pick-up gate structure, and where both the first and second epitaxial pick-up structures are electrically coupled to the first doped region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip (IC) comprising a device section and a pick-up section disposed on a side of the device section, the IC comprising:
    a semiconductor substrate;
    a first fin of the semiconductor substrate disposed in the device section;
    a second fin of the semiconductor substrate disposed in the pick-up section and laterally spaced from the first fin in a first direction;
    a continuous gate structure disposed in the device section, wherein the continuous gate structure extends laterally over both the semiconductor substrate and the first fin in a second direction that is perpendicular to the first direction, wherein a first outermost sidewall of the continuous gate structure is laterally spaced from the second fin in the first direction; and
    a first epitaxial pick-up structure disposed on the second fin, wherein the first epitaxial pick-up structure continuously extends from a second outermost sidewall of the second fin to a third outermost sidewall of the second fin, wherein the second outermost sidewall is laterally spaced from the third outermost sidewall in the first direction, and wherein the second outermost sidewall faces the first outermost sidewall.

2. The IC of claim 1, wherein there are no continuous gate structures disposed in the pick-up section.

3. The IC of claim 1, wherein a bottom surface of the first epitaxial pick-up structure is convex.

4. The IC of claim 1, wherein:
    the first epitaxial pick-up structure has a center point disposed an equal distance from the second outermost sidewall and the third outermost sidewall; and
    a thickness of the first epitaxial pick-up structure continuously decreases from the center point to the second outermost sidewall and continuously decreases from the center point to the third outermost sidewall.

5. The IC of claim 1, further comprising:
    a first doped region having a first doping type disposed in the semiconductor substrate, wherein the first doped region continuously extends from the device section into the pick-up section, and wherein the first epitaxial pick-up structure is electrically coupled to the first doped region.

6. The IC of claim 1, further comprising:
    a third fin of the semiconductor substrate disposed in the pick-up section and laterally spaced from both the second fin and the first fin;
    a second epitaxial pick-up structure disposed on the third fin, wherein:
        the second epitaxial pick-up structure continuously extends from a fourth outermost sidewall of the third fin to a fifth outermost sidewall of the third fin;
        the fourth outermost sidewall is laterally spaced from the fifth outermost sidewall in the first direction;
        the first epitaxial pick-up structure comprises a first Group IV chemical element; and
        the second epitaxial pick-up structure comprises a second Group IV chemical element that is different than the first Group IV chemical element.

7. The IC of claim 6, further comprising:
an isolation structure disposed over a lower region of the semiconductor substrate, wherein the first fin, the second fin, and the third fin extend vertically through the isolation structure;
a conductive contact disposed in the pick-up section, wherein the conductive contact extends continuously across an upper surface of the isolation structure, over the second fin, and over the third fin; and
a conductive via disposed in the pick-up section and electrically coupled to the conductive contact, wherein the conductive via extends vertically from the conductive contact at a location disposed between the second fin and the third fin.

8. The IC of claim 6, further comprising:
a first doped region having a first doping type disposed in the semiconductor substrate, wherein the first doped region continuously extends from the device section into the pick-up section, and wherein the first epitaxial pick-up structure is electrically coupled to the first doped region; and
a second doped region having a second doping type opposite the first doping type disposed in the semiconductor substrate, wherein the second doped region continuously extends from the device section into the pick-up section, and wherein the second epitaxial pick-up structure is electrically coupled to the second doped region.

9. The IC of claim 8, wherein:
the first doped region at least partially extends into the second fin; and
the second doped region at least partially extends into the third fin.

10. The IC of claim 9, further comprising:
a fourth fin of the semiconductor substrate disposed in the device section and laterally spaced from the first fin, the second fin, and the third fin, wherein the first doped region at least partially extends into the first fin, and the second doped region at least partially extends into the fourth fin.

11. The IC of claim 10, wherein the second epitaxial pick-up structure comprises both the second Group IV chemical element and the first Group IV chemical element.

12. An integrated chip (IC) comprising:
a first semiconductor fin protruding from a portion of a semiconductor substrate;
a second semiconductor fin protruding from the portion of the semiconductor substrate, wherein the second semiconductor fin is laterally spaced from the first semiconductor fin in a first direction;
a gate structure disposed over the portion of the semiconductor substrate and the first semiconductor fin, wherein the gate structure extends laterally over the semiconductor substrate and the first semiconductor fin in a second direction that is transverse the first direction; and
an epitaxial pick-up structure disposed on the second semiconductor fin, wherein the epitaxial pick-up structure continuously extends from a first outermost sidewall of the second semiconductor fin to a second outermost sidewall of the second semiconductor fin, and wherein the second outermost sidewall is laterally spaced from the first outermost sidewall in the first direction.

13. The IC of claim 12, wherein the second semiconductor fin neighbors the first semiconductor fin.

14. The IC of claim 12, further comprising:
a doped region having a first doping type disposed in the semiconductor substrate, wherein the doped region is disposed in the first semiconductor fin and the second semiconductor fin, wherein the doped region extends from the first semiconductor fin continuously through the portion of the semiconductor substrate to the second semiconductor fin, and wherein the epitaxial pick-up structure is electrically coupled to the doped region.

15. The IC of claim 14, further comprising:
a pair of source/drain regions disposed in the first semiconductor fin, wherein the pair of source/drain regions have a second doping type opposite the first doping type, and wherein a portion of the doped region extends laterally between the pair of source/drain regions.

16. The IC of claim 12, wherein:
the gate structure has an outer sidewall that faces the first outermost sidewall of the second semiconductor fin;
an outermost sidewall of the first semiconductor fin is disposed laterally between the first outermost sidewall of the second semiconductor fin and the outer sidewall of the gate structure; and
the outermost sidewall of the first semiconductor fin is laterally spaced from the outer sidewall of the gate structure in the first direction.

17. The IC of claim 12, further comprising:
an interlayer dielectric (ILD) structure disposed over the first semiconductor fin, the second semiconductor fin, the portion of the semiconductor substrate, and the epitaxial pick-up structure, wherein a portion of the ILD structure is disposed directly laterally between the first outermost sidewall of the second semiconductor fin and an outermost sidewall of the first semiconductor fin, wherein the outermost sidewall of the first semiconductor fin faces the first outermost sidewall of the second semiconductor fin.

18. The IC of claim 17, wherein the portion of the ILD structure extends continuously in the first direction from the outermost sidewall of the first semiconductor fin to the first outermost sidewall of the second semiconductor fin.

19. An integrated chip (IC) comprising a device section and a pick-up section disposed on a side of the device section, the IC comprising:
an isolation structure disposed over a lower portion of a semiconductor substrate;
a first semiconductor fin disposed in the device section, wherein the first semiconductor fin extends vertically through the isolation structure from the lower portion of the semiconductor substrate;
a second semiconductor fin disposed in the pick-up section, wherein the second semiconductor fin extends vertically through the isolation structure from the lower portion of the semiconductor substrate, wherein the second semiconductor fin has a first outer sidewall that faces an outer sidewall of the first semiconductor fin, and wherein a portion of the isolation structure extends laterally from the outer sidewall of the first semiconductor fin to the first outer sidewall of the second semiconductor fin;
a doped region disposed in the first semiconductor fin, the second semiconductor fin, and the lower portion of the semiconductor substrate, wherein the doped region extends from the first semiconductor fin to the second semiconductor fin by extending beneath the portion of the isolation structure;
a pair of source/drain regions disposed in the first semiconductor fin;

a gate structure disposed over the first semiconductor fin and the lower portion of the semiconductor substrate, wherein the gate structure extends laterally over the semiconductor substrate and the first semiconductor fin in a first direction, wherein the gate structure extends laterally in the first direction between the source/drain regions of the pair of source/drain regions, and wherein the gate structure is laterally spaced from the second semiconductor fin; and an epitaxial pick-up structure disposed on the second semiconductor fin, wherein the epitaxial pick-up structure is electrically coupled to the doped region, wherein the epitaxial pick-up structure continuously extends from the first outer sidewall of the second semiconductor fin to a second outer sidewall of the second semiconductor fin, and wherein the second outer sidewall of the second semiconductor fin is opposite the first outer sidewall of the second semiconductor fin.

20. The IC of claim 19, wherein:

the first semiconductor fin neighbors the second semiconductor fin; and a plane that extends laterally in a second direction and in a substantially straight line intersects the gate structure, the outer sidewall of the first semiconductor fin, the first outer sidewall of the second semiconductor fin, the second outer sidewall of the second semiconductor fin, the epitaxial pick-up structure, the portion of the isolation structure, and the source/drain regions of the pair of source/drain regions; and the second direction is perpendicular to the first direction.

* * * * *